US011444631B2

(12) United States Patent
Ali

(10) Patent No.: US 11,444,631 B2
(45) Date of Patent: Sep. 13, 2022

(54) LOW POWER AMPLIFIER STRUCTURES AND CALIBRATIONS FOR THE LOW POWER AMPLIFIER STRUCTURES

(71) Applicant: Analog Devices, Inc., Norwood, MA (US)

(72) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 215 days.

(21) Appl. No.: 16/281,047

(22) Filed: Feb. 20, 2019

(65) Prior Publication Data

US 2019/0296756 A1   Sep. 26, 2019

Related U.S. Application Data

(60) Provisional application No. 62/646,181, filed on Mar. 21, 2018.

(51) Int. Cl.
| | |
|---|---|
| *H03F 3/45* | (2006.01) |
| *H03M 1/10* | (2006.01) |
| *H03F 1/30* | (2006.01) |
| *H03F 1/02* | (2006.01) |

(Continued)

(52) U.S. Cl.
CPC ........ *H03M 1/1009* (2013.01); *H03F 1/0211* (2013.01); *H03F 1/301* (2013.01); *H03F 3/45242* (2013.01); *H03F 3/45246* (2013.01); *H03M 1/002* (2013.01); *H03F 2200/129* (2013.01); *H03F 2200/468* (2013.01); *H03F 2203/45116* (2013.01);

(Continued)

(58) Field of Classification Search
CPC .... H03F 3/45242; H03F 1/301; H03F 1/0211; H03F 2203/45286; H03F 2200/468; H03F 2200/129; H03F 2203/45116; H03F 2203/45528; H03F 2203/45701
USPC .................................................. 330/252–261
See application file for complete search history.

(56) References Cited

U.S. PATENT DOCUMENTS

| | | | | |
|---|---|---|---|---|
| 5,198,780 A | * | 3/1993 | Kase .................... | H03F 3/45766 330/253 |
| 5,483,194 A | * | 1/1996 | Genest ................ | H03F 3/45179 327/359 |

(Continued)

OTHER PUBLICATIONS

Choksi et al. *Analysis of Switched-Capacitor Common-Mode Feedback Circuit*, IEEE Transactions on Circuits and Systems—II: Analog and Digital Signal Processing, vol. 50, No. 12, Dec. 2003, 12 pages.

(Continued)

*Primary Examiner* — Khanh V Nguyen
*Assistant Examiner* — Khiem D Nguyen
(74) *Attorney, Agent, or Firm* — Patent Capital Group

(57) ABSTRACT

Amplifiers can be found in pipelined ADCs and pipelined-SAR ADCs as inter-stage amplifiers. The amplifiers can in some cases implement and provide gains in high speed track and hold circuits. The amplifier structures can be open-loop amplifiers, and the amplifier structures can be used in MDACs and samplers of high speed ADCs. The amplifiers can be employed without resetting, and with incomplete settling, to maximize their speed and minimize their power consumption. The amplifiers can be calibrated to improve performance.

20 Claims, 48 Drawing Sheets

(51) Int. Cl.
*H03M 1/00* (2006.01)
*H03G 3/30* (2006.01)
(52) U.S. Cl.
CPC .............. H03F 2203/45286 (2013.01); H03F 2203/45528 (2013.01); H03F 2203/45701 (2013.01); H03G 3/30 (2013.01)

(56) References Cited

U.S. PATENT DOCUMENTS

| | | | | |
|---|---|---|---|---|
| 5,596,610 | A | * | 1/1997 | Leung .................. H03K 3/0231 327/287 |
| 5,699,305 | A | * | 12/1997 | Kawashima ........... G11C 7/065 327/51 |
| 6,118,340 | A | * | 9/2000 | Koen .................. H03F 3/45197 330/253 |
| 6,861,969 | B1 | | 3/2005 | Ali |
| 7,183,813 | B2 | * | 2/2007 | Kasanyal ............ H04L 25/0286 327/108 |
| 7,663,516 | B1 | | 2/2010 | Chandra |
| 7,675,363 | B2 | * | 3/2010 | Deguchi ............. H03F 3/45659 330/254 |
| 7,821,435 | B2 | | 10/2010 | Fan et al. |
| 8,094,056 | B2 | | 1/2012 | Nazemi et al. |
| 8,471,740 | B2 | | 6/2013 | Dine et al. |
| 8,525,711 | B2 | | 9/2013 | Chung |
| 9,281,831 | B2 | | 3/2016 | Marie et al. |
| 9,945,901 | B1 | | 4/2018 | Otte |
| 2004/0041630 | A1 | * | 3/2004 | Grillo ................ H03H 11/1213 330/254 |

OTHER PUBLICATIONS

Zanikopoulos et al., *Power Optimization for Pipelined ADCs with Open-Loop Residue Amplifiers*, 1-4244-0395-2/06 © 2006 IEEE, 4 pages.

Hsieh et al., *A 6-bit Pipelined Analog-to-Digital Converter with Current-Switching Open-Loop Residue Amplification*, IEEE Asian Solid-State Circuits Conference, Nov. 3-5, 2008, Fukuoka, Japan, 4 pages.

Shi et al., *Modeling of a Digitally Assisted 14-bit 100MSample/s Pipelined ADC using Open-Loop Residue Amplification*, 978-1-4244-7618-3/10 © 2010 IEEE, 4 pages.

Yuehong et al., *A Novel Approach to Calibrate Open-Loop Amplifier Nonlinearities through Piecewise Linear Interpolation*, 978-1-4673-2475-5/12 © 2012 IEEE, 3 pages.

Ali et al., *A 14 Bit 1 GS/s RF Sampling Pipelined ADC with Background Calibration*, IEEE Journal of Solid-State Circuits, vol. 49, No. 12, Dec. 2014, 11 pages.

Krishnapura, *EE539: Analog Integrated Circuit Design; Common Mode Feedback Circuits*, Apr. 18, 2006, 14 pages.

McNeill et al., *"Split-ADC" Digital Background Correction of Open-Loop Residue Amplifier Nonlinearity Errors in a 14b Pipeline ADC*, 1-4244-0921-7/07 © 2007 IEEE, 4 pages.

Murmann et al., *A 12b 75MS/s Pipelined ADC Using Open-Loop Residue Amplification*, ISSCC 2003, Session 18, Nyquist A/D Converters, Paper 18.6, 10 pages.

Murmann et al., *A 12-bit 75-MS/s Pipelined ADC Using Open-Loop Residue Amplification*, IEEE Journal of Solid-State Circuits, vol. 38, No. 12, Dec. 2003, 11 pages.

Murmann, *Digitally Assisted Data Converter Design*, 978-1-4799-0645-1/13 © 2013 IEEE, 8 pages.

Shen et al., *A 6 bit Bias-less Pipelined ADC with Open-Loop Amplifiers*, 2011 20$^{th}$ European Conference on Circuit Theory and Design (ECCTD), 978-1-4577-0618-9/11 © 2011 IEEE, 4 pages.

Yagi et al., *Background Calibration Algorithm for Pipelined ADC with Open-Loop Residue Amplifier Using Split ADC Structure*, 978-1-4244-7456-1/10 © 2010 IEEE, 4 pages.

Yu et al., *A 9-bit 1.8 GS/s 44 mW Pipelined ADC Using Linearized Open-Loop Amplifiers*, IEEE Journal of Solid-State Circuits, vol. 51, No. 10, Oct. 2016, 12 pages.

\* cited by examiner

LOW POWER AMPLIFIER STRUCTURES AND CALIBRATIONS FOR THE LOW POWER AMPLIFIER STRUCTURES

PRIORITY DATA

This patent application claims priority to and receives benefit of U.S. Provisional Patent Application, Ser. No. 62/646,181, titled "LOW POWER AMPLIFIER STRUCTURES AND CALIBRATIONS FOR THE LOW POWER AMPLIFIER STRUCTURES", filed on Mar. 21, 2018, which is hereby incorporated in its entirety.

TECHNICAL FIELD OF THE DISCLOSURE

The present disclosure relates to the field of integrated circuits, in particular to low power amplifier structures and calibrations for the low power amplifier structures.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the number of applications needing ADCs grow, the need for fast, low power, and accurate conversion also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Figure 1:
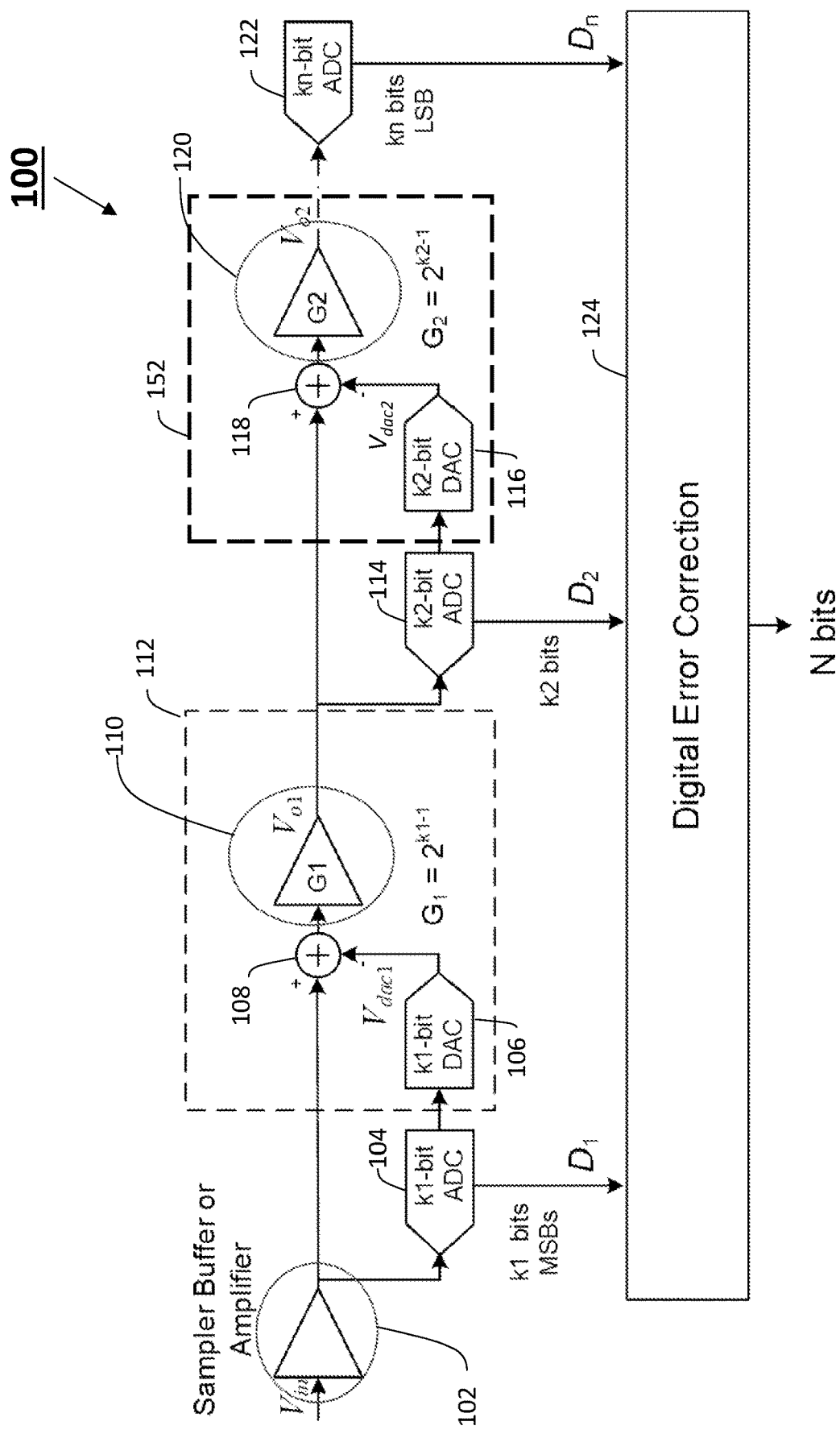
FIG. 1 shows a block diagram of a pipelined ADC, according to some embodiments of the disclosure.

New and improved structures and calibration techniques for open-loop amplifiers for the multiplying digital-to-analog converter (MDAC) and samplers of high speed ADCs are described herein. The amplifiers can be used as inter-stage amplifiers in pipelined and pipelined-successive-approximation-register (SAR) ADCs. The amplifiers can be used to provide gains in high speed track and hold circuits.

These structures are employed without resetting, and with incomplete settling, to maximize their speed and minimize their power consumption.

The following passages describes examples of: amplifier analog structures, analog and digital techniques to improve the effectiveness of the non-linear calibration of the amplifiers, techniques to calibrate the open-loop amplifier by feeding back an analog control signal to adjust its gain in the analog domain; coarse and fine gain adjustment techniques, analog and digital techniques to effectively perform calibration of the inter-stage gain errors (IGE), inter-stage memory errors (IME), and kick-back errors (KB) in open-loop amplifiers, and techniques for effective amplifier sharing while correcting for the resulting memory and kick-back errors.

Design Challenges for Amplifiers in Pipelined ADCs

Amplifiers are a key block in pipelined ADCs (and many other circuits and systems). As part of the MDAC of pipelined ADCs, amplifiers act as inter-stage amplifiers that amplify the residue signal (i.e., the quantization error) of one stage before handing the residue signal to the next stage. An accurate and linear amplifier has been traditionally the hallmark and the key to designing a pipelined ADC. It ensures the accurate delivery of the quantization error from one stage to the next down the pipeline for further quantization. In the process, its gain relaxes the accuracy requirements down the pipe and hence simplifies the quantization process.

Those amplifiers have been a major design challenge and power contributor, especially in high speed and high resolution ADCs. Moreover, the auxiliary circuits needed to drive those amplifiers (clocks, biases, etc.) have also contributed to the power consumption, area, and the development time in terms of layout and design resources. For example, in some 28 nm pipeline ADCs, the MDAC amplifier requires approximately 15 bias voltage and current circuits, and 5 clock circuits per stage. Multiplying that by the number of stages (e.g., 4 or 5 stages in the pipeline), it can be appreciated that the amount of design, layout, and area for the amplifier and the auxiliary circuits is substantial. In addition, they require power-hungry reference buffers that contribute substantially to the overall power consumption. Sometimes, measures are taken to lower the power in these amplifiers. However, the improvement tends to be incremental and often results in increasing the power in other areas. Addressing these blocks can be beneficial to changing the power curve, as well as the development cost curve of high speed ADCs.

Digitally Assisted Open-Loop Amplifiers

To assure a certain level of performance while lower power consumption, digitally assisted open-loop amplifiers can be used in MDAC and sampling circuit structures of ADCs. Digitally assisted open-loop amplifiers are amplifiers that do not rely feedback but rely on digital calibration techniques to improve the performance of the amplifier. These amplifier structures can be used in pipelined ADCs (or other multi-stage ADCs that implement inter-stage gain), and can benefit from higher speed, lower noise, substantially lower power, smaller footprint, and shorter development time. The area savings can be in the order of 4-10×. The power savings can be in the order of 4-10× compared to some other approaches. In addition to the power savings in the amplifier itself, the MDAC can save power in the reference buffer, which may need to provide charge only to support the parasitic capacitance on the summing node, as the closed-loop (including a feedback capacitor) no longer exists. Moreover, the design can save power in clocking and other auxiliary circuits.

One main design challenge is that open-loop amplifiers may require non-linear calibration for the high accuracy stages (usually stage-1 or other front-end stages in the pipeline). Some reliable algorithms have been developed to address this issue in an efficient manner. For example, a histogram and/or counting calibration method can calibrate the gain error and non-linearity up to the $5^{th}$ order distortion for about 3 mW in 16 nm and 5 mW in 28 nm at 3GS/s. The calibration method exposes shape of certain non-linearities to extract errors. This digital overhead is very small compared to the power consumed by the amplifier at that sample rate. In general, the digital calibration power needs to be added in the amplifier power budget, when doing comparisons, to ensure an overall power saving of the analog and digital power combined. The advantage of the open-loop structures is that it takes advantage of the efficiently achievable calibrations to lower the analog power, area, cost, and effort substantially compared to closed-loop structures. The savings are in the amplifier itself, in the reference buffer, the clocks, and the auxiliary circuits.

In this disclosure, some techniques that are used to calibrate the various non-idealities of these structures and to improve their effectiveness and robustness are discussed. These techniques ensure the accurate correction of the non-idealities, in an efficient and simple manner that preserves the savings in power, area, and complexity.

Various Circuits in a Pipelined ADC

FIG. 1 shows a block diagram of a pipelined ADC 100, according to some embodiments of the disclosure. This exemplary pipelined ADC can have n number of stages (n is at least two). The pipelined ADC receives an analog input signal $V_{in}$, and can include a sampler buffer or amplifier 102 for buffering/amplifying the analog input signal $V_{in}$.

In the first stage of the pipelined ADC (stage-1), the buffered analog input signal from amplifier 102 is quantized by k1-bit ADC 104 (e.g., a flash ADC). ADC 104 generates output/digital code $D_1$ having k1 bits. The output/digital code $D_1$ is used by k1-bit digital-to-analog converter (DAC) 106 to reconstruct the original analog input signal and generate a reconstructed analog input signal (e.g., $V_{dac1}$). A residue signal is formed by subtracting, e.g., by summation node 108, the buffered analog input signal by the reconstructed analog input signal $V_{dac1}$. The residue signal formed by summation node 108 is also the quantization error of the ADC 104. The residue is amplified by amplifier 110 to generate the amplified residue signal (e.g., $V_{o1}$). Ideal gain of the amplifier 110, e.g., $G_1$, can be $2^{k1-1}$. Collectively, the DAC 106, the summation node 108, and the amplifier 110 form a first MDAC of the first stage, denoted by box 112. An MDAC circuit structure can be provided to implement all of the functionalities and operations associated with the DAC 106, the summation node 108, and the amplifier 110.

In the second stage of the pipelined ADC (stage-2), the amplified residue signal (e.g., $V_{o1}$) is quantized by k2-bit ADC 114 (e.g., a flash ADC). ADC 114 generates output/digital code $D_2$ having k2 bits. The output/digital code $D_2$ is used by k2-bit DAC 116 to reconstruct the original analog input signal and generate a reconstructed analog input signal (e.g., $V_{dac2}$). A residue signal is formed by subtracting, e.g., by summation node 118, the amplified residue signal (e.g., $V_{o1}$) by the reconstructed analog input signal $V_{dac2}$. The residue signal formed by summation node 118 is also the quantization error of the ADC 114. The residue is amplified by amplifier 120 to generate the amplified residue signal (e.g., $V_{o2}$). Ideal gain of the amplifier 110, e.g., $G_2$, can be $2^{k2-1}$. Collectively, the DAC 116, the summation node 118, and the amplifier 120 form a second MDAC, denoted by box 152. An MDAC circuit structure can be provided to implement all of the functionalities and operations associated with the DAC 116, the summation node 118, and the amplifier 120.

One or more further stages, each for quantizing and reconstructing the residue signal from a previous stage to form a further residue signal, can be included.

A final stage includes kn-bit ADC 122 for digitizing the final residue signal, and for generating digital code $D_n$ having kn bits.

All the digital codes $D_1, D_2, \ldots D_n$ from the stages are provided to digital error correction 124 to combine and filter the digital output codes to form the final digital output of the pipelined ADC 100.

Figure 2:
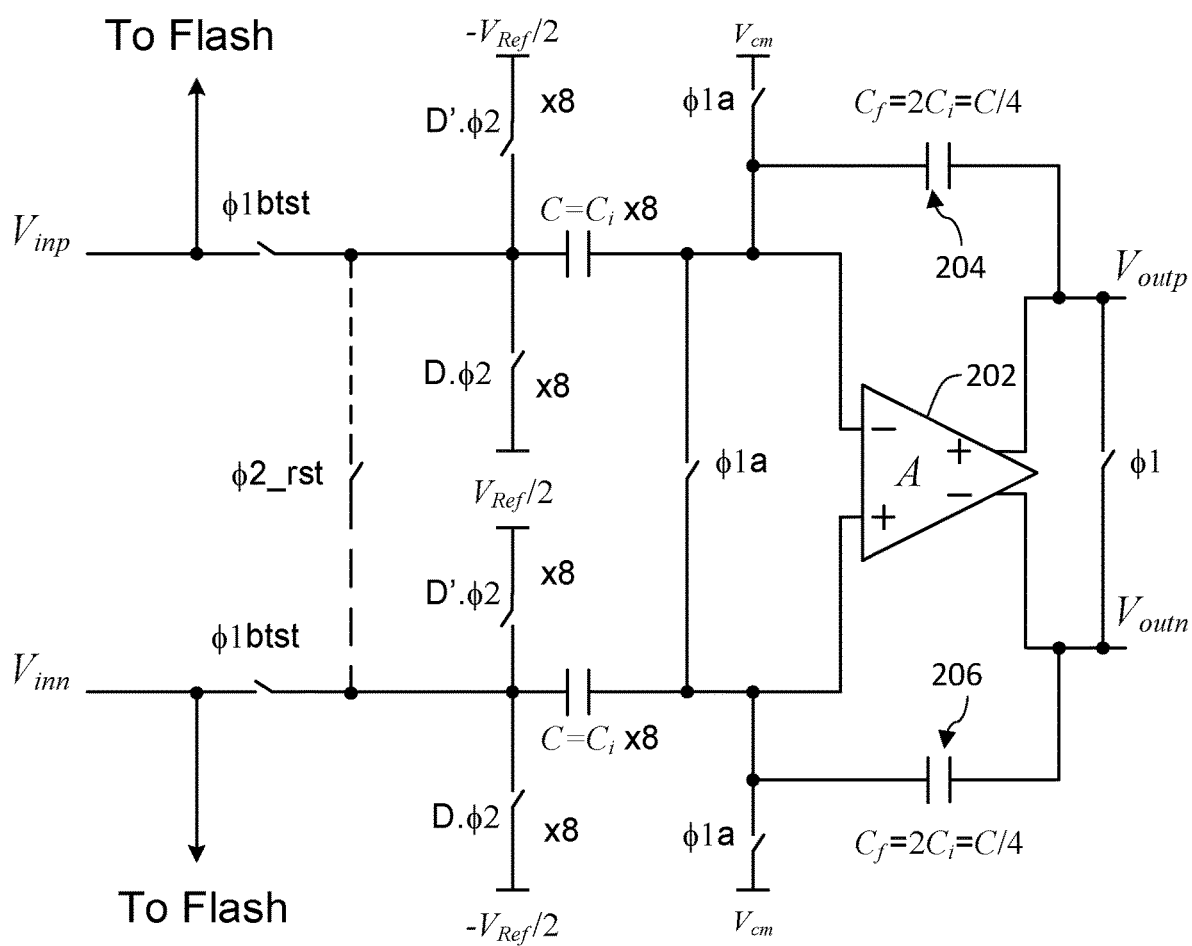
FIG. 2 shows a multiplying digital-to-analog converter circuit structure with a closed-loop amplifier.

Pipelined ADCs can have stages using Flash ADCs or other flavors of ADCs. For instance, it is possible to have a SAR-based pipelined ADC. However, pipelined ADCs with different flavors of ADCs as their stages would still require amplification between stages to implement inter-stage gain. Since linearity is important for amplification between stages for performance reasons, it is typical for pipelined ADCs to use closed-loop amplifiers. FIG. 2 shows a MDAC circuit structure 200 with a closed-loop amplifier 202. The MDAC circuit structure is characterized by the closed-loop amplifier 202 having feedback capacitances 204 and 206. As discussed previously, closed-loop amplifiers can have shortcomings and design challenges.

Figure 3:
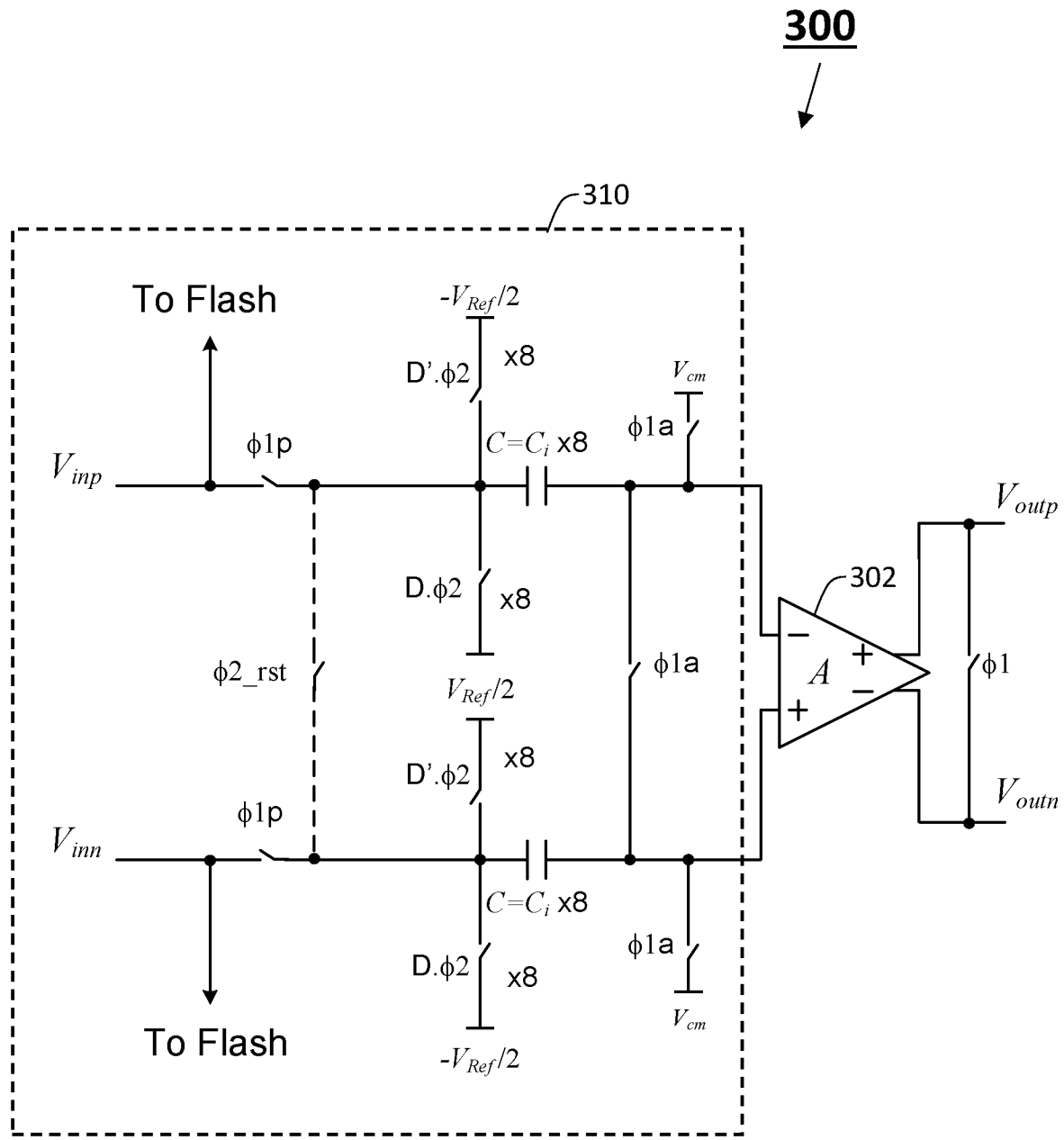
FIG. 3 shows an exemplary multiplying digital-to-analog converter circuit structure with an open-loop amplifier, according to some embodiments of the disclosure.

FIG. 3 shows an exemplary MDAC circuit structure 300 with an open-loop amplifier 302, according to some embodiments of the disclosure. Open-loop amplifier 302 is characterized by not having any feedback paths or feedback capacitances. The MDAC circuit structure 300, in differential form, receives analog differential inputs $V_{inp}$ and $V_{inn}$ and a digital code D, and generates an amplified residue signal $V_{outp}$ and $V_{outn}$. Specifically, the switched capacitor circuit 310 seen in the FIGURE has switches and capacitors configured in such a way to perform the functionalities of DAC 106 and summation node 108 of FIG. 1. The switches operate in accordance to the phases indicated next to the switches, e.g., to perform sampling operations in the circuit (e.g., sampling $V_{inp}$ and $V_{inn}$ onto the capacitors). Furthermore, some switches are further controlled by the digital code D to perform DAC operations (e.g., providing a charge representative of the digital code D). The digital code D is the output code of the ADC of the stage. The switched capacitor circuit 310 is configured and controlled in such a way to perform subtraction to form a residue signal. The result or output from the switched capacitor circuit 310 (i.e., the residue signal) is amplified by the open-loop amplifier 302 in open-loop configuration to generate the amplified residue, i.e., differential outputs $V_{outp}$ and $V_{outn}$. A shared-capacitance open-loop MDAC is shown, meaning the same capacitors are performing the sampling and DAC operations in switched capacitor circuit 310. However, the capacitances can be split between the sampling and DAC operations in certain embodiments. Other configurations of the switched capacitor circuit 310, and other circuits, for performing the operations of DAC 106 and summation node 108 are envisioned by the disclosure.

Improvements to the Open-Loop Amplifiers

Figure 4:
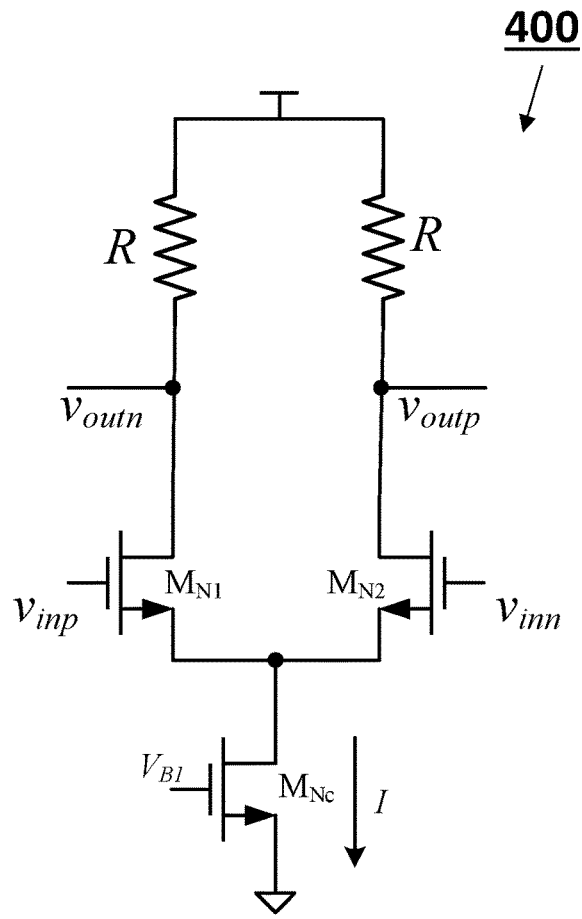
FIGS. 4-24 show various exemplary open-loop amplifiers, according to some embodiments of the disclosure.

While some open-loop amplifiers have been used in MDAC circuit structures (such as the open-loop amplifier 400 seen in FIG. 4), such open-loop amplifier structures suffered from limited dynamic range, poor linearity, and limited speed/gain trade-off flexibility.

The open-loop amplifiers described herein receives differential inputs $v_{inp}$ and $v_{inn}$ and generates differential outputs $v_{outn}$ and $v_{outp}$. The open-loop amplifier implements gain to amplify the signal at the inputs (i.e., the differential inputs $v_{inp}$ and $v_{inn}$). Depending on the circuit structure, the gain and other characteristics of the open-loop amplifier can vary. Within an MDAC, such an open-loop amplifier can receive a residue signal at its differential inputs $v_{inp}$ and $v_{inn}$, and generates an amplified residue signal at the differential outputs $v_{outn}$ and $v_{outp}$. The exemplary open-loop amplifiers described herein can be suitable in MDAC circuits and in other applications/contexts besides MDAC circuits (e.g., the open-loop amplifier can be used in a continuous-time fashion as a variable gain amplifier or amplifier).

Figure 5:
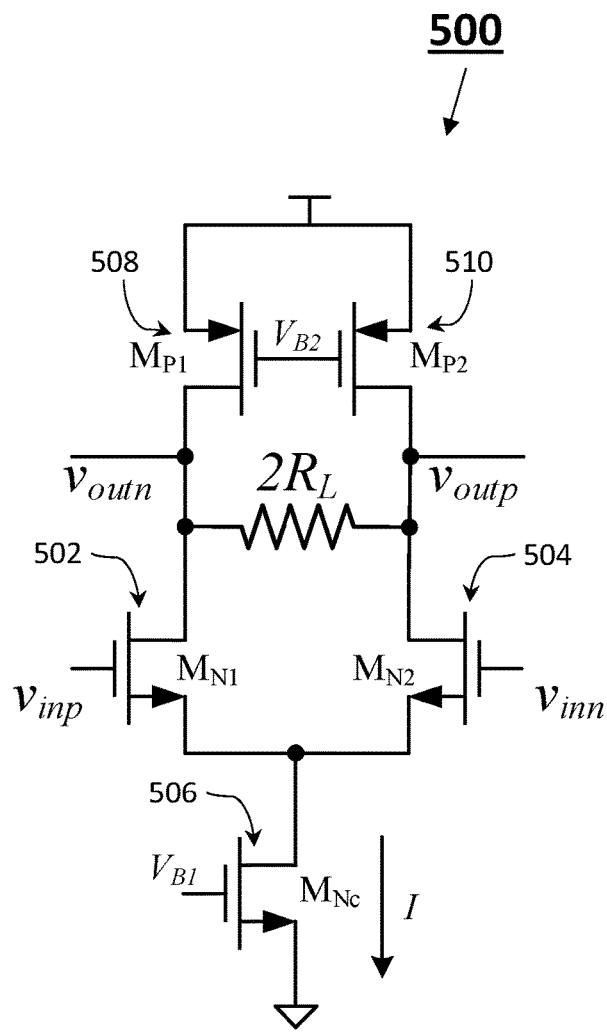

An example circuit structure of an open-loop amplifier 500 is shown in FIG. 5. The open-loop amplifier 500 has a differential pair of transistors with active load and a load resistance. The open-loop amplifier 500 includes input transistor $M_{N1}$ 502 and input transistor $M_{N2}$ 504, whose gates receive $v_{inp}$ and $v_{inn}$ respectively. The input transistor $M_{N1}$ 502 and input transistor $M_{N2}$ 504 serve as the differential pair of (input) transistors. In the example shown, input transistor $M_{N1}$ 502 and input transistor $M_{N2}$ 504, are N-type metal-oxide semiconductor (NMOS) transistors. The drains of input transistor $M_{N1}$ 502 and input transistor $M_{N2}$ 504 form the differential output nodes $v_{outn}$ and $v_{outp}$. The input transistor $M_{N1}$ 502 and input transistor $M_{N2}$ 504 are in a common source configuration (the sources of input transistor $M_{N1}$ 502 and input transistor $M_{N2}$ 504 are connected together). The sources of input transistor $M_{N1}$ 502 and input transistor $M_{N2}$ 504 are connected to a current source providing current I. A transistor $M_{Nc}$ 506 (e.g., an NMOS transistor) can serve as the current source. The current source can provide current for the open-loop amplifier (e.g., the differential pair of (input) transistors). The gate of transistor $M_{Nc}$ 506 can be driven by a bias voltage $V_{B1}$. A load resistance, e.g., a load of $2R_L$, is coupled across the differential output nodes $v_{outn}$ and $v_{outp}$. The open-loop amplifier 500 further includes transistor $M_{P1}$ 508 and transistor $M_{P2}$ 510. Transistor $M_{P1}$ 508 and transistor $M_{P2}$ 510 can be P-type metal-oxide semiconductor (PMOS) transistors. Transistor $M_{P1}$ 508 and transistor $M_{P2}$ 510 can serve as the active load at the output nodes of the open-loop amplifier. The drains of transistor $M_{P1}$ 508 and transistor $M_{P2}$ 510 are connected to the differential output nodes $v_{outn}$ and $v_{outp}$ respectively, and thus also the drains of input transistor $M_{N1}$ 502 and input transistor $M_{N2}$ 504 respectively. The gates of transistor $M_{P1}$ 508 and transistor $M_{P2}$ 510 are driven by bias voltage $V_{B2}$.

The gain A of open-loop amplifier 500 is determined by the following expression:

$$A \sim g_{m_N} R_L \tag{1}$$

where $g_{m_N}$ is the transconductance of an NMOS transistor and $R_L$ is the load resistance, which includes the output resistance of the NMOS and PMOS devices. The bandwidth (BW) of the open-loop amplifier is given by:

$$BW \sim \frac{1}{2\pi R_L C_L} \tag{2}$$

where $C_L$ is the load capacitance, including the parasitic capacitances at the output nodes.

Figure 6:
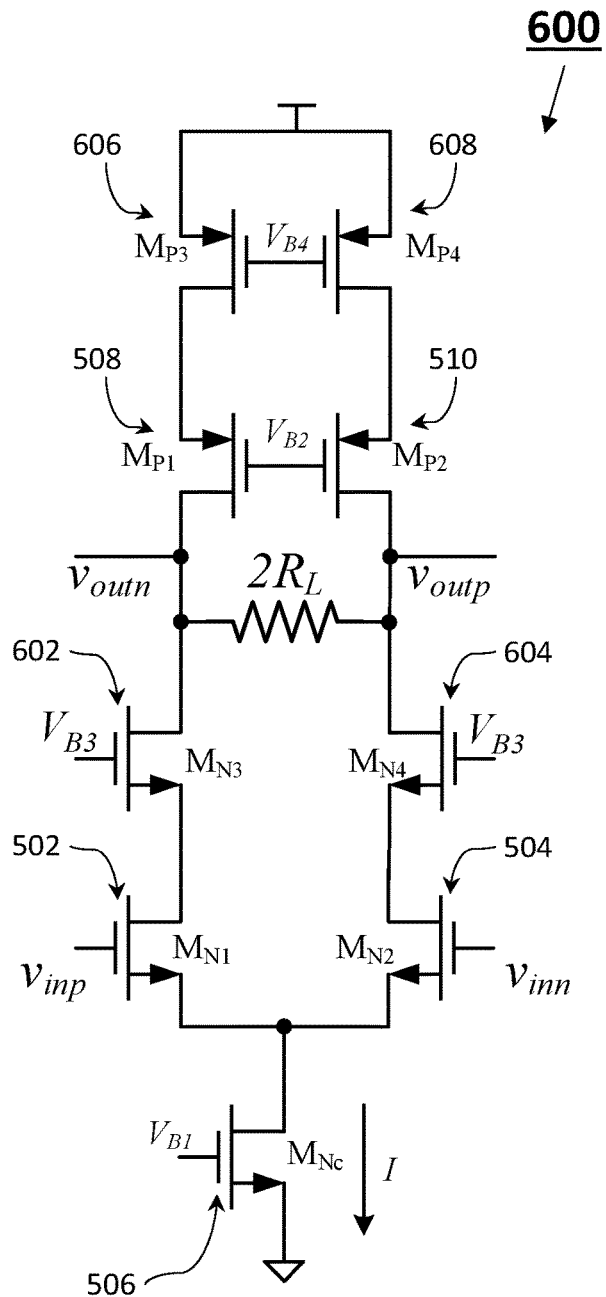

FIG. 6 shows another possible circuit structure for an open-loop amplifier 600 which uses cascoded differential pairs. The open-loop amplifier 600 has a differential pair of transistors with active load and a load resistance. The input transistor $M_{N1}$ 502 and input transistor $M_{N2}$ 504 are cascoded by a pair of cascode transistors. For example, the input transistor $M_{N1}$ 502 and input transistor $M_{N2}$ 504 are cascoded by, e.g., cascode transistor $M_{N3}$ 602 and cascode transistor $M_{N4}$ 604 (e.g., NMOS transistors), respectively. The sources of cascode transistor $M_{N3}$ 602 and cascode transistor $M_{N4}$ 604 are connected to drains of input transistor $M_{N1}$ 502 and input transistor $M_{N2}$ 504. The drains of cascode transistor $M_{N3}$ 602 and cascode transistor $M_{N4}$ 604 (now) form the differential output nodes $v_{outn}$ and $v_{outp}$ respectively. The gates of cascode transistor $M_{N3}$ 602 and cascode transistor $M_{N4}$ 604 are driven by bias voltage $V_{B3}$. The transistor $M_{P1}$ 508 and transistor $M_{P2}$ 510 are also cascoded as well, by a pair of cascode transistors, e.g., cascode transistor $M_{P3}$ 606 and cascode transistor $M_{P4}$ 608 (e.g., PMOS transistors) respectively. The gates of cascode transistor $M_{P3}$ 606 and cascode transistor $M_{P4}$ 608 are driven by bias voltage $V_{B4}$. This circuit structure has better gain and input capacitance, but can suffer significantly worse linearity.

Figure 7:
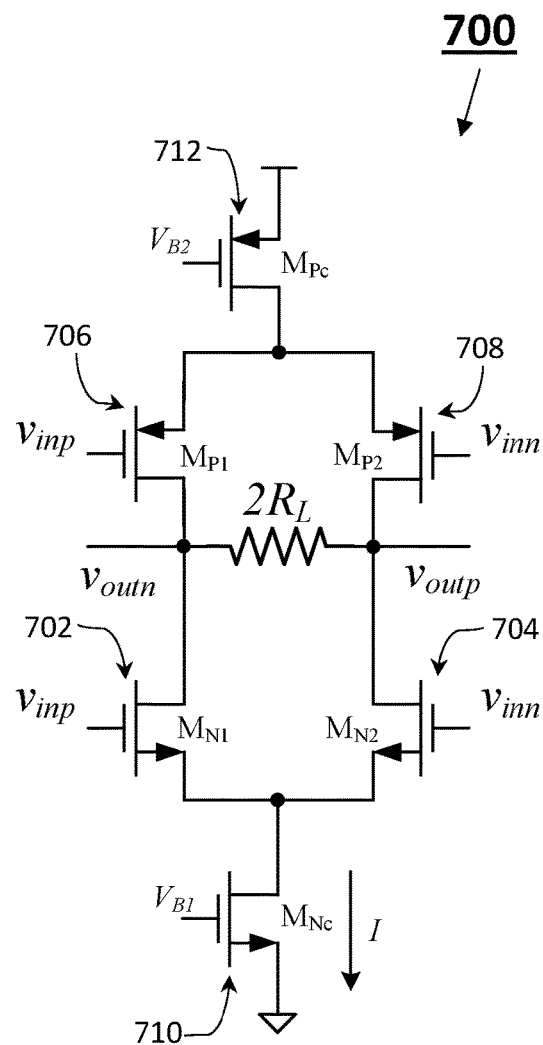

In order to reduce power consumption, a push-pull circuit structure can be used, as shown in FIG. 7. FIG. 7 shows an open-loop amplifier 700 that has two complementary pairs of input transistors that form the push-pull circuit structure. Open-loop amplifier 700 has a load resistance. A first pair of input transistors comprises input transistor $M_{N1}$ 702 and input transistor $M_{N2}$ 704 (e.g., NMOS transistors). Gates of input transistor MN' 702 and input transistor $M_{N2}$ 704 receive $v_{inp}$ and $v_{inn}$ respectively. A second pair of input transistors comprises input transistor $M_{P1}$ 706 and input transistor $M_{P2}$ 708 (e.g., PMOS transistors). Gates of input transistor $M_{P1}$ 706 and input transistor $M_{P2}$ 708 receive $v_{inp}$ and $v_{inn}$ respectively. The drains of input transistor $M_{N1}$ 702 and input transistor $M_K$ 706 are connected together and form a first differential output node $v_{outn}$. The drains of input transistor $M_{N2}$ 704 and input transistor $M_{P2}$ 708 are connected together and form a second differential output node $v_{outp}$. A load of $2R_L$ is coupled across the differential output nodes $v_{outn}$ and $v_{outp}$. The input transistor $M_{N1}$ 702 and input transistor $M_{N2}$ 704 are in a common source configuration (the sources of input transistor MN' 702 and input transistor $M_{N2}$ 704 are connected together). The sources of input transistor $M_{N1}$ 704 and input transistor $M_{N2}$ 704 are connected to a first current source providing current I. A transistor $M_{Nc}$ 710 (e.g., an NMOS transistor) can serve as the first current source. The first current source is at source terminals of input transistor $M_{N1}$ 702 and input transistor $M_{N2}$ 704. The gate of transistor $M_{Nc}$ 710 can be driven by a bias voltage $V_{B1}$. The input transistor $M_{P1}$ 706 and input transistor $M_{P2}$ 708 are in a common source configuration (the sources of input transistor $M_{P1}$ 706 and input transistor $M_{P2}$ 708 are connected together). The sources of input transistor $M_{P1}$ 706 and input transistor $M_{P2}$ 708 are connected to a second current source providing current I. A transistor $M_{Pc}$ 712 (e.g., a PMOS transistor) can serve as the second current source. The second current source is at source terminals of input transistor $M_{P1}$ 706 and input transistor $M_{P2}$ 708. The gate of transistor $M_{Pc}$ 712 can be driven by a bias voltage $V_{B2}$. This circuit structure helps reduce the power consumption at the expense of dynamic range, since it requires an additional current source. The gain A would be given by:

$$A \sim (g_{m_N} + g_{m_P}) R_L \quad (3)$$

where $g_{m_N}$ is the transconductance of an NMOS transistor and $g_{m_P}$ is the transconductance of an PMOS transistor, and the BW would be given by:

$$BW \sim \frac{1}{2\pi R_L C_L} \quad (4)$$

The net gain G of the MDAC circuit is given by:

$$G = \frac{NC_i}{NC_i + C_p} A = \frac{C}{C + C_p} \quad (5)$$

where N is the number of MDAC capacitances, $C_i$ is the value of each sampling/DAC capacitance, C is the value of the total sampling capacitance, $C_p$ is the parasitic capacitance at the input of the amplifier, and A is the gain of the amplifier.

Figure 8:
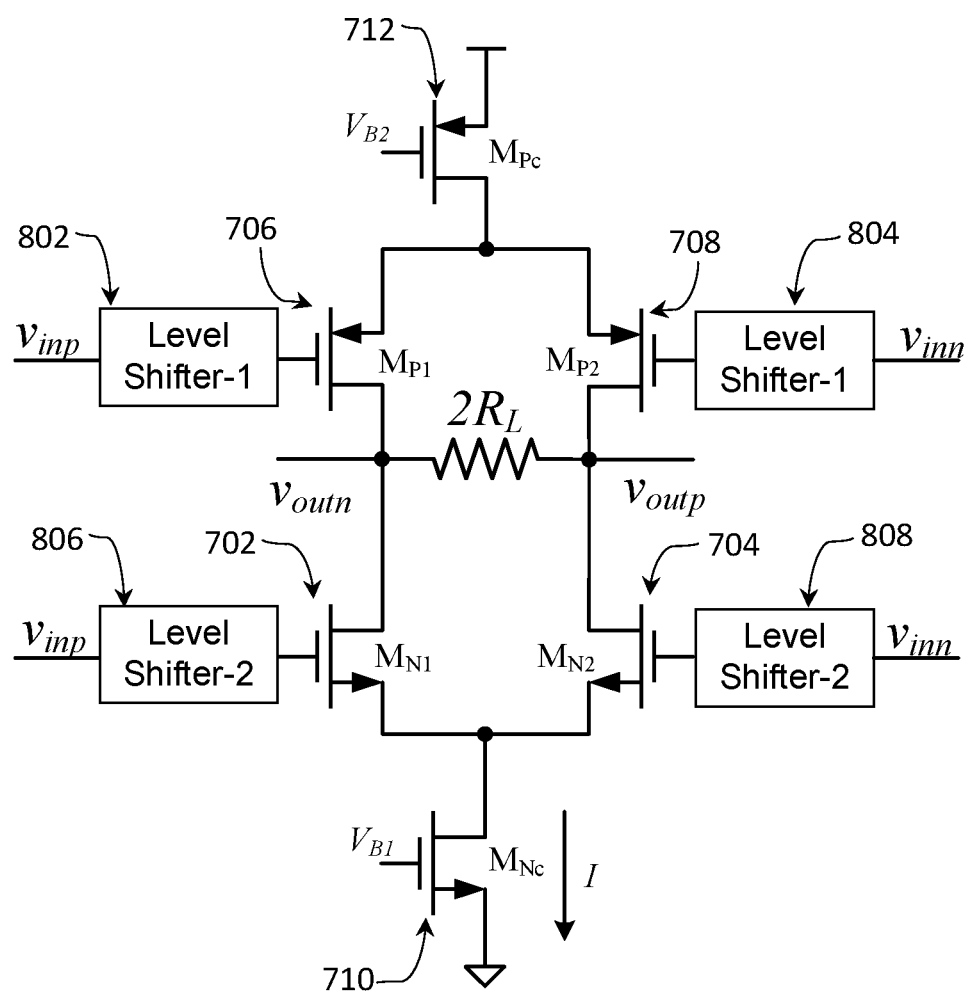

To optimize the dynamic range independently for the NMOS and PMOS transistors, level shifters can be used. FIG. 8 shows open-loop amplifier 800 based on the open-loop amplifier 700 with (optional) level shifters. Level shifter-1 802 and level shifter-1 804 level shift differential inputs $v_{inp}$ and $v_{inn}$ respectively. Outputs of Level shifter-1 802 and level shifter-1 804 are driving the gates of input transistor $M_{P1}$ 706 and input transistor $M_{P2}$ 708 respectively. Level shifter-1 802 and level shifter-1 804 can optimize the dynamic range for the PMOS transistors. Level shifter-2 806 and level shifter-2 808 level shift differential inputs $v_{inp}$ and $V_{inn}$ respectively. Outputs of Level shifter-2 806 and level shifter-2 808 are driving the gates of input transistor $M_{N1}$ 702 and input transistor $M_{N2}$ 704 respectively. Level shifter-2 806 and level shifter-2 808 can optimize the dynamic range for the NMOS transistors. Level shifters can be used for any one of the open-loop amplifiers described herein.

Figure 9:
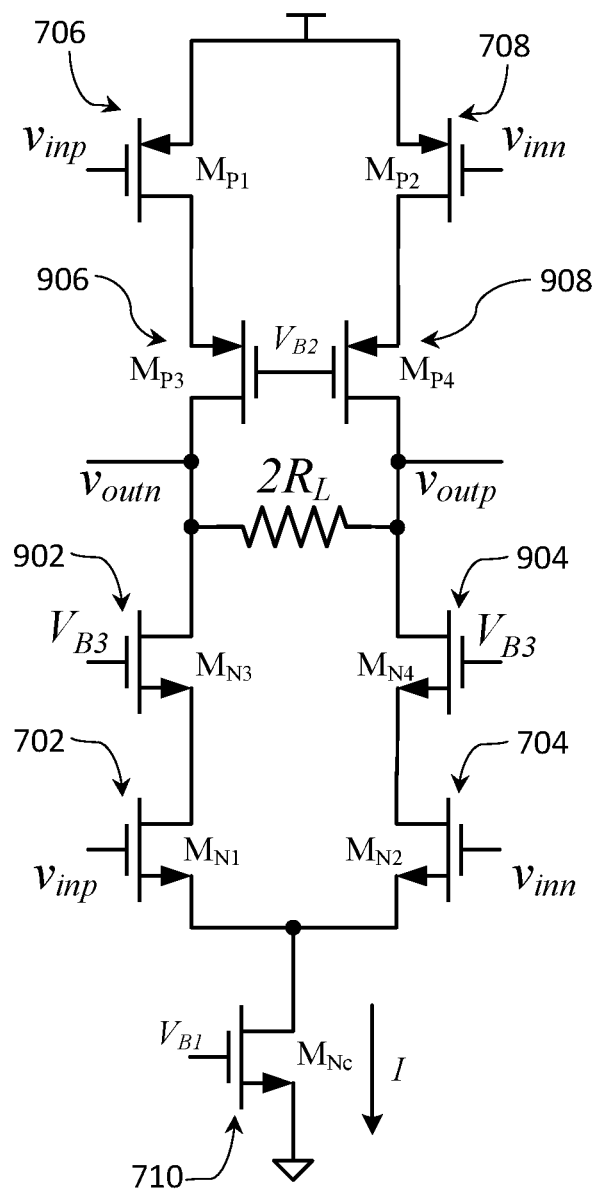

FIG. 9 shows an open-loop amplifier 900 based on the open-loop amplifier 700, but the open-loop amplifier 900 is cascoded. The input transistor $M_{N1}$ 702 and input transistor $M_{N2}$ 704 are cascoded by a pair of cascode transistors: cascode transistor $M_{N3}$ 902 and cascode transistor $M_{N4}$ 904 (e.g., NMOS transistors) respectively. The gates of cascode transistor $M_{N3}$ 902 and cascode transistor $M_{N4}$ 904 are driven by bias voltage $V_{B3}$. The input transistor $M_{P1}$ 706 and input transistor $M_{P2}$ 708 are also cascoded as well, by a pair of cascode transistors: cascode transistor $M_{P3}$ 906 and cascode transistor $M_{P4}$ 908 (e.g., PMOS transistors) respectively. The drains of cascode transistor $M_{P3}$ 906 and cascode transistor $M_{P4}$ 908 are connected to drains of cascode transistor $M_{N3}$ 902 and cascode transistor $M_{N4}$ 904 respectively. The drains of cascode transistor $M_{N3}$ 902 and cascode transistor $M_{N4}$ 904 (now) form the differential output nodes $v_{outn}$ and $v_{outp}$ respectively, and the drains of cascode transistor $M_{P3}$ 906, and cascode transistor $M_{P4}$ 908 (now) also form the differential output nodes $v_{outn}$ and $v_{outp}$ respectively. This embodiment can suffer worse linearity, but enjoys lower input capacitance and possibly higher gain.

NMOS/PMOS Transistor Device Operating in the Linear Region as Load

As seen in FIGS. 5-9, a load resistance of $2R_L$ is coupled across the differential output nodes $v_{outn}$ and $v_{outp}$. In order to improve the linearity and reduce the variability of the open-loop amplifiers, an NMOS and/or PMOS resistance (e.g., NMOS and/or PMOS transistor devices operating in the linear region) can be used as shown in FIGS. 10-12.

Figure 10:
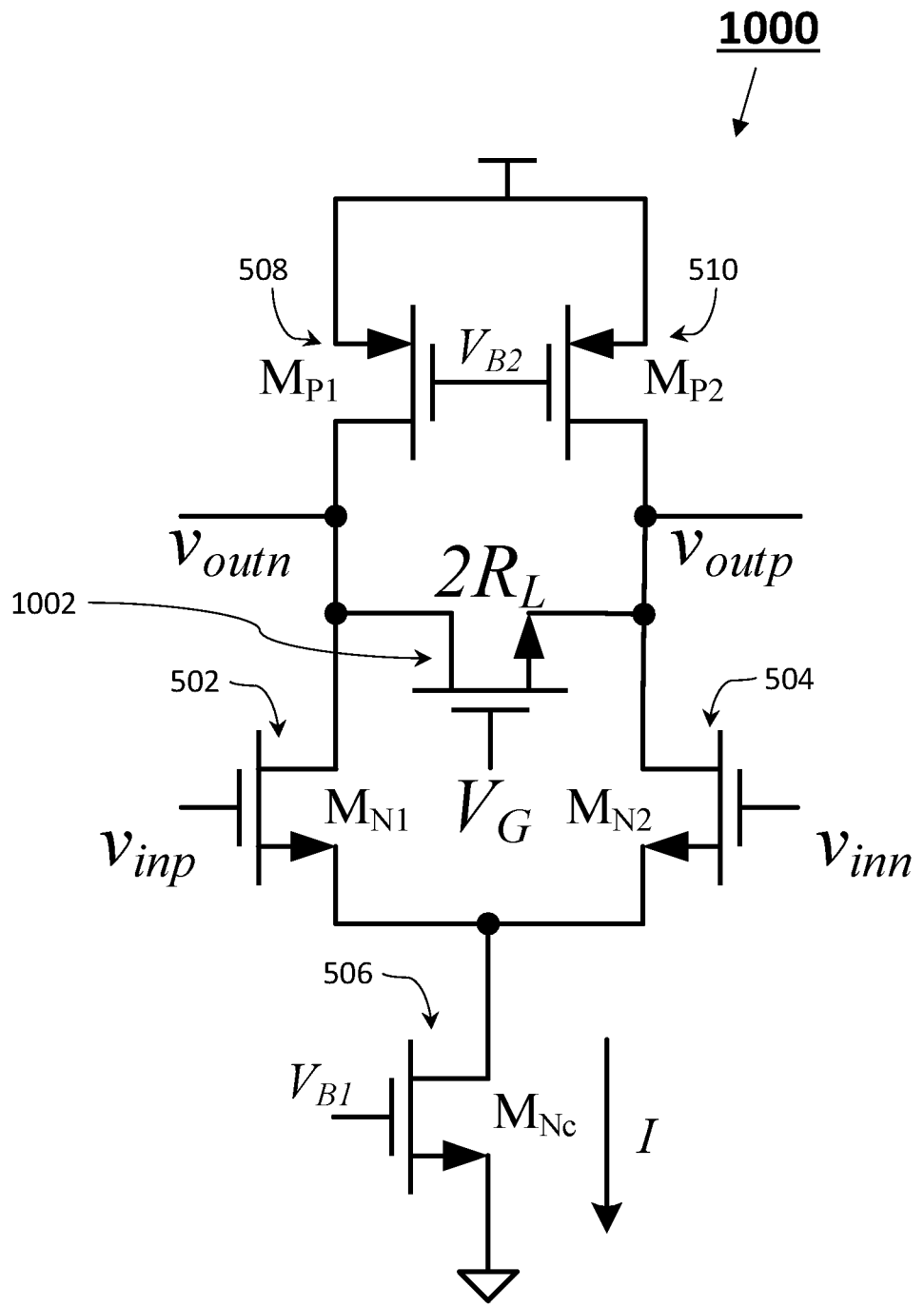

FIG. 10 shows an open-loop amplifier 1000 based on the open-loop amplifier 500, but the load resistance of $2R_L$ is replaced by, a load transistor 1002 (e.g., an NMOS transistor). Terminals of the load transistor 1002, e.g., the drain and source of the load transistor 1002, are coupled to the differential output nodes $v_{outn}$ and $v_{outp}$ respectively. Gate of the load transistor 1002 is driven by voltage $V_G$.

Figure 11:
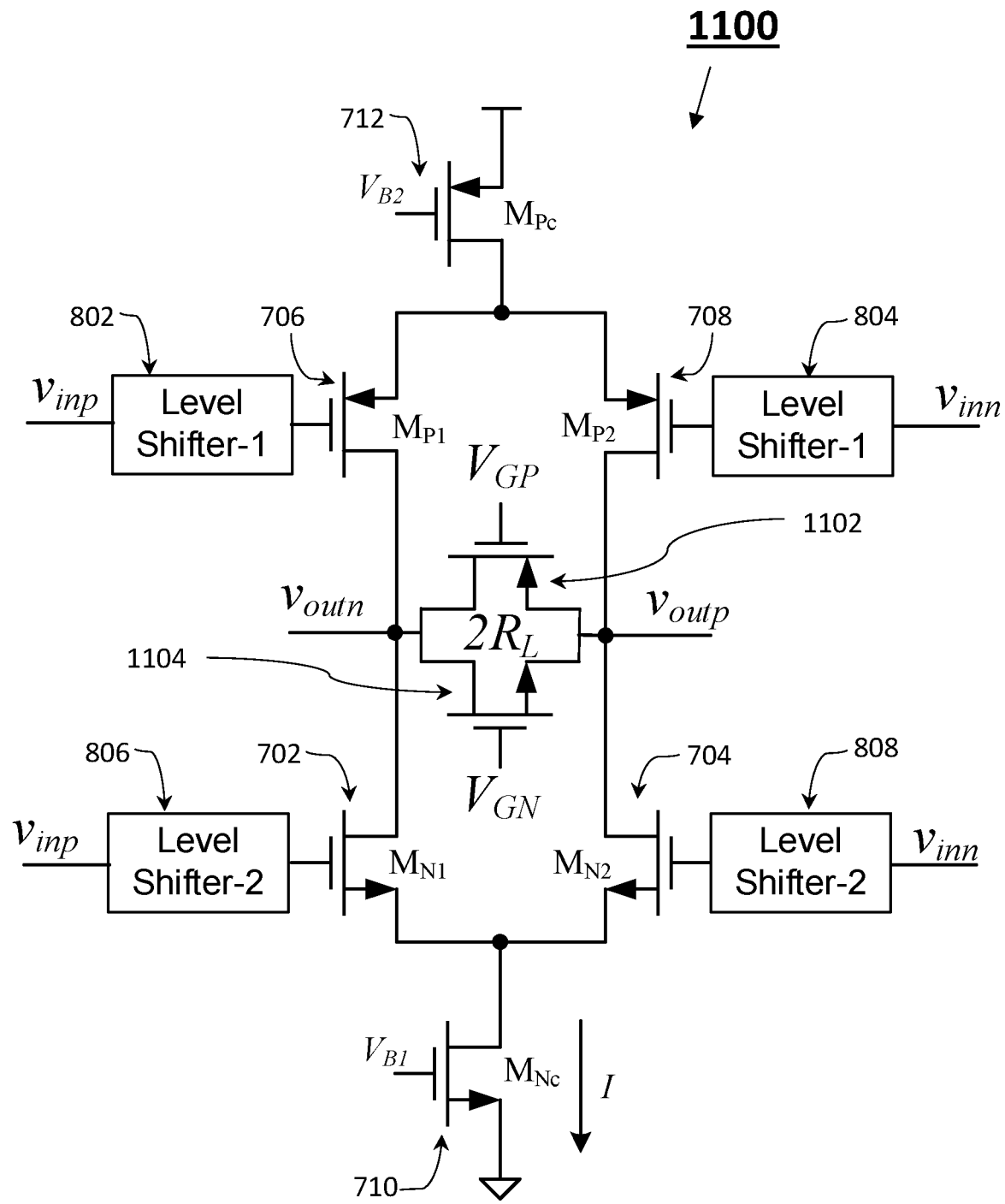

FIG. 11 shows an open-loop amplifier 1100 based on the open-loop amplifier 800, but the load resistance of $2R_L$ is replaced by, a load transistor 1102 (e.g., a PMOS transistor, or a first load transistor of a first type) and load transistor 1104 (e.g., an NMOS transistor, or a second load transistor of a second type different from/complementary to the first type). Load transistor 1104 is in parallel with load transistor 1102. The drain and source of the load transistor 1102 are coupled to the differential output nodes $v_{outn}$ and $v_{outp}$ respectively. The drain and source of the load transistor 1104 are coupled to the differential output nodes $v_{outn}$ and $v_{outp}$ respectively. Gate of the load transistor 1102 is driven by voltage $V_{GP}$. Gate of the load transistor 1104 is driven by voltage $V_{GN}$.

Figure 12:
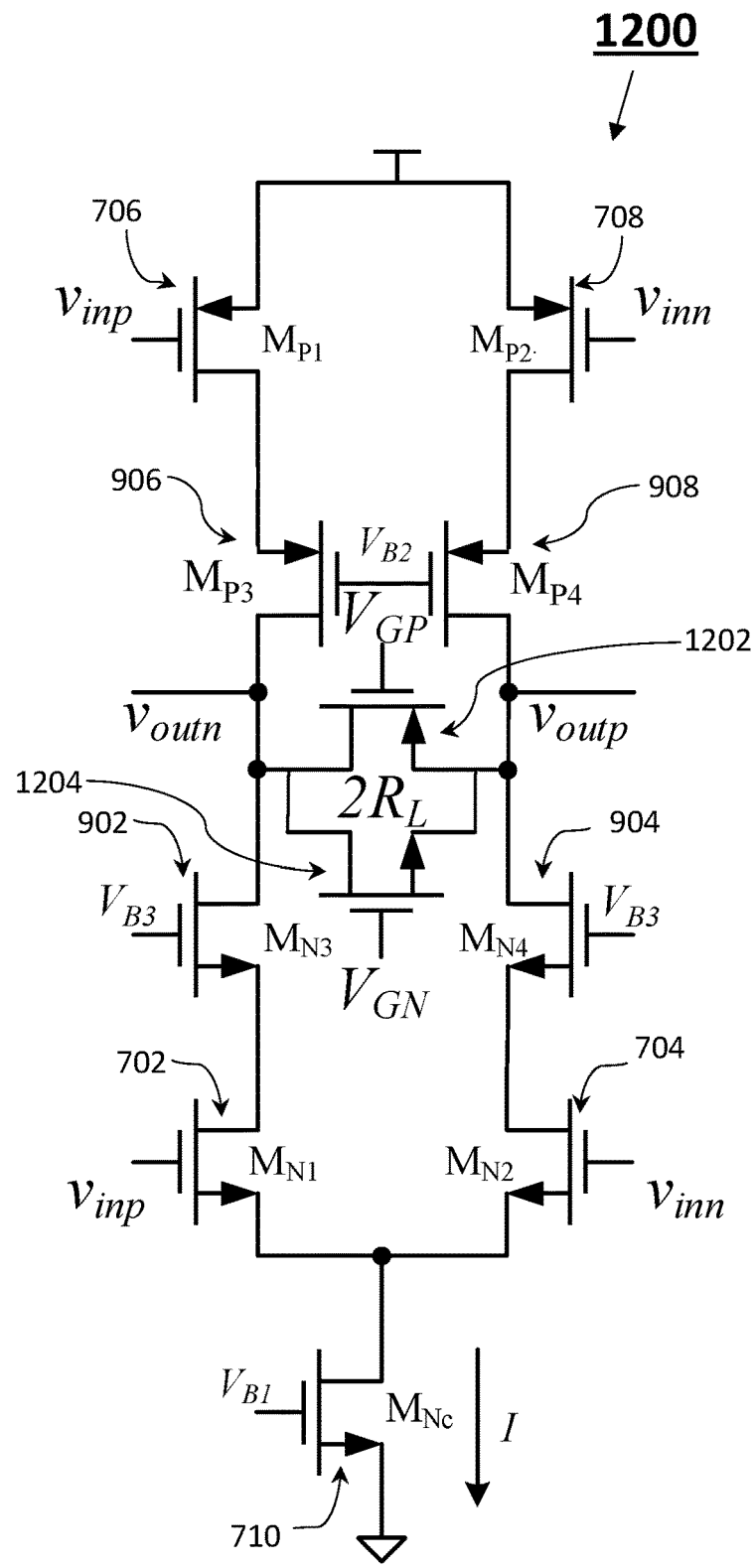

FIG. 12 shows an open-loop amplifier 1200 based on the open-loop amplifier 900, but the load of $2R_L$ is replaced by, a load transistor 1202 (e.g., a PMOS transistor or a first load transistor of a first type) and load transistor 1204 (e.g., an NMOS transistor, or a second load transistor of a second type different from/complementary to the first type). Load Transistor 1202 is in parallel with load transistor 1204. The drain and source of the load transistor 1202 are coupled to the differential output nodes $v_{outn}$ and $v_{outp}$ respectively. The drain and source of the load transistor 1204 are coupled to the differential output nodes $v_{outn}$ and $v_{outp}$ respectively. Gate of the load transistor 1202 is driven by voltage $V_{GP}$. Gate of the load transistor 1204 is driven by voltage $V_{GN}$.

Load transistors are driven/controlled at the gate by a gate voltage that can operate the load transistors in a linear region. The load resistance is determined by the $g_{ds}$ of the NMOS/PMOS transistor device in the linear region. Since the gain is given by the ratio of $g_m/g_{ds}$ of NMOS and PMOS transistor devices, this structure of using load transistors suffers less variability compared to the resistance load (resistor-based load). In addition, the variation of the load resistance with the output amplitude tends to be opposite to the variation of $g_m$ with the output, which substantially improve the linearity of the amplifier. Using load transistors can result in 8-10 dB improvement in linearity.

NMOS/PMOS transistor device resistance as load can be used in addition to the load of $2R_L$ (instead of replacing the load of $2R_L$). The load transistor(s) can be in parallel with the resistor (e.g., the resistor-based load).

Figure 13:
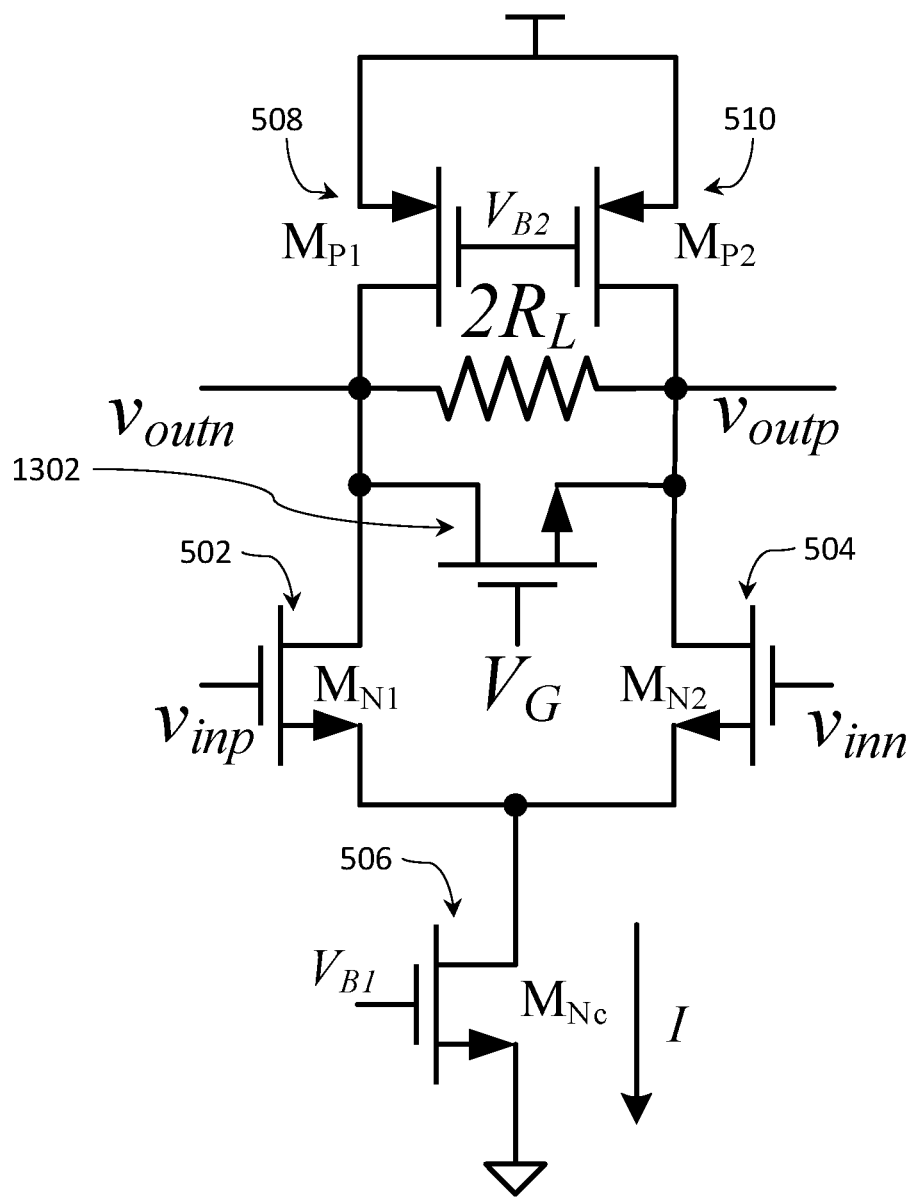

FIG. 13 shows an open-loop amplifier 1300 based on the open-loop amplifier 500, the load resistor of $2R_L$ is included in addition to the load transistor 1302 (e.g., an NMOS transistor). The load resistor of $2R_L$ is coupled across the differential output nodes $v_{outn}$ and $v_{outp}$. The drain and source of the load transistor 1302 are coupled to the differential output nodes $v_{outn}$ and $v_{outp}$ respectively. The load transistor 1302 is driven by gate voltage $V_G$.

Figure 14:
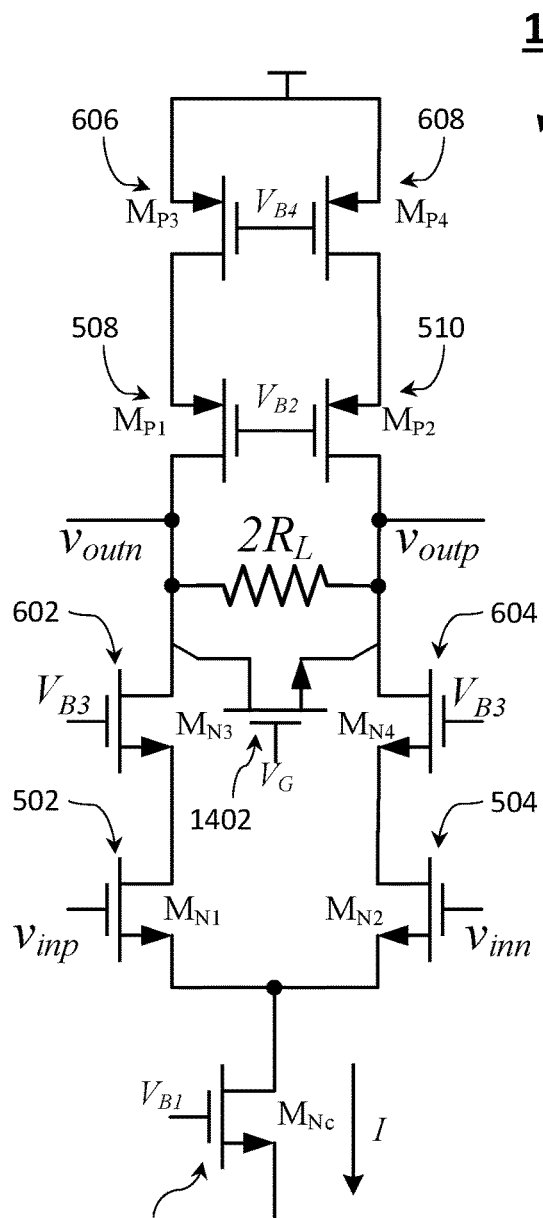

FIG. 14 shows an open-loop amplifier 1400 based on the open-loop amplifier 600, the load resistor of $2R_L$ is coupled across the differential output nodes $v_{outn}$ and $v_{outp}$, and the drain and source of load transistor 1402 (e.g., an NMOS transistor) are coupled to the differential output nodes $v_{outn}$ and $v_{outp}$ respectively. The load transistor 1402 is driven by gate voltage $V_G$.

Figure 15:
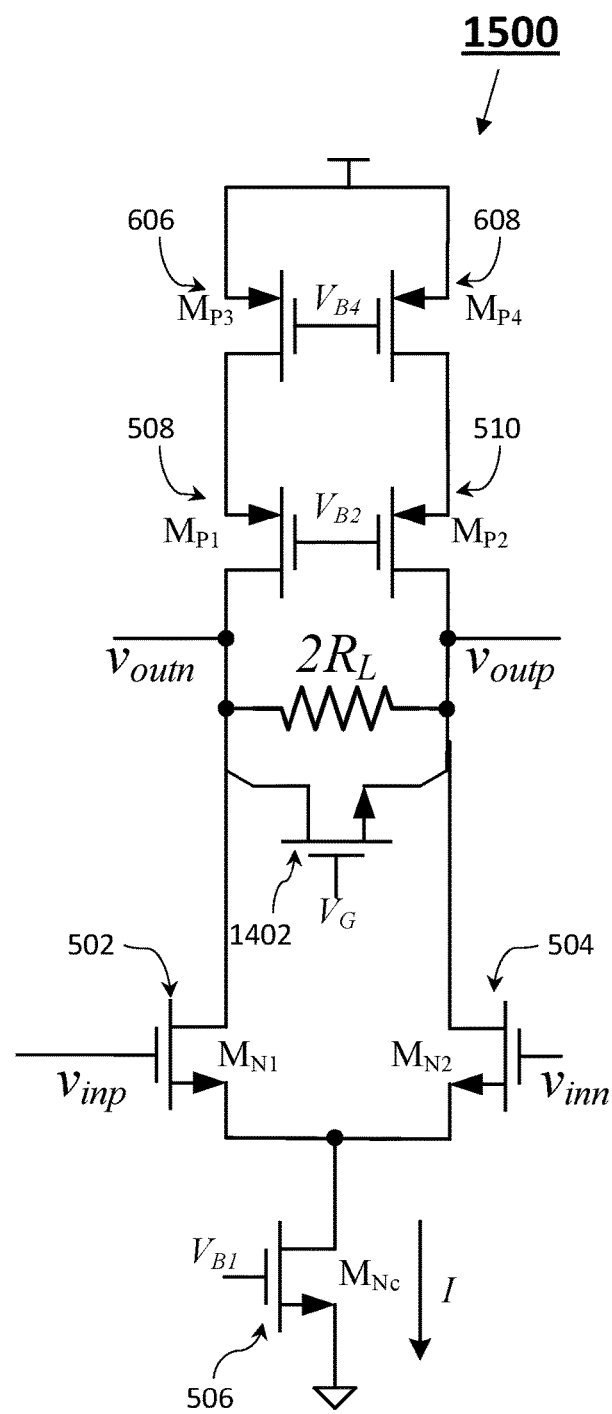

FIG. 15 shows an open-loop amplifier 1500 similar to the open-loop amplifier 1400, but cascode transistor $M_{N3}$ 602 and cascode transistor $M_{N4}$ 604 are omitted. It is understood that a suitable combination of resistor(s) and load transistor(s) can be cross-coupled to the differential output nodes $v_{outn}$ and $v_{outp}$ for the various open-loop amplifiers described herein.

Open-Loop Amplifiers with Source Degeneration

Figure 16:
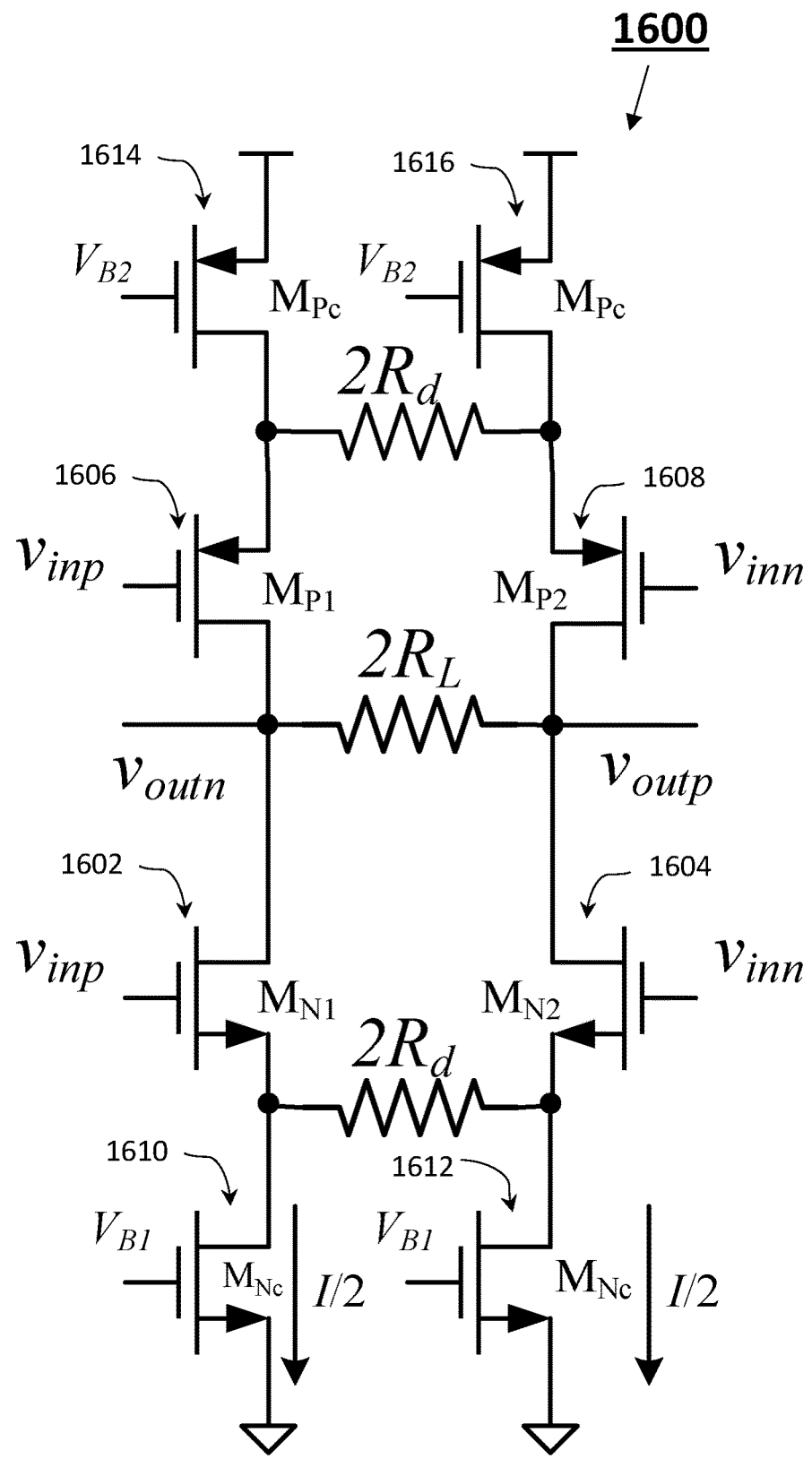

FIG. 16 shows yet another open-loop amplifier 1600 having a push-pull circuit structure with a load resistance, where source degeneration using resistance Rd is used to improve the linearity of the amplifier. Similar to the push-pull structures described herein, the open-loop amplifier 1600 has two complementary pairs of input transistors that form the push-pull circuit structure. A first pair of input transistors comprises input transistor $M_{N1}$ 1602 and input transistor $M_{N2}$ 1604 (e.g., NMOS transistors). Gates of input transistor $M_{N1}$ 1602 and input transistor $M_{N2}$ 1604 receive $v_{inp}$ and $v_{inn}$ respectively. A second pair of input transistors comprises input transistor $M_{P1}$ 1606 and input transistor $M_{P2}$ 1608 (e.g., PMOS transistors). Gates of input transistor $M_{P1}$ 1606 and input transistor $M_{P2}$ 1608 receive $v_{inp}$ and $v_{inn}$ respectively. The drains of input transistor $M_{N1}$ 1602 and input transistor $M_{P1}$ 1606 are connected together and form a first differential output node $v_{outn}$. The drains of input transistor $M_{N2}$ 1604 and input transistor $M_{P2}$ 1608 are connected together and form a second differential output node $v_{outp}$. In this example, the source of input transistor $M_{N1}$ 1602 and the source of input transistor $M_{N2}$ 1604 are connected to respective current sources providing current I/2. A transistor $M_{Nc}$ 1610 (e.g., an NMOS transistor) and transistor $M_{Nc}$ 1612 (e.g., an NMOS transistor) can serve as the current sources. The gates of transistor $M_{Nc}$ 1610 and transistor $M_{Nc}$ 1612 can be driven by a bias voltage $V_{B1}$. The source of input transistor $M_{P1}$ 1606 and the source of input transistor $M_{P2}$ 1608 are connected to respective current sources providing current I/2. A transistor $M_{Pc}$ 1614 (e.g., a PMOS transistor) and transistor $M_{Pc}$ 1616 (e.g., a PMOS transistor) can serve as the current sources. The gate of $M_{Pc}$ 1614 and transistor $M_{Pc}$ 1616 can be driven by a bias voltage $V_{B2}$. A resistor $2R_d$ is coupled across the sources of input transistor $M_{N1}$ 1602 and input transistor $M_{N2}$ 1604. A resistor $2R_d$ is also coupled across the sources of input transistor $M_{P1}$ 1606 and input transistor $M_{P2}$ 1608. The load across the differential output nodes $v_{outn}$ and $v_{outp}$ can be implemented using resistors ($2R_L$) or using NMOS/PMOS devices operating in the linear region as illustrated by FIGS. 10-15.

Common-Mode Rejection for Open-Loop Amplifiers

Figure 17:
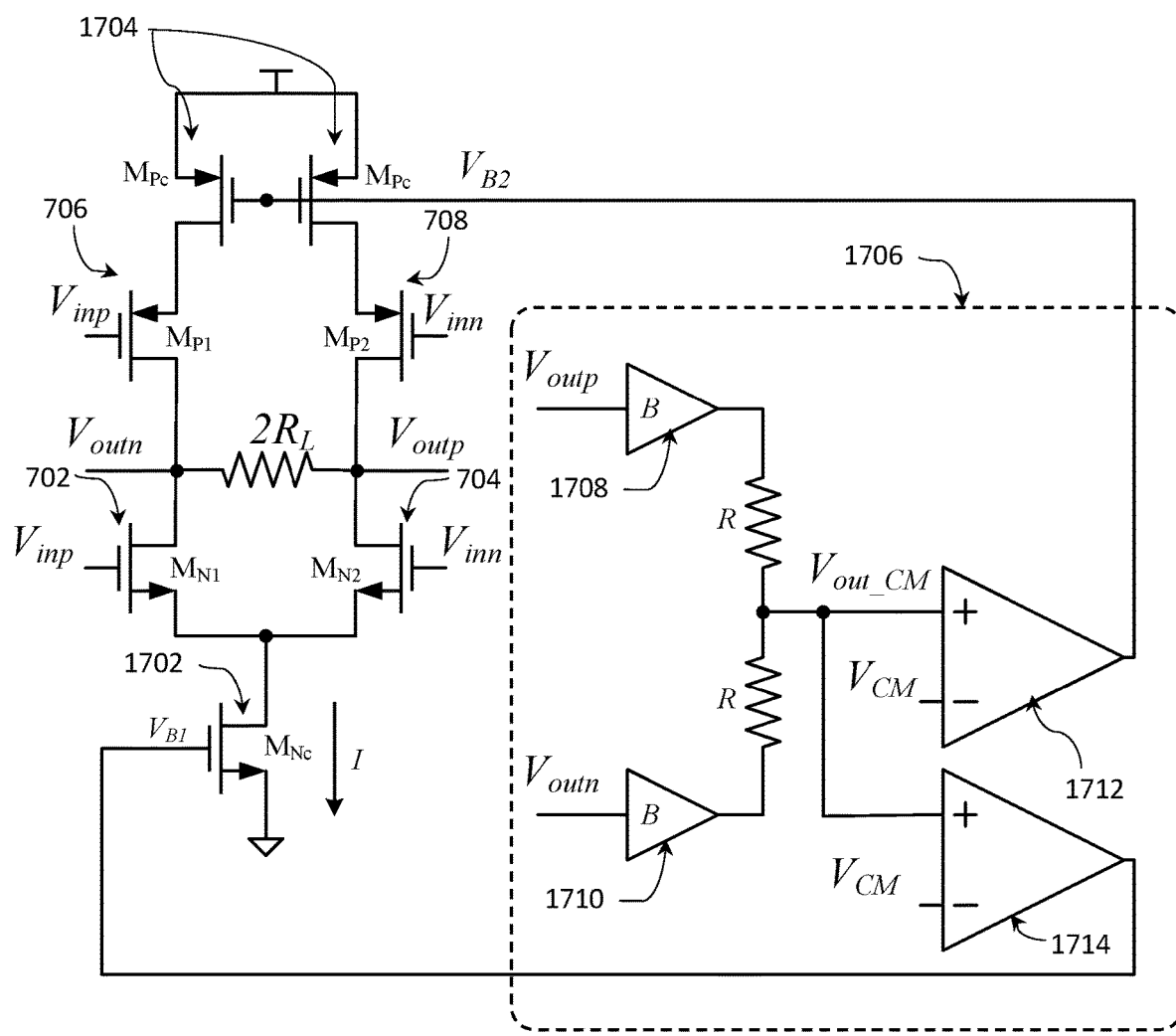
Figure 18:
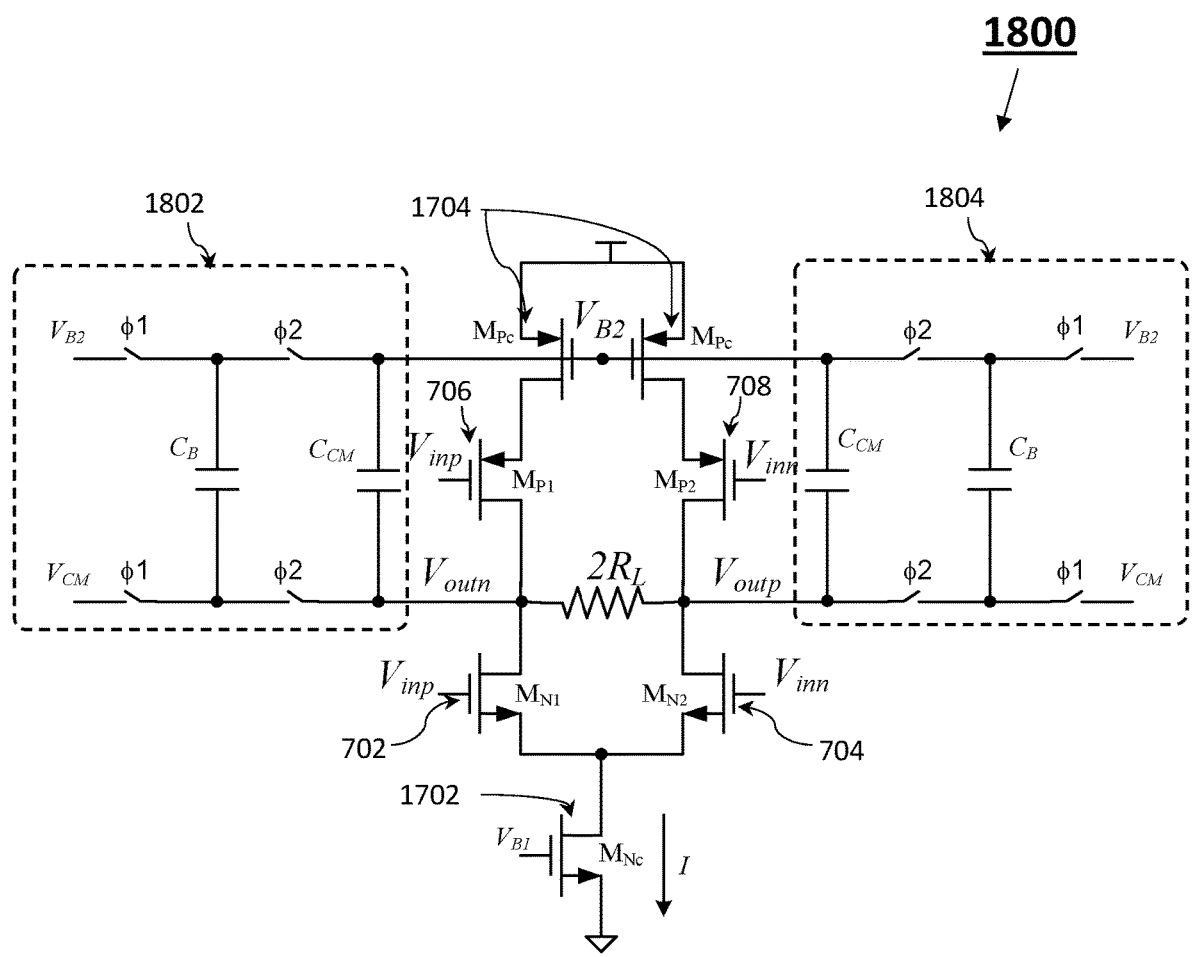
Figure 19:
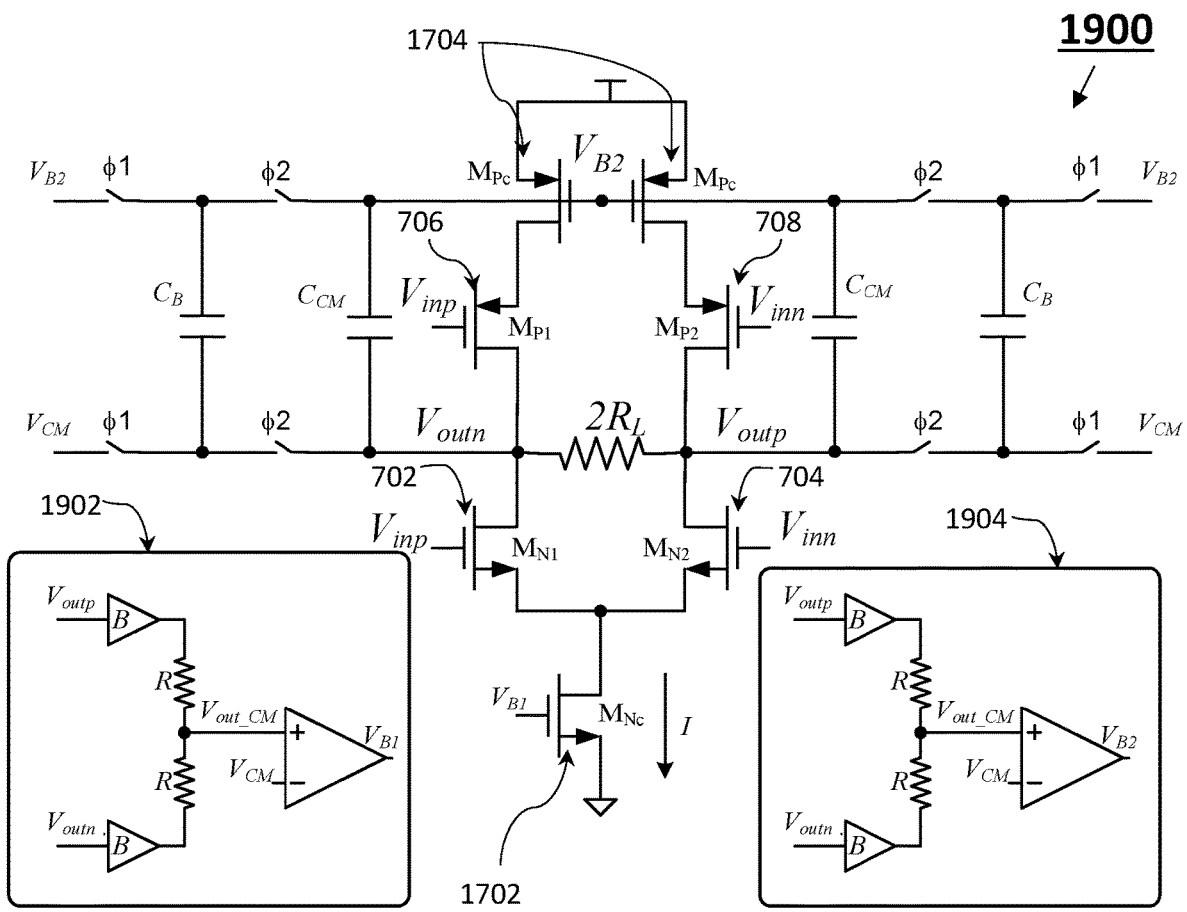

Common-mode (CM) rejection can be beneficial in open-loop amplifiers, such as the open-loop amplifiers described herein. Uncontrolled CM variation can change the gain at a rate that is too fast for the calibration to track. Analog CM control can include slow and fast loops to ensure good CM control. Illustrative embodiments that include CM feedback control are shown in FIGS. 17-19. One skilled in the art would appreciate that the CM feedback control techniques can be applied to any one of the open-loop amplifiers herein.

FIG. 17 shows an open-loop amplifier 1700 having push-pull circuit structure and CM feedback control. CM feedback control is applied to both the NMOS- and PMOS-sides of the push-pull circuit structure to improve robustness. The push-pull circuit structure includes two pairs of input transistors and respective current source devices as described previously with other push-pull circuit structures (e.g., FIG. 7). Gate of the transistors $M_{Nc}$ 1702 serving as the NMOS-side current source is driven by bias voltage $V_{B1}$, and the gates of transistors $M_{Pc}$ 1704 serving as the PMOS-side current sources are driven by bias voltage $V_{B2}$. The CM feedback control circuit 1406 senses the output common-mode and (separately) adjusts the bias voltages $V_{B1}$ and $V_{B2}$ accordingly. Specifically, the CM feedback control circuit 1706 can buffer differential outputs $V_{outp}$ and $V_{outn}$ using buffers 1708 and 1710 respectively, and form the output common-mode voltage $V_{out\_CM}$ through the voltage divider of two resistors (labeled "R" in the FIGURE). The feedback action of amplifiers 1712 and 1714 can drive the output common-mode voltage $V_{out\_CM}$ close to the ideal common-mode voltage $V_{CM}$. In other words, the outputs of the amplifiers controlling respective current sources (e.g., varying the bias voltages) would adjust the current sources (by varying bias voltages $V_{B1}$ and $V_{B2}$) to get the output common-mode voltage $V_{out\_CM}$ closer to the ideal common-mode voltage $V_{CM}$. CM feedback control circuit 1706 is considered a closed-loop CM feedback control circuit.

FIG. 18 shows an open-loop amplifier 1800 with "fast" CM feedback control. The open-loop amplifier 1800 is based on a push-pull circuit structure, previously illustrated by FIG. 17. In this example, the CM feedback control circuit comprises switched capacitor circuits 1802 and 1804 that control bias voltage $V_{B2}$ driving the gates of transistor $M_{Pc}$ 1704 serving as the PMOS-side current sources. The switched capacitor circuits 1802 and 1804 can sense the CM at the differential output nodes $V_{outp}$ and $V_{outn}$, and adjusts the bias voltage $V_{B2}$ accordingly. The capacitors $C_{CM}$ are provided to setup an ideal proper CM voltage, and the bias voltage $V_{B2}$ is adjusted to drive the sensed CM voltage closer to the ideal proper common-mode voltage.

FIG. 19 shows an open-loop amplifier 1900 with switched capacitor CM feedback (similar to FIG. 18) and closed-loop CM feedback (similar to FIG. 17). A closed-loop CM feedback circuit 1902 (similar to CM feedback control circuit 1706) can control the bias voltage $V_{B1}$. A switched capacitor circuit can control the bias voltage $V_{B2}$, and a further closed-loop CM feedback circuit 1904 can control the bias voltage $V_{B2}$ used in the switched capacitor circuit. In some embodiments, a closed-loop CM feedback loop can control the bias voltage $V_{B2}$ used in the switched capacitor CM feedback circuit, or it can control a portion of the current source transistors (transistors $M_{Pc}$ 1704 and transistor $M_{Nc}$ 1702) directly. The closed-loop CM feedback circuit provides very tight control for relatively low frequency, while the switched capacitor CM feedback circuit controls the common-mode up to very high frequencies.

Note that the CM control can be applied to both the NMOS- and PMOS-side to take advantage of the push-pull operation in the CM feedback control loop.

Reducing CM Gain with Single-Ended Load Resistances (Load Resistors or Load Transistors Operating in a Linear Region)

Figure 20:
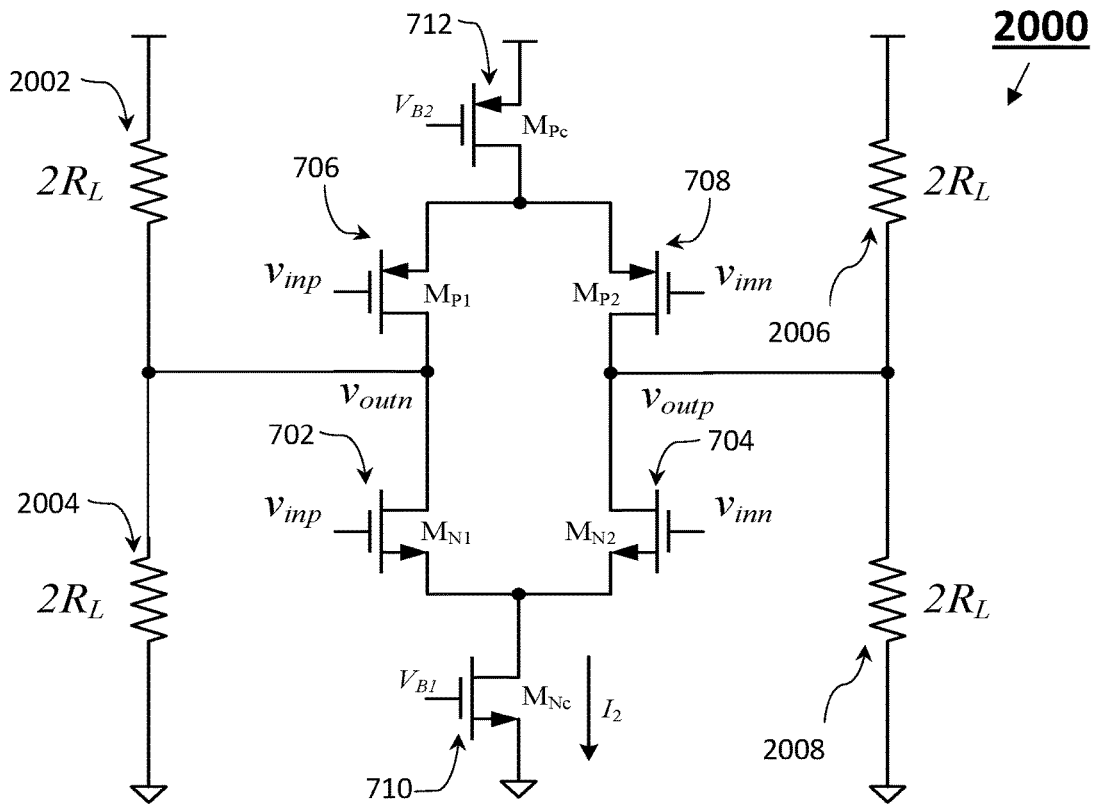

In some embodiments, the CM gain can be further reduced by using single-ended load resistors. FIG. 20 shows an open-loop amplifier 2000 having a push-pull circuit structure based on the open-loop amplifier 700 and single-ended load resistors. The single-ended load resistors are labeled $2R_L$ in the FIGURE. The load resistors connected between supply and ground (two load resistors in series, where one load resistor is connected to supply and the other load resistor is connected to ground) forms a voltage divider between supply and ground. Providing load resistors as shown for each differential output node can help to reduce CM gain at the differential output nodes $v_{outn}$ and $v_{outp}$. A node between the two load resistors in series is connected to a differential output node.

Alternatively, the load resistors can be connected to the CM voltage $V_{CM}$ (two load resistors in series, where one load resistor is connected to CM voltage $V_{CM}$ and the other load resistor is also connected to CM voltage $V_{CM}$).

In the example shown, load resistor 2002 and load resistor 2004 form two series resistors, where load resistor 2002 is connected to supply and load resistor 2004 is connected to ground. Node between load resistor 2002 and load resistor 2004 is connected to differential output node $v_{outn}$. Load resistor 2006 and load resistor 2008 form two series resistors, where load resistor 2006 is connected to supply and load resistor 2008 is connected to ground. Node between load resistor 2006 and load resistor 2008 is connected to differential output node $v_{outp}$.

Figure 21:
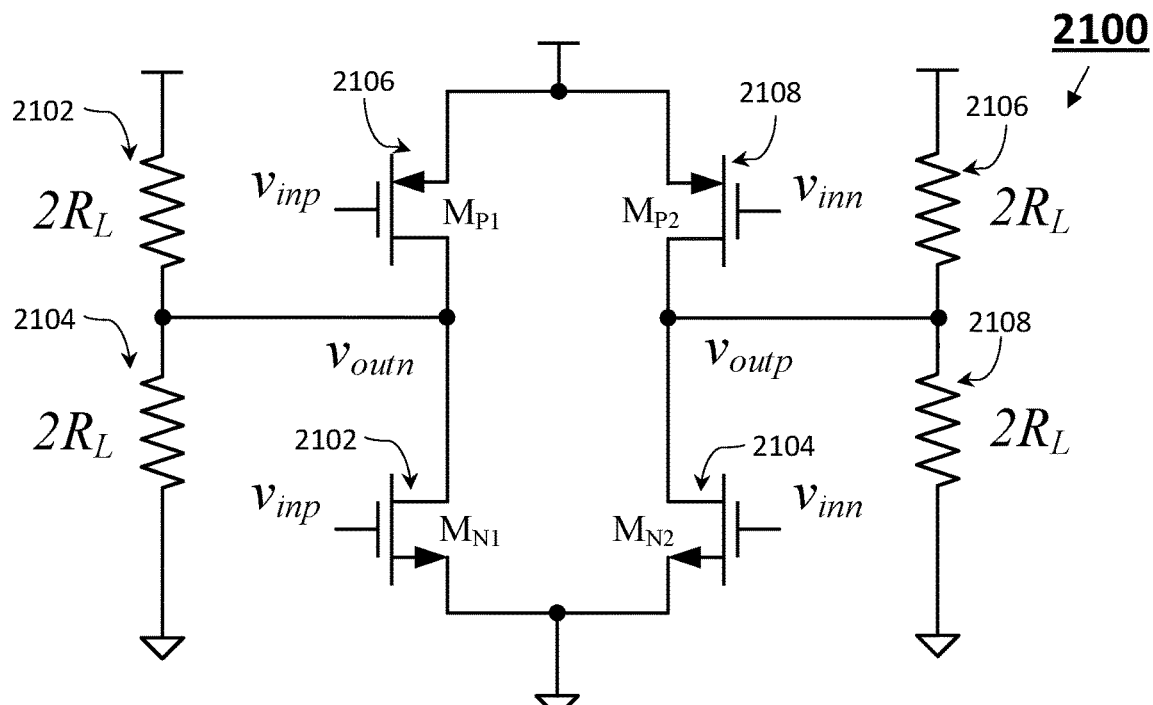

FIG. 21 shows an open-loop amplifier 2100 comprising an inverter with a resistive load. The load can be differential or single-ended to reduce the CM gain. As shown, the open-loop amplifier 2100 has similar load resistors seen in FIG. 20. In the example shown, load resistor 2102 and load resistor 2104 form two series resistors, where load resistor 2102 is connected to supply and load resistor 2104 is connected to ground. Node between load resistor 2102 and load resistor 2104 is connected to differential output node $v_{outn}$. Load resistor 2106 and load resistor 2108 form two series resistors, where load resistor 2106 is connected to supply and load resistor 2108 is connected to ground. Node between load resistor 2106 and load resistor 2108 is connected to differential output node $v_{outp}$.

Figure 22:
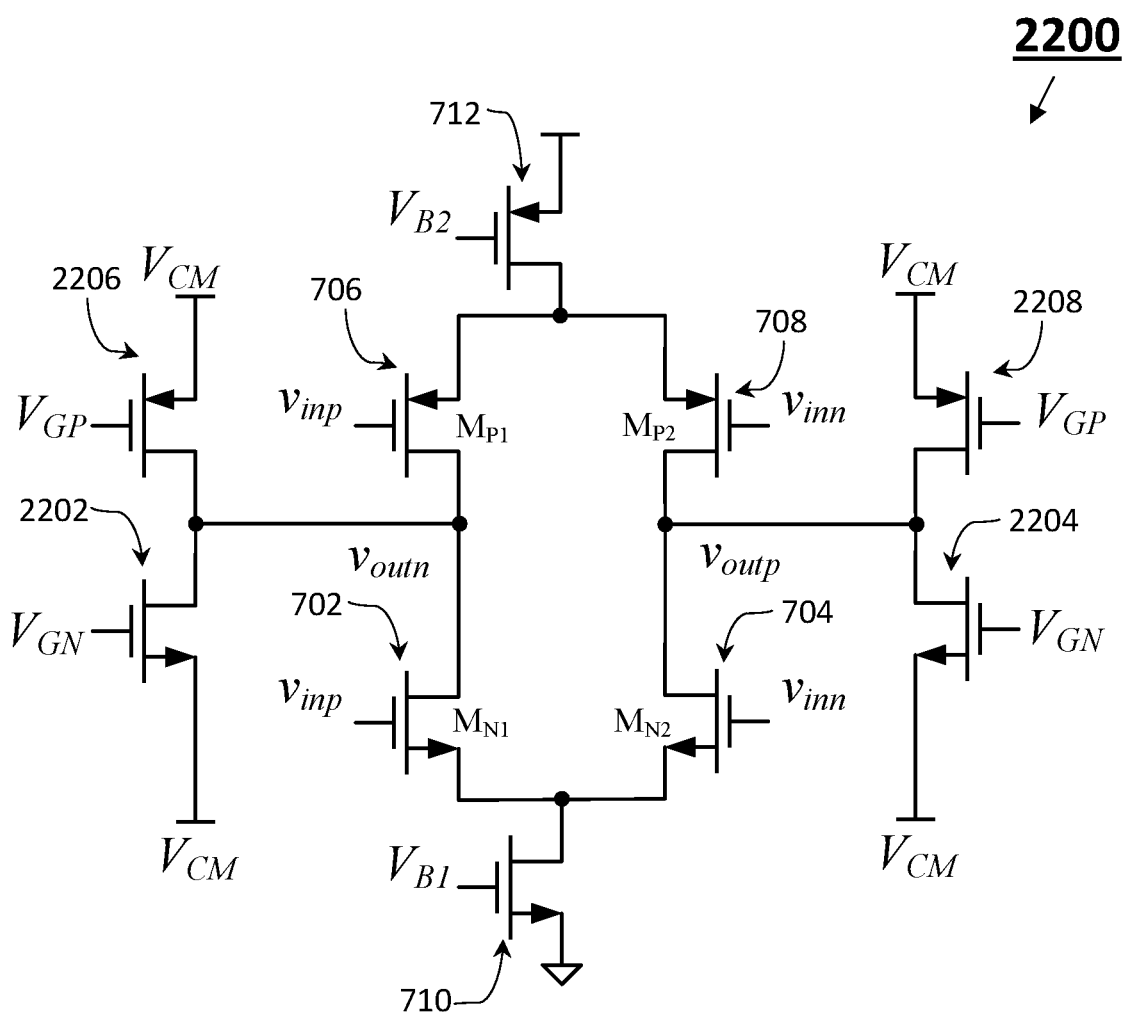

In addition, NMOS/PMOS transistor devices operating in the linear region can be used in place of or in addition to the single-ended resistors to improve performance as mentioned before. FIG. 22 shows an open-loop amplifier 2000 having a push-pull circuit structure based on the open-loop amplifier 700 and NMOS/PMOS transistor devices as the resistive loads. In the example shown, the drain of load transistor 2206 (e.g., PMOS transistor) is connected to the drain of load transistor 2202 (e.g., NMOS transistor). The drains of the load transistor 2206 and 2202 are connected to differential output node $v_{outn}$. The sources of load transistors 2206 and 2202 are connected to CM voltage $V_{CM}$. Gate of load transistor 2206 is driven by bias voltage $V_{GP}$. Gate of load transistor 2202 is driven by bias voltage $V_{GN}$. The drain of load transistor 2208 (e.g., PMOS transistor) is connected to the drain of load transistor 2204 (e.g., NMOS transistor). The drains of the load transistor 2208 and 2204 are connected to differential output node $v_{outp}$. The sources of load transistors 2208 and 2204 are connected to CM voltage $V_{CM}$. Gate of load transistor 2208 is driven by bias voltage $V_{GP}$. Gate of load transistor 2204 is driven by bias voltage $V_{GN}$. The NMOS/PMOS devices seen in FIG. 22 can also be used for the amplifier of FIG. 20.

It is appreciated that the NMOS/PMOS devices such as load transistors described herein can be used in place of or in addition to the load resistors in various embodiments shown and illustrated by the disclosure.

It is also appreciated that the various examples of single-ended load resistances can be added to various open-loop amplifiers having the load resistance across the differential output nodes.

It is also appreciated that the various examples of single-ended load resistances can be applied to various kinds of open-loop amplifiers shown and illustrated by the disclosure.

Gain Boosting for Open-Loop Amplifiers

Figure 23:
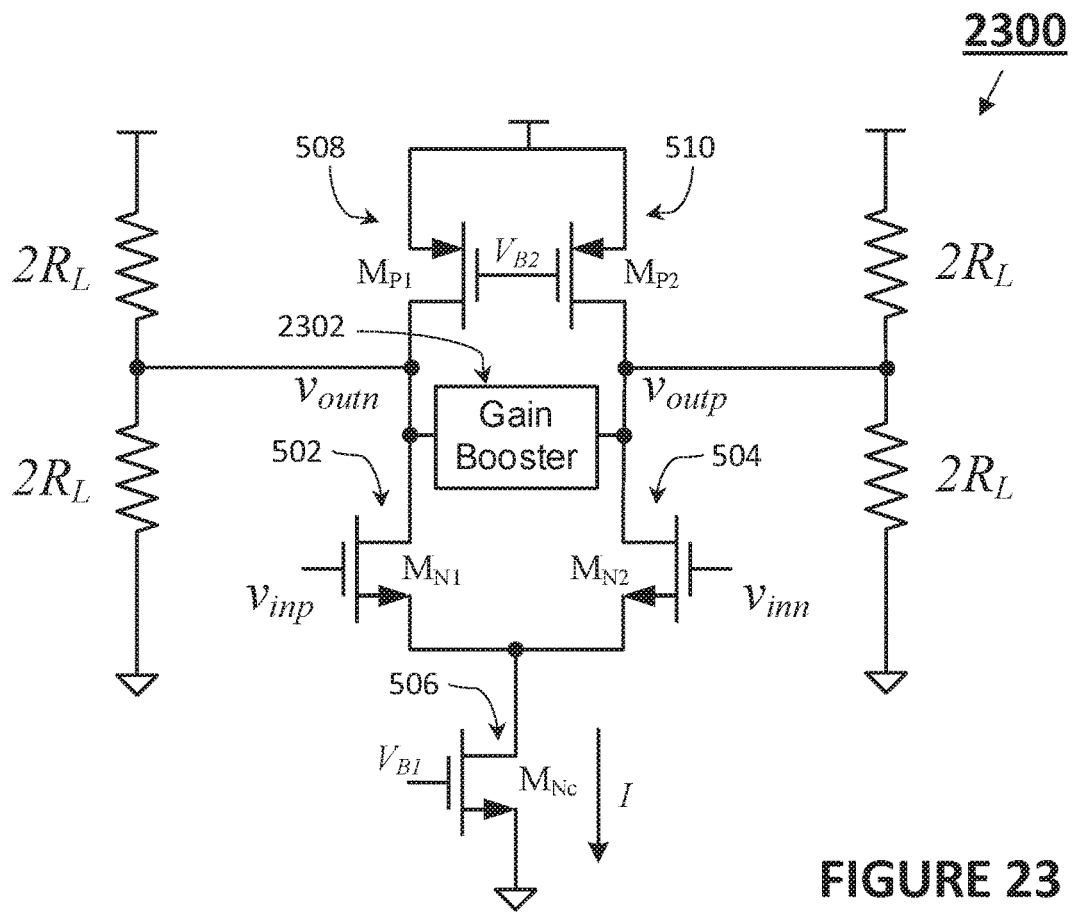

FIG. 23 shows an open-loop amplifier 2300 where gain boosting is employed to increase the effective $g_m$ of the amplifier without increasing the input capacitance. The open-loop amplifier 2300 is similar to the open-loop amplifier 500. A gain booster circuit 2302 can be coupled to the differential output nodes $v_{outn}$ and $v_{outp}$. Load resistors are provided in a similar fashion to FIGS. 20 and 21 at the differential output nodes $v_{outn}$ and $v_{outp}$.

Figure 24:
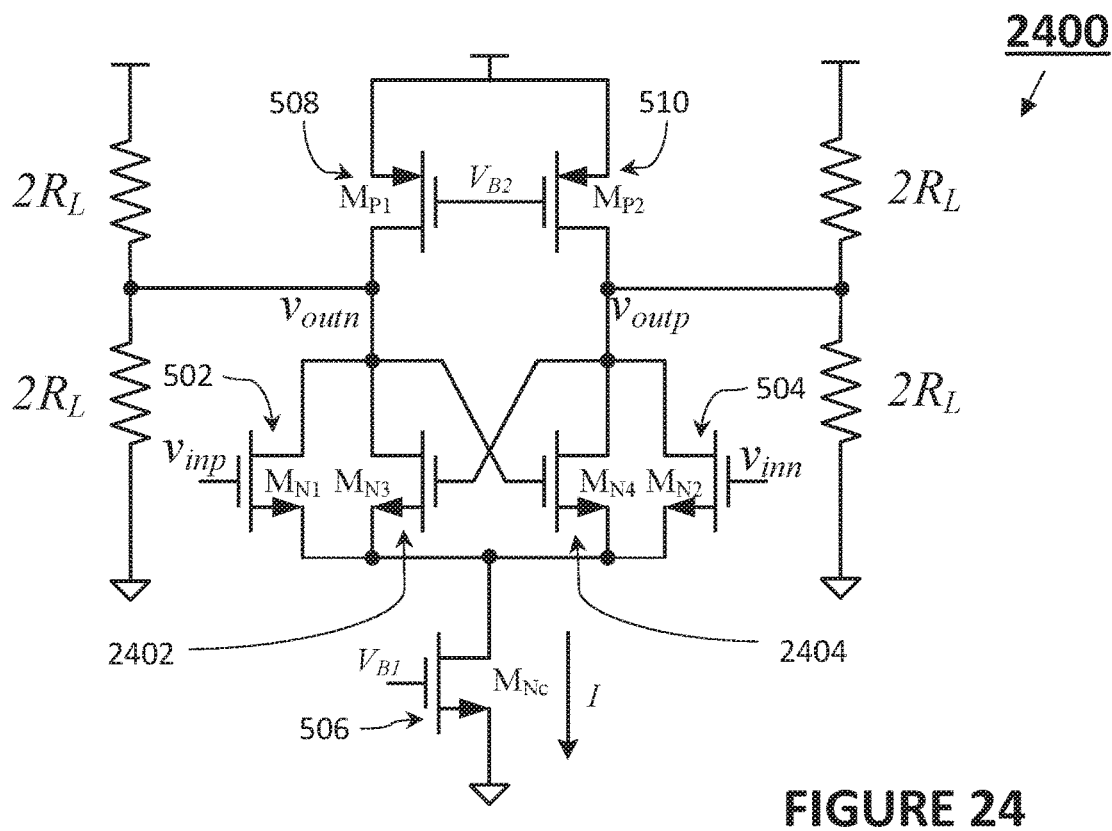

FIG. 24 shows an open-loop amplifier 2400 where gain boosting is employed to increase the effective $g_m$ of the amplifier without increasing the input capacitance by using positive feedback. The open-loop amplifier 2400 is similar to the open-loop amplifier 2300. The gain booster circuit comprises cross-coupled transistor $M_{N3}$ 2402 and cross-coupled transistor $M_{N4}$ 2404 (e.g., NMOS transistors). The gate of cross-coupled transistor $M_{N3}$ 2402 is coupled to the differential output node $v_{outp}$, and the gate of cross-coupled transistor $M_{N4}$ 2404 is coupled to differential output node $v_{outn}$. Drains of cross-coupled transistor $M_{N3}$ 2402 and cross-coupled transistor $M_{N4}$ 2404 are coupled to the differential output nodes $v_{outn}$ and $v_{outp}$ respectively. Sources of cross-coupled transistor $M_{N3}$ 2402 and cross-coupled transistor $M_{N4}$ 2404 are coupled to the drain of transistor $M_{Nc}$ 506 serving as a current source. The widths and lengths of the cross-coupled transistor $M_{N4}$ 2402 and cross-coupled transistor $M_{N4}$ 2404 are much smaller than the input transistor $M_{N1}$ 502 and input transistor $M_{N2}$ 504.

Figure 25:
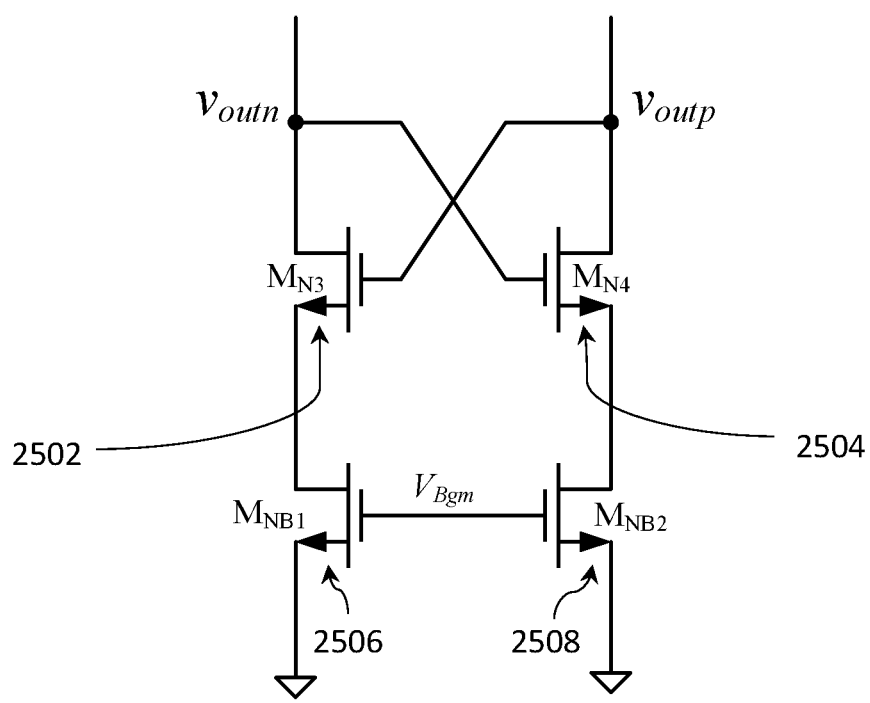
FIG. 25 illustrates an exemplary gain booster circuit, according to some embodiments of the disclosure.

FIG. 25 illustrates an exemplary gain booster circuit 2500, according to some embodiments of the disclosure. The gain booster circuit 2500 can be coupled to the differential output nodes $v_{outn}$ and $v_{outp}$, as shown. The gain booster circuit 2500 includes cross-coupled transistor $M_{N3}$ 2502 and cross-coupled transistor $M_{N4}$ 2504 (which can be similar to cross-coupled transistor $M_{N3}$ 2402 and cross-coupled transistor $M_{N4}$ 2404 of FIG. 24). The gate of cross-coupled transistor $M_{N3}$ 2502 is coupled to the differential output node $v_{outp}$, and the gate of cross-coupled transistor $M_{N4}$ 2504 is coupled to differential output node $v_{outn}$. Drains of cross-coupled transistor $M_{N3}$ 2502 and cross-coupled transistor $M_{N4}$ 2504 are coupled to the differential output nodes $v_{outn}$ and $v_{outp}$ respectively. Sources of cross-coupled transistor $M_{N3}$ 2502 and cross-coupled transistor $M_{N4}$ 2504 are coupled to the drains of transistor $M_{NB1}$ 2506 and transistor $M_{NB2}$ 2508. The gates of transistor $M_{NB1}$ 2506 and transistor $M_{NB2}$ 2508 are driven by bias voltage $V_{Bgn}$. The gain booster circuit 2500 can be used for CM control.

Figure 26:
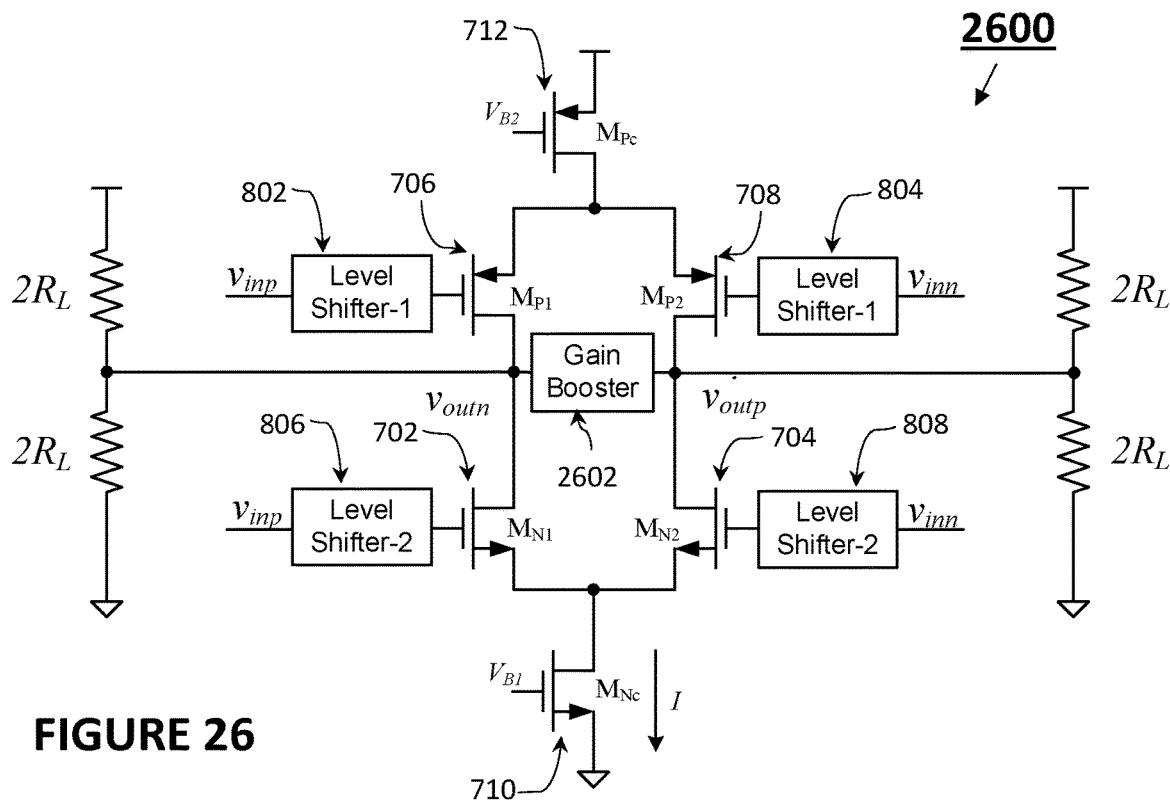
FIGS. 26-30 show various exemplary open-loop amplifiers, according to some embodiments of the disclosure.

FIG. 26 shows an open-loop amplifier 2600 where gain boosting is employed. Open-loop amplifier 2600 is based on the open-loop amplifier 1100 of FIG. 11 (having a push-pull circuit structure). Load resistors are provided in a similar fashion to FIGS. 20 and 21 at the differential output nodes $v_{outn}$ and $v_{outp}$. The gain booster circuit 2602 can be coupled to the differential output nodes $v_{outn}$ and $v_{outp}$, and can be implemented based on the gain booster circuits described herein.

Figure 27:
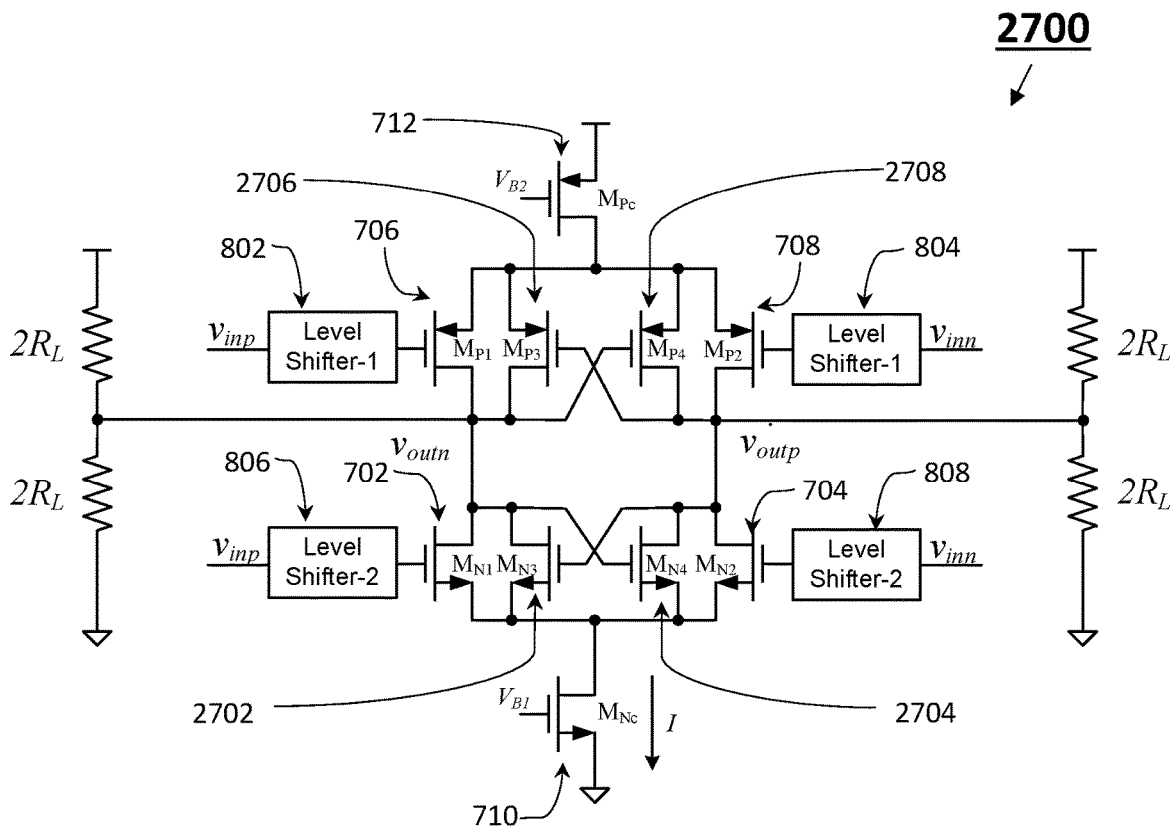

FIG. 27 shows an open-loop amplifier 2700 with an illustrative implementation of the gain booster circuit 2602 seen in FIG. 26. The gain booster circuit comprises cross-coupled transistor $M_{N3}$ 2702 and cross-coupled transistor $M_{N4}$ 2704 (e.g., N MOS transistors). The gate of cross-coupled transistor $M_{N3}$ 2702 is coupled to the differential output node $v_{outp}$, and the gate of cross-coupled transistor $M_{N4}$ 2704 is coupled to differential output node $v_{outn}$. Drains of cross-coupled transistor $M_{N3}$ 2702 and cross-coupled transistor $M_{N4}$ 2704 are coupled to the differential output nodes $v_{outn}$ and $v_{outp}$ respectively. Sources of cross-coupled transistor $M_{N3}$ 2702 and cross-coupled transistor $M_{N4}$ 2704 are coupled to the drain of transistor $M_{Nc}$ 710 serving as a current source. The gain booster circuit further comprises cross-coupled transistor $M_{P3}$ 2706 and cross-coupled transistor $M_{P4}$ 2708 (e.g., PMOS transistors). The gate of cross-coupled transistor $M_{P3}$ 2706 is coupled to the differential output node $v_{outp}$, and the gate of cross-coupled transistor $M_{P4}$ 2708 is coupled to differential output node $v_{outn}$. Drains of cross-coupled transistor $M_{P3}$ 2706 and cross-coupled transistor $M_{P4}$ 2708 are coupled to the differential output nodes $v_{outn}$ and $v_{outp}$ respectively. Sources of cross-coupled transistor $M_{P3}$ 2706 and cross-coupled transistor $M_{P4}$ 2708 are coupled to the drain of transistor $M_{Pc}$ 712 serving as a current source. The widths and lengths of the cross-coupled transistor $M_{N4}$ 2704, cross-coupled transistor $M_{N4}$ 2404, cross-coupled transistor $M_{P3}$ 2706, and cross-coupled transistor $M_{P4}$ 2708 are much smaller than the input transistor $M_{N1}$ 702, input transistor $M_{N2}$ 704, input transistor $M_{P1}$ 706, and input transistor $M_{P2}$ 708.

Variations on the Open-Loop Amplifier

Figure 28:
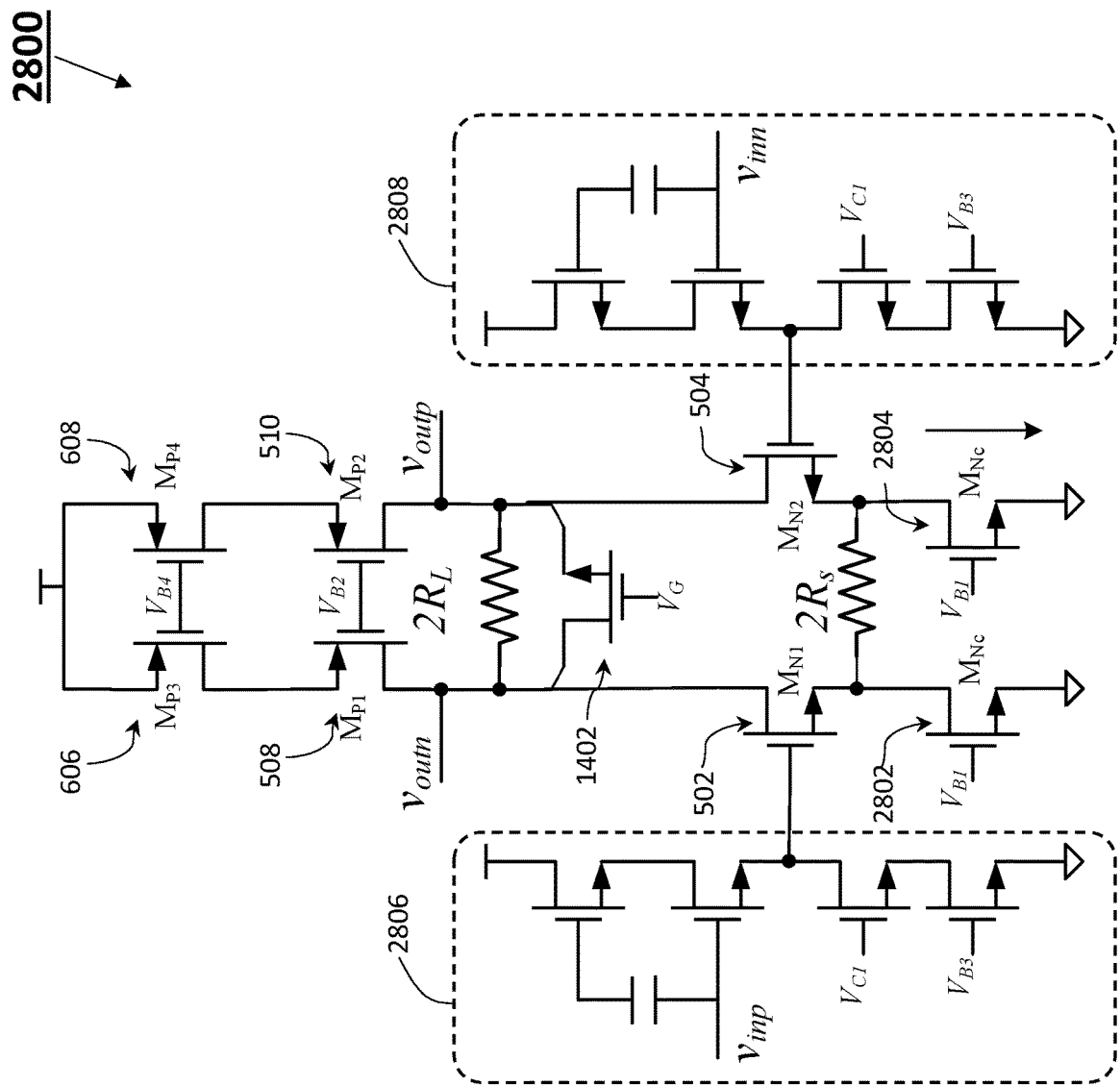

FIG. 28 shows an exemplary open-loop amplifier 2800, which includes some modifications to the open-loop amplifier 1500 of FIG. 15, according to some embodiments of the disclosure. One modification includes source degeneration, e.g., splitting the transistor $M_{Nc}$ 506 serving as a current source in FIG. 15 into two transistors $M_{Nc}$ 2802 and $M_{Nc}$ 2804 (each providing current I/2). Transistors $M_{Nc}$ 2802 and $M_{Nc}$ 2804 can be NMOS transistors. In this example, the sources of input transistors $M_{N1}$ 502 and $M_{N2}$ 504 are connected to respective drains of $M_{Nc}$ 2802 and $M_{Nc}$ 2804. Gates of transistors $M_{Nc}$ 2802 and $M_{Nc}$ 2804 can be driven by bias voltage $V_{B1}$. In a similar fashion to FIG. 16, a resistor $2R_d$ (for source degeneration) is coupled across the sources of input transistor $M_{N1}$ 502 and input transistor $M_{N2}$ 504. Another modification includes buffering the differential inputs $v_{inp}$ and $v_{inn}$ with source followers 2806 and 2808 respectively, before providing the buffered differential inputs to the gates of input transistors $M_{N1}$ 502 and $M_{N2}$ 504.

Figure 29:
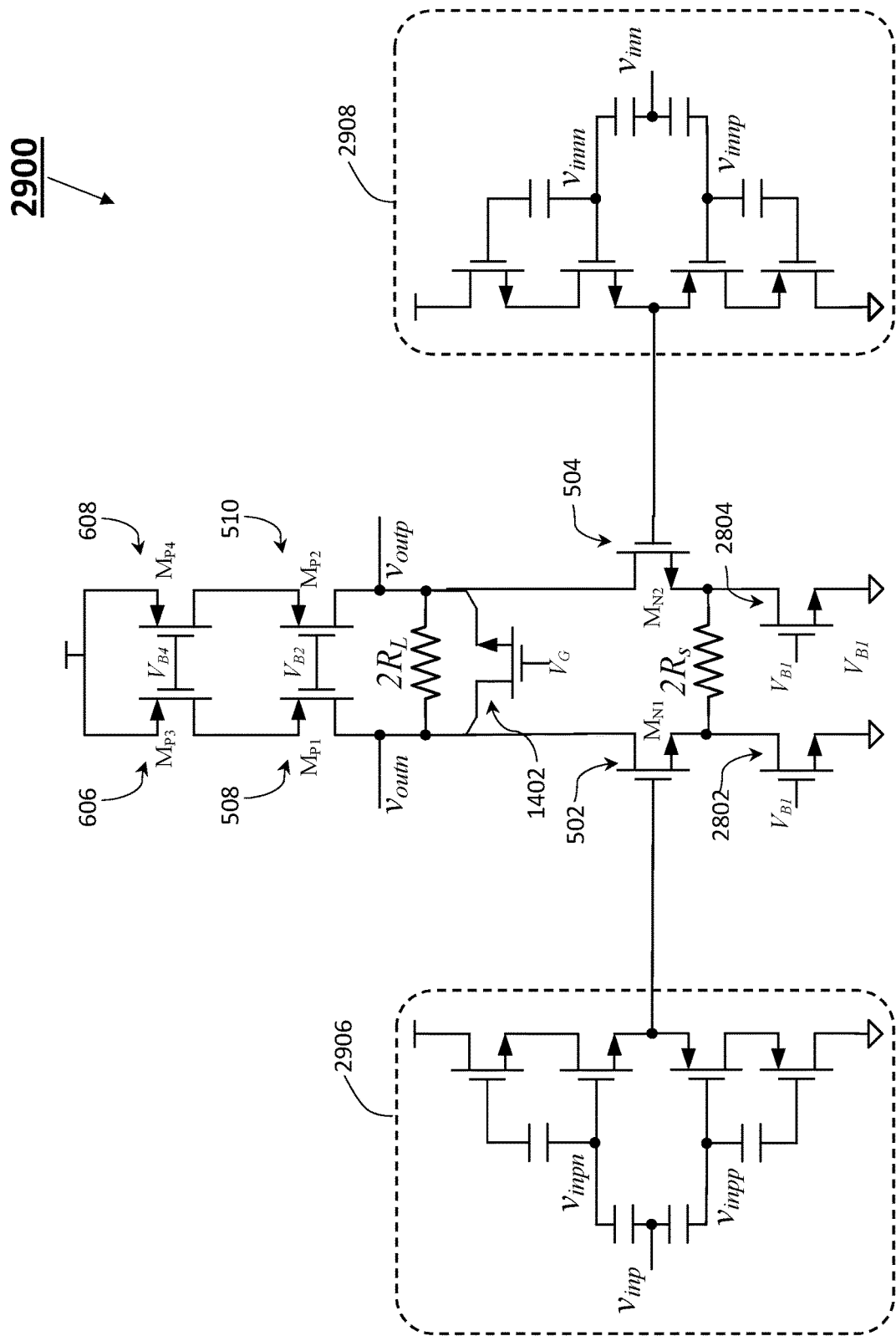

FIG. 29 shows an exemplary open-loop amplifier 2900, which includes some modifications to the open-loop amplifier 2800 of FIG. 28, according to some embodiments of the disclosure. Source followers 2806 and 2808 of FIG. 28 are replaced by push-pull source followers 2906 and 2908 respectively for buffering the differential inputs $v_{inp}$ and $v_{inn}$ before providing the buffered differential inputs to the gates of input transistors $M_{N1}$ 502 and $M_{N2}$ 504.

Figure 30:
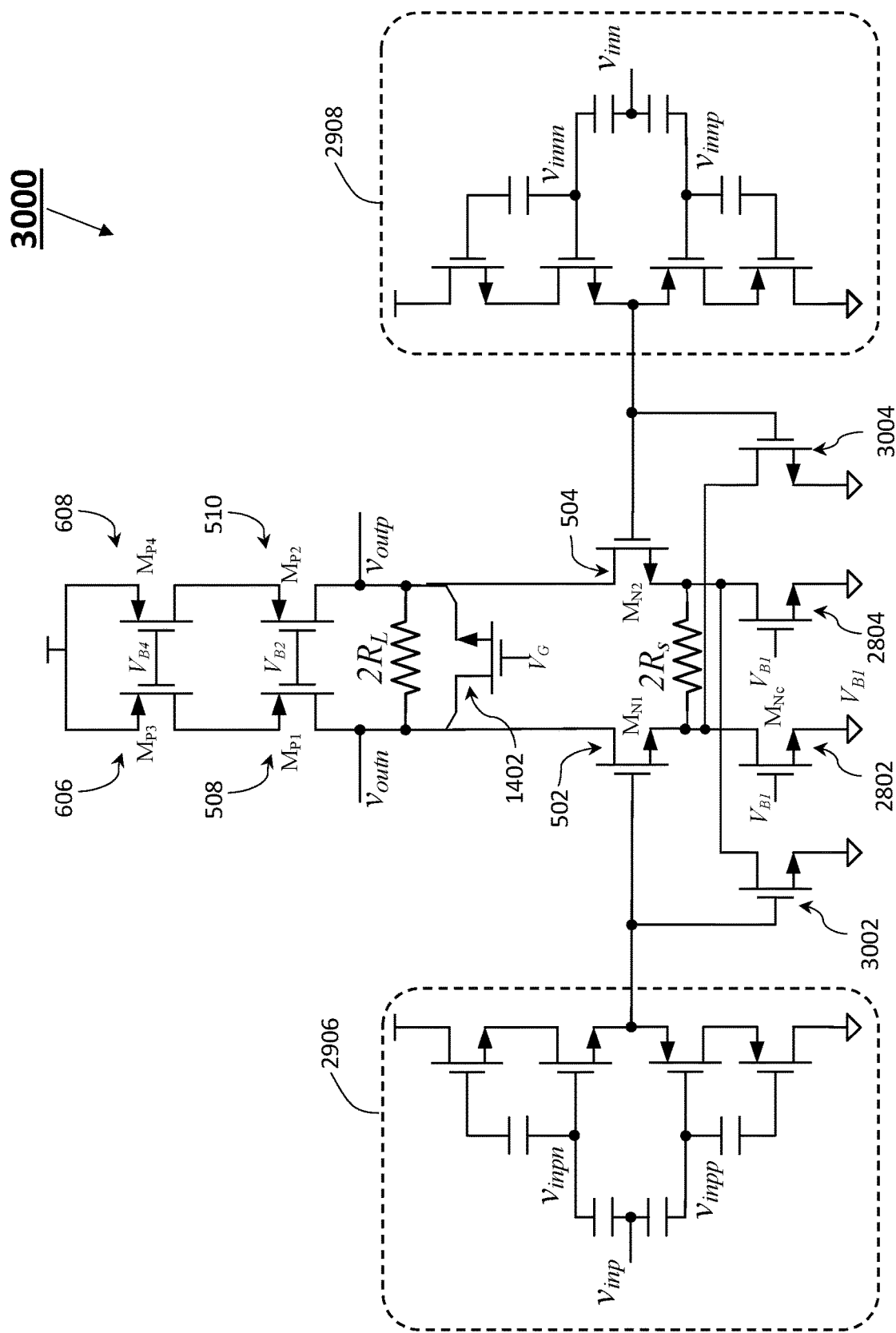

FIG. 30 shows an exemplary open-loop amplifier 3000, which includes some modifications to the open-loop amplifier 2900 of FIG. 29, according to some embodiments of the disclosure. Cross-coupled transistors 3002 and 3004 (e.g., NMOS transistors) are added. The gate of cross-coupled transistor 3002 is coupled to the gate of input transistor $M_{N1}$ 502. The drain of cross-coupled transistor 3002 is coupled to the source of input transistor $M_{N2}$ 504. The gate of cross-coupled transistor 3004 is coupled to the gate of input transistor $M_{N2}$ 504. The drain of cross-coupled transistor 3004 is coupled to the source of input transistor $M_{N1}$ 502.

Analog Tracking Circuits for Driving Load Transistor

In some embodiments, NMOS/PMOS transistor device(s) operating in the linear region can be provided across the differential output nodes of a main open-loop amplifier circuit, as seen in examples illustrated in FIGS. 11-15, and 28-30. An analog tracking circuit can be provided to generate the gate voltage, e.g., $V_G$, to drive the load transistor. NMOS/PMOS transistor device as load with analog tracking control for the gate voltages of the NMOS/PMOS transistor device $V_G$ has benefits for distortion cancellation, and can be applied to all open-loop amplifier circuits described herein. Analog tracking circuits being able to track for variations can linearize the open-loop amplifier and ensure good performance. Analog tracking circuits are be particularly beneficial for linearizing and improving the performance of open-loop amplifiers (e.g., even open-loop amplifiers used as variable gain amplifiers), which (may or) may not have available calibrations for linearizing the open-loop amplifiers.

Ideally, the gate voltage $V_G$ is a sum of the gate-to-source voltage of a transistor device $V_{GS}$ and the ideal CM voltage $V_{CM}$, and such a gate voltage would ensure the NMOS/PMOS transistor operating as a load is operating in the linear region. However, the ideal gate-to-source voltage of a transistor device $V_{GS}$ for operating the load transistor in the linear region can vary over one or more of the following: process, temperature, and voltage, and other factors. Factors can include: voltage across transistors in the main open-loop amplifier circuit, transconductance/resistance of transistors in the main open-loop amplifier circuit, gain settings of the main open-loop amplifier circuit, and settings of bias currents in the main open-loop amplifier circuit. An analog tracking circuit can ensure that the gate-to-source voltage of a transistor device $V_{GS}$ for operating the load transistor in the linear region and the resulting gate voltage gate voltage $V_G$ are controlled accordingly.

Figure 31:
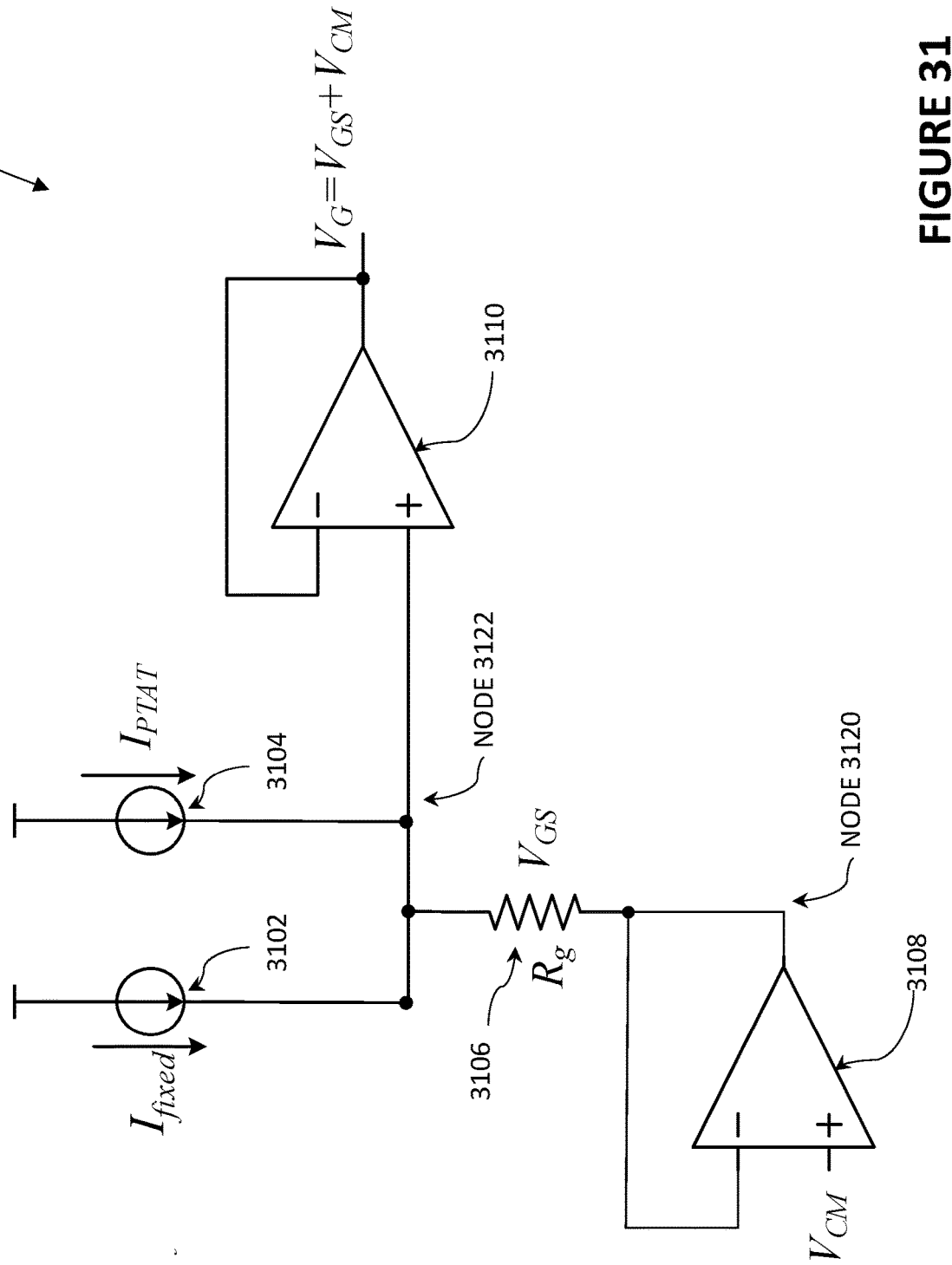
FIGS. 31-32 show exemplary analog tracking circuits for generating a gate voltage $V_G$ for driving a gate of a load transistor, according to some embodiments of the disclosure.

FIG. 31 shows an exemplary analog tracking circuit 3100 for generating a gate voltage $V_G$ for driving a gate of a load transistor, according to some embodiments of the disclosure. The analog tracking circuit 3100 can be used to perform analog tracking for temperature, and adjusts the gate voltage for driving an NMOS/PMOS load transistor device accordingly. The analog tracking circuit 3100 comprises a first current source 3102, a second current source 3104, a first operational amplifier (opamp) 3108, a second opamp 3110, and a resistor $R_g$ 3106. The first current source 3102 has a fixed current $I_{fixed}$, which does not change with temperature. The second current source 3104 has a variable current $I_{PTAT}$, which is proportional to an absolute temperature of the circuit. The first opamp 3108 is in a negative feedback configuration, where the first opamp 3108 receives an (ideal) CM voltage at the noninverting input, and receives the output of the first opamp 3108 (labeled node 3120) at the inverting input. As a result, the voltage at the output of the first opamp 3108 at node 3120 follows the voltage at the noninverting input, $V_{CM}$. The voltage at node 3122 is a sum of the voltage across the resistor $R_g$ 3106 (labeled as $V_{GS}$) and the voltage of node 3120 (which is $V_{CM}$). The voltage across the resistor $R_g$ 3106 (labeled as $V_{GS}$) is based on the current through the first current source 3102 and second current source 3104. As a result, the voltage across the resistor $R_g$ 3106 (labeled as $V_{GS}$) can track over temperature due to the second current source 3104 having a variable current $I_{PTAT}$. The second opamp 3110 is also a negative feedback configuration, where the second opamp 3110 receives a voltage at node 3122 at the noninverting input, and receives the output of the second opamp 3110 at the inverting input. As a result, the voltage at the output of the second opamp 3110 follows the voltage at the noninverting input, i.e., $V_{GS}+V_{CM}$, and can be used as a gate voltage $V_G$ for driving an NMOS/PMOS transistor serving as a load.

In some cases, the analog tracking circuit 3100 can be modified to perform track changes in the bias current setting in the main open-loop amplifier circuit. The bias current setting is used in changing the gain of the main open-loop amplifier by modifying the amount of current flowing through the current source(s) in the main open-loop amplifier. The modification may include changing the biasing of analog tracking circuit 3100 based on each setting of the bias current in the main open-loop amplifier circuit. For example, the settings for current $I_{fixed}$ and/or current $I_{PTAT}$ can be adjusted based on the bias current setting in the main open-loop amplifier circuit. In another example, the analog tracking circuit can include an additional variable current source coupled to node 3122, which can vary based on the setting of the bias current in the main open-loop amplifier circuit. As a result, the current through resistor $R_g$ 3106, thus the voltage across the resistor $V_{GS}$, can track gain changes in the main open-loop amplifier circuit.

Figure 32:
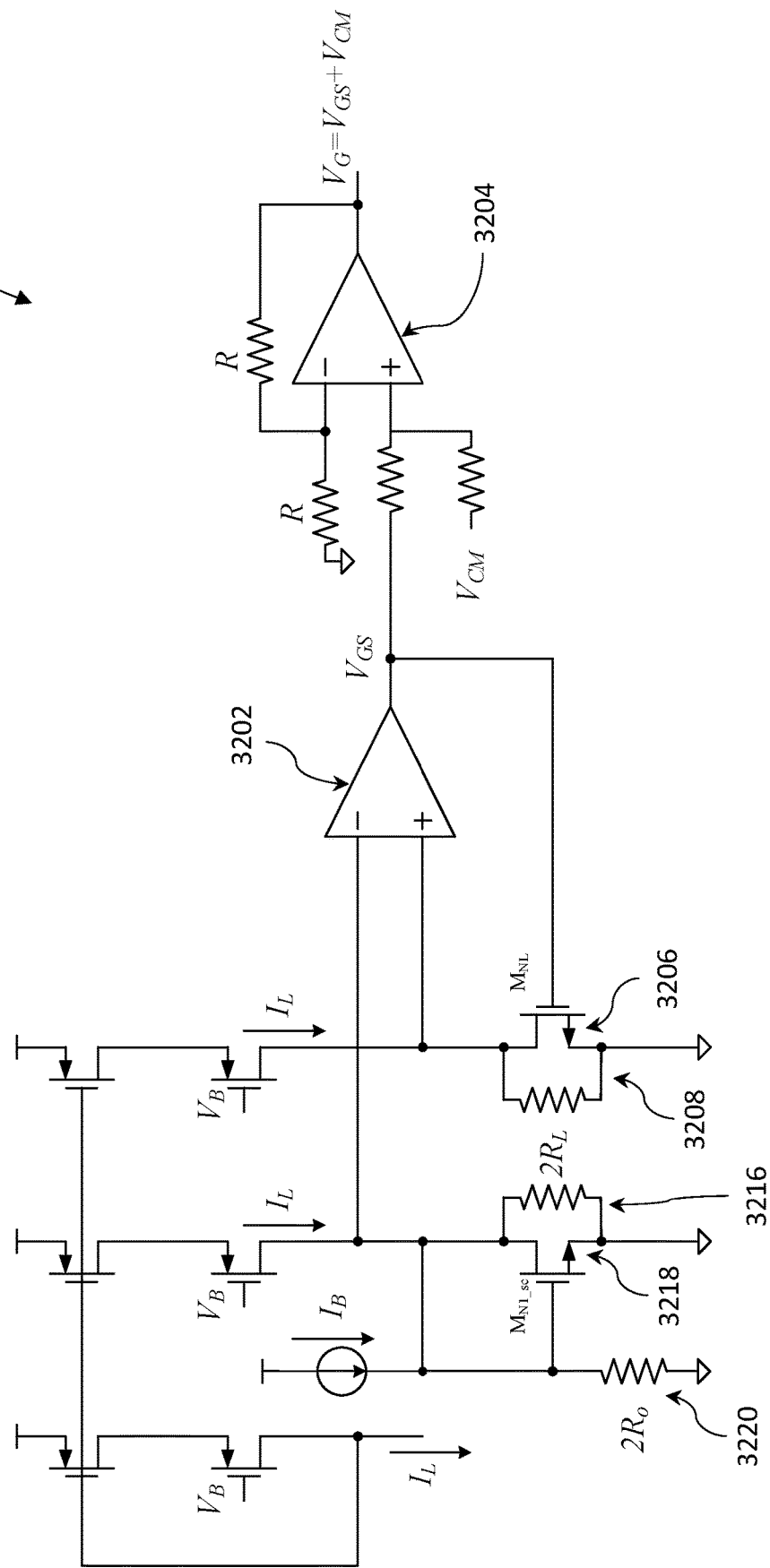

FIG. 32 shows an exemplary analog tracking circuit 3200 for generating a gate voltage $V_G$ for driving a gate of a load transistor of a main open-loop amplifier, according to some embodiments of the disclosure. The analog tracking circuit 3200 can track various changes in the main open-loop amplifier, including changes in the bias current settings (i.e., gain) in the main open-loop amplifier circuit. The analog tracking circuit 3200 includes a first opamp 3202 and a second opamp 3204. The first opamp 3202 is used to generate voltage $V_{GS}$. The first opamp 3202 operates to equalize the voltage at the inverting input and the noninverting input of the first opamp 3202 and derive the optimum gate-to-source voltage $V_{GS}$. At the noninverting input, a load current $I_L$ (e.g., a maximum current that flows through the load of the main open-loop amplifier) flows through a first replica load circuit including transistor $M_{NL}$ 3206 and resistor 3208 (provided in parallel). The first replica load circuit can replicate a load transistor and a load resistor of the main open-loop amplifier (e.g., as seen in FIGS. 13-15 and 28-30). The output of the first opamp 3202 $V_{GS}$ drives the gate of the transistor $M_{NL}$ 3206 of the first replica circuit. The circuitry at the noninverting input tracks a voltage across the load devices (e.g., voltage/transconductance/resistance across the load devices). At the inverting input, a load current $I_L$ and flows through a second replica circuit including transistor $M_{N1\_sc}$ 3218 and resistor 3216 (provided in parallel). The transistor in the second replica circuit replicates an input transistor of the main open-loop amplifier (e.g., transistors labeled $M_{N1}$ in the FIGURES), and can be a scaled version of the input transistor. The circuitry at the inverting input is thus tracking a voltage across an input transistor. The circuitry at the inverting input is also tracking a bias current $I_B$ (bias current setting of the main open-loop amplifier) and temperature/thermal variation through resistor $2R_0$ 3220. The circuitry at the inverting input is thus tracking a voltage across an input transistor (e.g., voltage/transconductance/resistance across the input resistor), a bias current setting of the main open-loop amplifier, and temperature/thermal variation. Through the feedback mechanism of the first opamp 3202 (i.e., using the output of the first opamp 3202 to drive the gate of transistor $M_{NL}$ 3206), the first opamp 3202 can derive an optimum gate-to-source voltage $V_{GS}$ for operating the load transistor in the main open-loop amplifier circuit. The second opamp 3204 is in a negative feedback configuration and a summing point of voltages $V_{GS}$ and $V_{CM}$ is connected to the noninverting input of the opamp. The voltage at the output of the second opamp 3204 follows the noninverting input, i.e., $V_{GS}+V_{CM}$, and the second opamp 3204 operates as a noninverting summing amplifier (or voltage adder) to produce an output that is representative to (or proportional to) a positive sum of the voltages $V_{GS}$ and $V_{CM}$. The voltage at the output of the second opamp 3110 can be used as a gate voltage $V_G$ for driving an NMOS/PMOS transistor serving as a load, and be used as a gate voltage $V_G$ for driving an NMOS/PMOS transistor serving as a load.

Dither Injection and Amplifier Calibration

Ability to calibrate the non-linearity of the open-loop amplifier structure, if needed, can be important. There are several methods to calibrate the non-linearity, some of which can rely on injecting calibration dither and using the correlations and/or histograms/counts based on open intervals defined at certain inspection points (thresholds or values that define open intervals of a signal) to estimate the transfer characteristic's non-linearity. In those algorithms, the input signal, which can be composed of the ADC input signal plus an internally generated linearization (large) dither signal, helps to traverse the amplifier's transfer characteristics. The calibration dither is used to detect the non-linearity, which causes the response when the dither is positive to be different from when the dither is negative.

Figure 33:
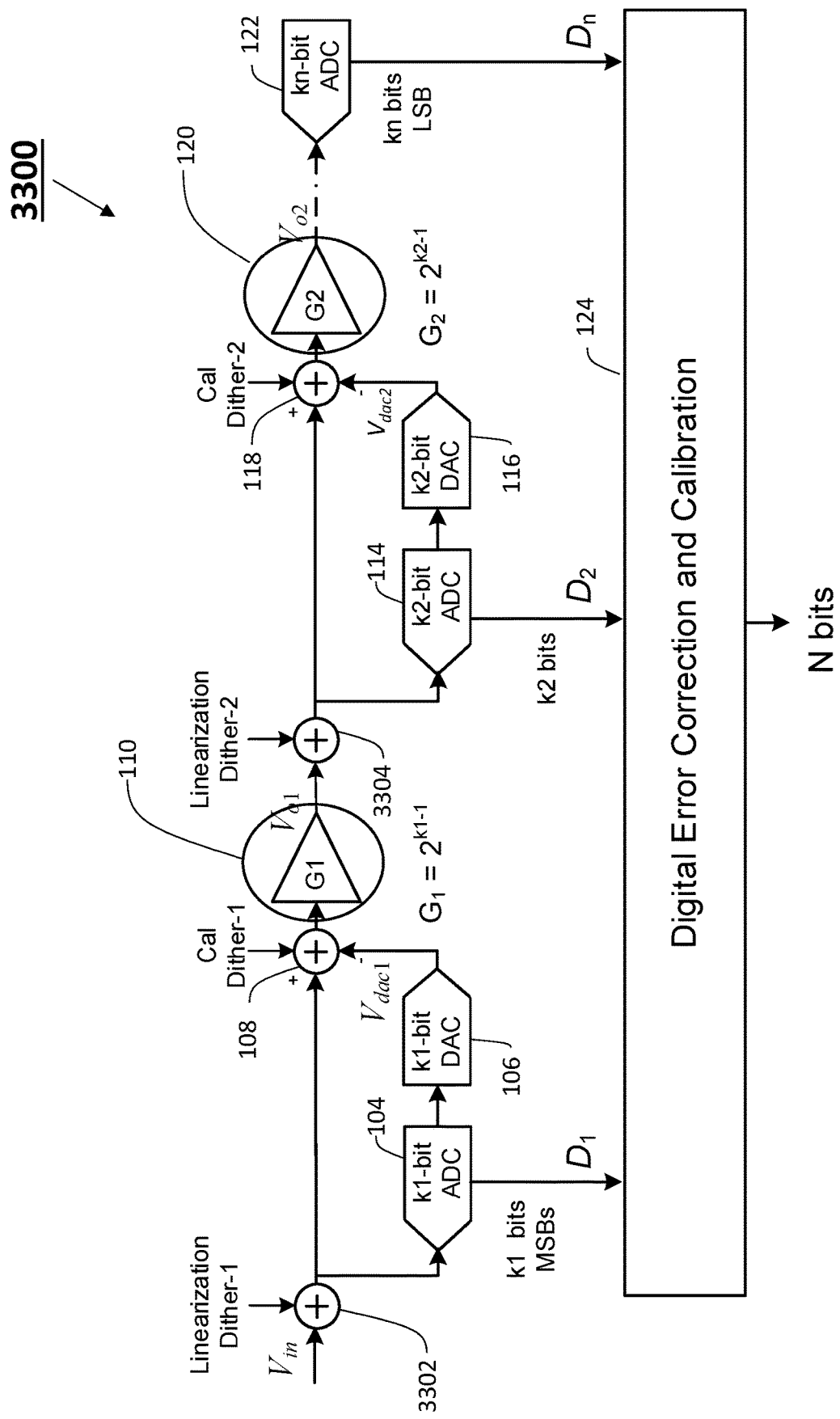
FIG. 33 shows a block diagram of a pipelined ADC with dither signals injected into the signal paths, according to some embodiments of the disclosure.

FIG. 33 shows a block diagram of a pipelined ADC with dither signals injected into the signal paths, according to some embodiments of the disclosure. The dither signals can be used for inter-stage gain and non-linear calibration. The pipelined ADC 3300 is based on the pipelined ADC 100, but with a few modifications. Linearization (large) dither signal ("Linearization Dither-1") can be injected to the analog input $V_{in}$ by summation node 3302. The linearization dither signal, e.g., the one injected at the input of stage-1, can de-sensitize the calibration against dependence on the input signal (making the calibrations input signal independent). Optionally, there can be an open-loop amplifier serving as the sampler buffer or amplifier for the analog input $V_{in}$. Linearization (large) dither signal ("Linearization Dither-2") can be injected to the amplified residue $V_{o1}$ by summation node 3304. The linearization dither signal injected at the input of stage-2 can de-sensitize the non-linear calibration of stage-1 against the non-idealities/non-linearity of the back-end stages. The linearization dither signals can be injected in both the MDAC and flash ADC of stages 1 and 2. Calibration dither signal ("Cal Dither-1") can be injected by summation node 108 to detect or expose non-linearity of the amplifier 110. Calibration dither signal ("Cal Dither-2") can be injected by summation node 118 to detect or expose non-linearity of the amplifier 120. The calibration dither signals ("Cal Dither-1" and "Cal Dither-2") can be injected in the MDAC only and can be used for the calibration of gain error and non-linearity of the respective stages (stage-1 and stage-2).

Figure 34:
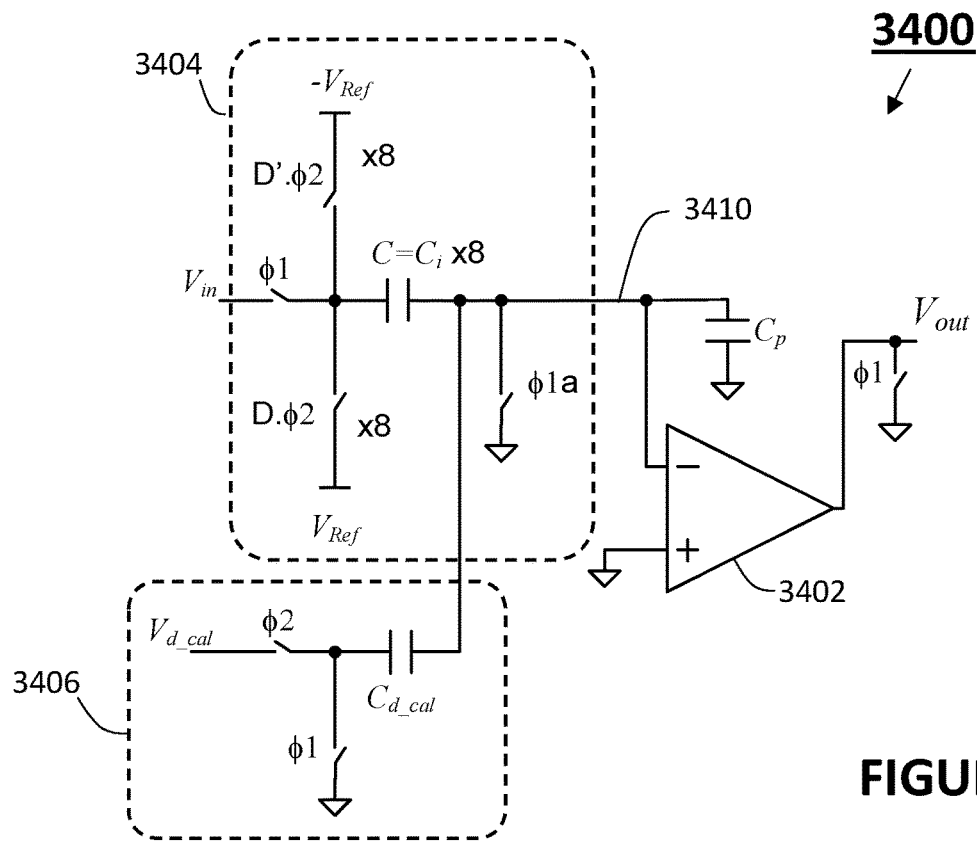
FIG. 34 illustrates calibration dither injection for non-linear calibration of an amplifier, according to some embodiments of the disclosure.

FIG. 34 illustrates calibration dither injection for non-linear calibration of an amplifier, according to some embodiments of the disclosure. Although only a simplified single-ended circuit is shown, it is understood that the circuit can be implemented in a differential manner. MDAC circuit structure 3400 (similar to the MDAC circuit structure 300 of FIG. 3) includes open-loop amplifier 3402 (e.g., a suitable open-loop amplifier described herein), and switched capacitor circuitry 3404 which can perform sampling and DAC operations. The switched capacitor circuitry 3404 has a number of capacitors C to serve as sampling capacitors and as the DAC capacitors of the MDAC circuit structure 3400. In this exemplary switched capacitor circuitry 3404, there are 8 capacitors. The number of capacitors depend on how many bits the ADC of the stage generates as the output code D (the ADC of the stage is not shown in the FIGURE). One plate (bottom plate) of each capacitor is connected together at a common node. The common node is at the inverting input of the open-loop amplifier 3402. The common node serves as the summation node 3410 of the MDAC circuit structure 3400. During sampling phase (denoted by φ1), switched capacitor circuitry 3404 samples the input $V_{in}$ onto capacitors C. During hold phase (denoted by φ2), switched capacitor circuitry 3404 selectively connects (top) plates of the capacitors C of the switched capacitor circuitry 3404 to either the positive voltage reference $V_{Ref}$ or $-V_{Ref}$ based on an output code D from an ADC of the stage. As a result, a residue signal is generated, and the residue signal is present at summation node 3410. During hold phase, the (open-loop) amplifier 3402 performs amplification and generates an amplified residue $V_{out}$.

MDAC circuit structure 3400 further includes switched capacitor circuitry 3406 for calibration dither injection. Specifically, switched capacitor circuitry 3406 injects charge into the switched capacitor circuitry 3404 based on the calibration dither voltage $V_{d\_cal}$. As a result, a calibration dither signal is added in the MDAC circuit structure 3400. The switched capacitor circuitry 3406 includes a dither capacitor $C_{d\_cal}$. A first plate of the dither capacitor $C_{d\_cal}$ is connected to the summation node 3410 of the MDAC circuit structure 3400. During sampling phase, a second plate of the dither capacitor $C_{d\_cal}$ is connected to ground. During hold phase, the second plate of the dither capacitor $C_{d\_cal}$ is connected to the calibration dither voltage $V_{d\_cal}$ to inject an amount of charge to the summation node 3410 that is representative of the calibration dither. Accordingly, the (open-loop) amplifier 3402 amplifies a signal at the summation node 3410, which includes the residue signal and the calibration dither. The calibration dither can be used to calibrate the (open-loop) amplifier 3402.

Figure 35:
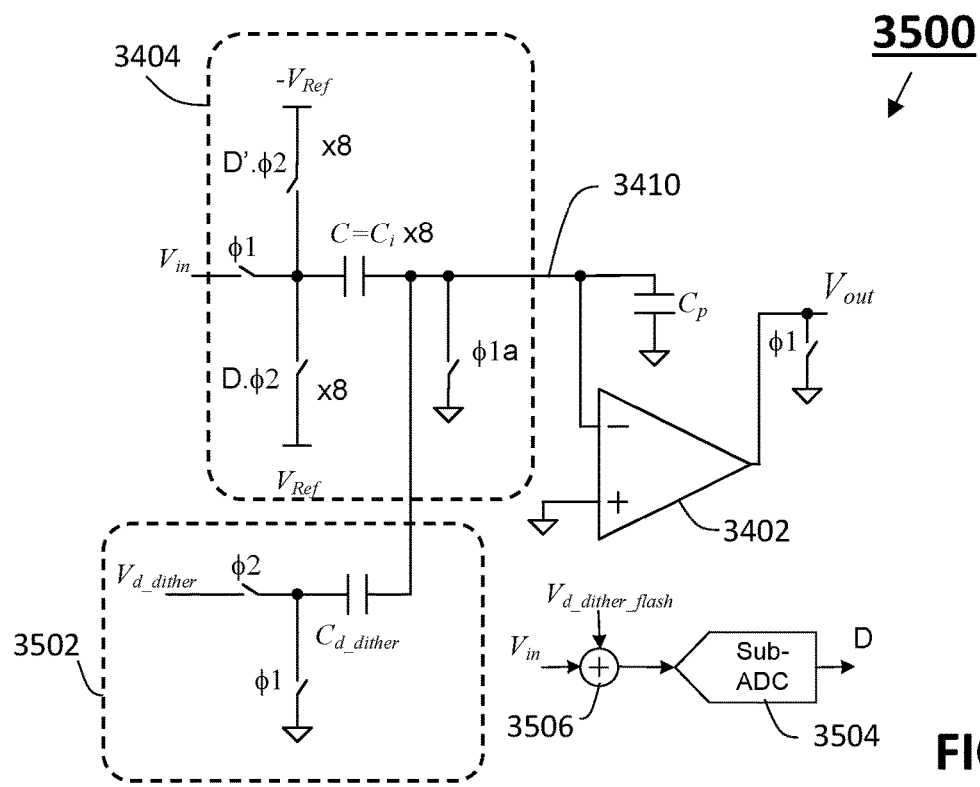
FIG. 35 illustrates linearization dither injection for de-sensitizing calibration against the input signal distribution, according to some embodiments of the disclosure.

FIG. 35 illustrates linearization dither injection for de-sensitizing calibration against, e.g., the input signal distribution, according to some embodiments of the disclosure. Although only a simplified single-ended circuit is shown, it is understood that the circuit can be implemented in a differential manner. Circuitry 3500 includes MDAC circuit structure (similar to the MDAC circuit structure 3400 of FIG. 34) and sub-ADC (flash ADC) 3504 of the stage. The MDAC circuit structure includes open-loop amplifier 3402 (e.g., a suitable open-loop amplifier described herein), and switched capacitor circuitry 3404 which can perform sampling and DAC operations. MDAC circuit structure further includes switched capacitor circuitry 3502 for linearization dither injection. Specifically, switched capacitor circuitry 3502 can inject charge into the switched capacitor circuitry 3404 based on the linearization dither voltage $V_{d\_dither}$. The switched capacitor circuitry 3502 includes a dither capacitor $C_{d\_dither}$. A first plate of the dither capacitor $C_{d\_dither}$ is connected to the summation node 3410 of the MDAC circuit structure. During sampling phase, a second plate of the dither capacitor $C_{d\_dither}$ is connected to ground. During hold phase, the second plate of the dither capacitor $C_{d\_dither}$ is connected to the calibration dither voltage $V_{d\_dither}$ to inject an amount of charge to the summation node 3410 that is representative of the linearization dither. Accordingly, the (open-loop) amplifier 3402 amplifies a signal at the summation node 3410, which includes the residue signal and the linearization dither. Furthermore, linearization dither signal $V_{d\_dither\_flash}$ can be injected to the analog input $V_{in}$ by summation node 3506 that is at the input of the sub-ADC 3504. This means that the output code D from the sub-ADC 3504 of the stage is representative of the analog input $V_{in}$ and the linearization dither injected at summation node 3506. In some cases, the linearization dither can be injected digitally at the output of the sub-ADC 3504. $V_{d\_dither\_flash}$ can be equal to $V_{d\_dither} \times C_{d\_dither}/C$. As a result, linearization dither signals can be injected in both the MDAC and flash ADC. The linearization signal can be used to make the calibrations independent of the input signal and/or input signal distribution.

Figure 36:
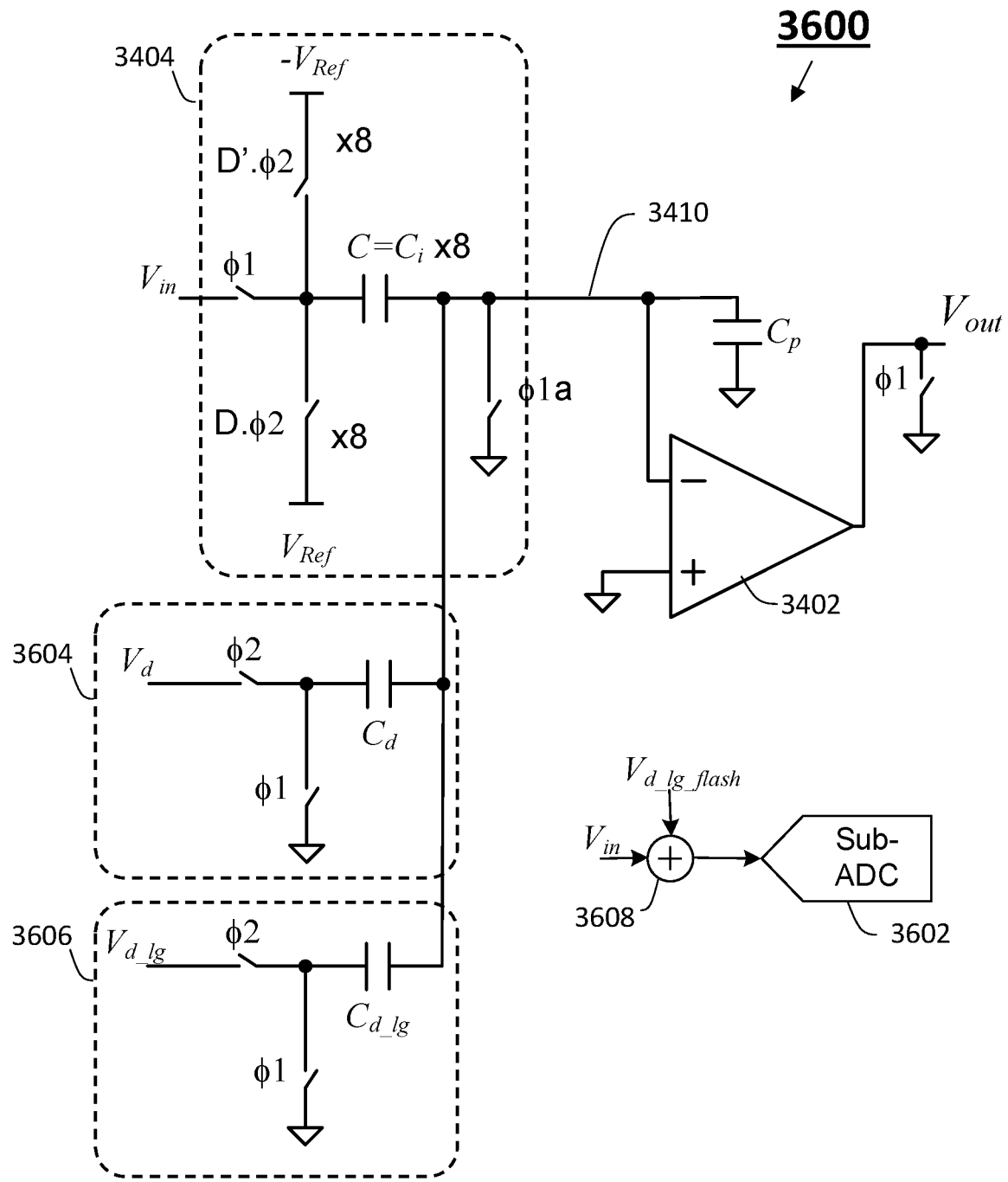
FIG. 36 illustrates injection of both calibration and linearization dither injection, according to some embodiments of the disclosure.

FIG. 36 illustrates injection of both calibration and linearization dither injection, according to some embodiments of the disclosure. Circuitry 3600 includes MDAC circuit structure (similar to the MDAC circuit structure 3400 of FIG. 34) and sub-ADC (flash ADC) 3602. The MDAC circuit structure includes open-loop amplifier 3402 (e.g., a suitable open-loop amplifier described herein), and switched capacitor circuitry 3404 which can perform sampling and DAC operations. MDAC circuit structure further includes switched capacitor circuitry 3604 for calibration dither injection. Specifically, switched capacitor circuitry 3604 injects charge into the switched capacitor circuitry 3404 based on the calibration dither voltage $V_d$. As a result, a calibration dither signal is added in the MDAC circuit structure. The switched capacitor circuitry 3604 is similar to the switched capacitor circuitry 3406 of FIG. 34. MDAC circuit structure further includes switched capacitor circuitry 3606 for linearization dither injection. Both switched capacitor circuitry 3604 and switched capacitor circuitry 3606 are connected to summation node 3410. Specifically, switched capacitor circuitry 3606 can inject charge into the switched capacitor circuitry 3404 based on the linearization dither voltage $V_{d\_Ig}$. Furthermore, linearization dither signal $V_{d\_Ig\_flash}$ can be injected to the analog input $V_{in}$ by summation node 3608 that is at the input of the sub-ADC 3602. $V_{d\_Ig\_flash}$ can be equal to $V_{d\_Ig} \times C_{d\_Ig}/C$. As a result, linearization dither signals can be injected in both the MDAC and flash ADC. The switched capacitor circuitry 3606 is similar to the switched capacitor circuitry 3502. The summation node 3608 and sub-ADC 3602 are similar to summation node 3506 and sub-ADC 3504 of FIG. 35.

Figure 37:
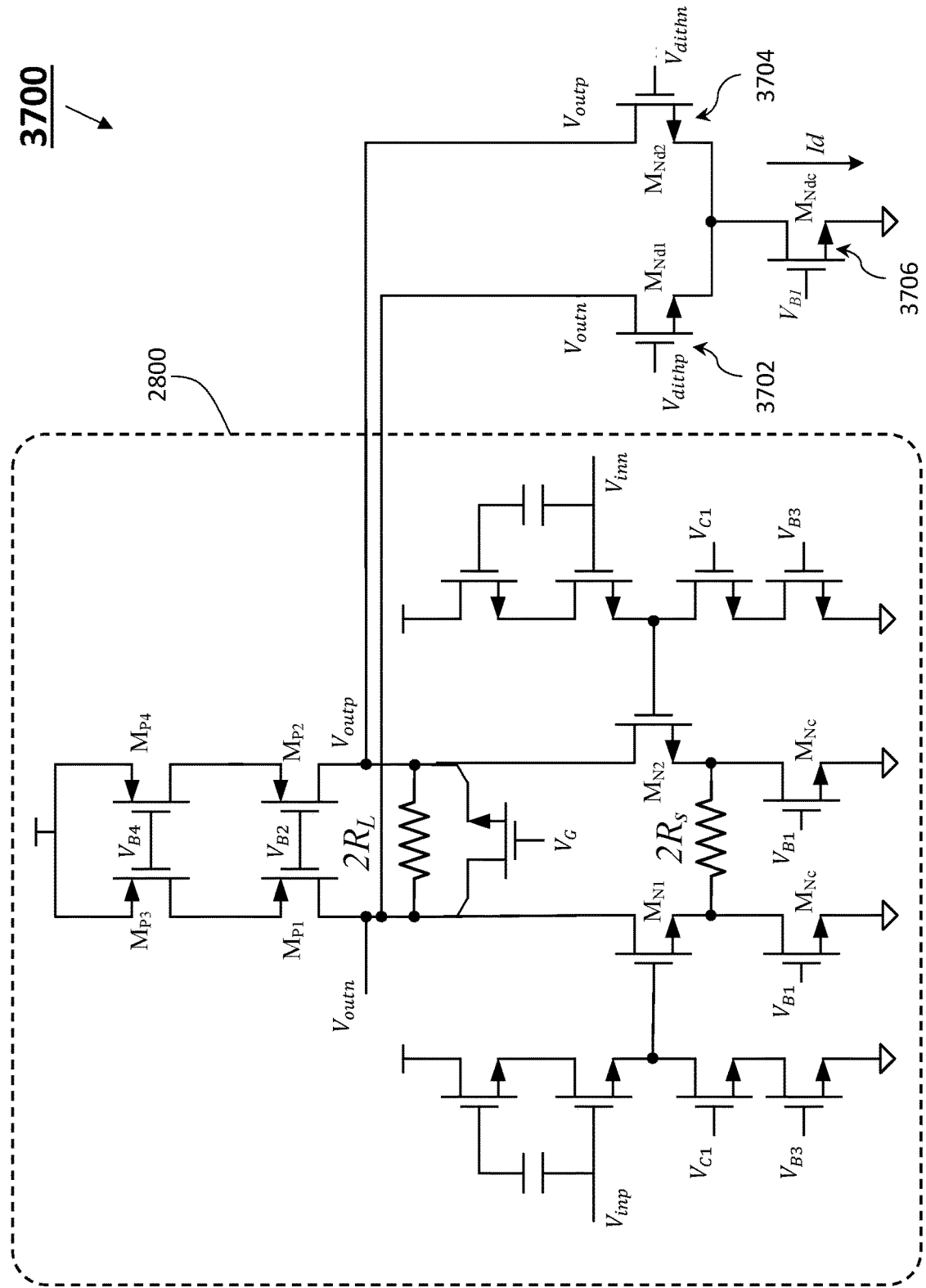
FIG. 37 illustrates injection of calibration dither injection, according to some embodiments of the disclosure.

FIG. 37 illustrates injection of calibration dither injection in open-loop amplifier 3700, according to some embodiments of the disclosure. In this example, the calibration dither signal (e.g., 1-bit dither signal) can be injected in the open-loop amplifier, e.g., at the differential output nodes $v_{outn}$ and $v_{outp}$, and the calibration dither signal can be used for calibrating the open-loop amplifier. Non-linearity can be dominant at the output of the open-loop amplifier, and such calibration dither injection at the output of the open-loop amplifier can expose the non-linearities (e.g., compression). The open-loop amplifier 3700 is based on open-loop amplifier 2800 is shown, but it is understood that other open-loop amplifiers described herein can have such a dither injected at the differential output nodes $v_{outn}$ and $v_{outp}$ in the manner illustrated by FIG. 37. The dither injection circuitry includes a differential pair of dither transistors $M_{Nd1}$ 3702 and $M_{Nd2}$ 3704 (e.g., NMOS transistors) and a current source transistor $M_{Ndc}$ 3706 (e.g., NMOS transistor). The current source transistor $M_{Ndc}$ 3706 is biased to supply current $I_d$ for the dither injection circuitry. The drains of dither transistors $M_{Nd1}$ 3702 and $M_{Nd2}$ 3704 are coupled to the differential output nodes $v_{outn}$ and $v_{outp}$, respectively. The differential pair of dither transistors $M_{Nd1}$ 3702 and $M_{Nd2}$ 3704 are in a common source configuration, and their sources are coupled to the drain of the current source transistor $M_{Ndc}$ 3706. Gates of the dither transistors $M_{Nd1}$ 3702 and $M_{Nd2}$ 3704 are driven/controlled by the 1-bit dither signal, e.g., differential dither signals $V_{dithp}$ and $V_{dithn}$ respectively. An amount of current $I_d$ is injected/steered (differentially) to the differential output nodes $v_{outn}$ and $v_{outp}$ according to the value of the 1-bit dither signal.

Calibration dither injection based on the example shown in FIG. 37 can be particularly beneficial to scenarios where the open-loop amplifier is not used in connection with switched capacitor circuitry (e.g., not used inside a track and hold circuit with switched capacitor circuitry or inside an MDAC), but as stand-alone open-loop amplifier or variable gain amplifier. While calibration dither injection in switched capacitor circuitry can be achieved (as discussed in various examples herein), but calibration dither injection for an open-loop amplifier operating as a continuous-time circuit (without switched capacitor circuitry associated with it) is not trivial. The example shown in FIG. 37 effectively allows a 1-bit calibration dither to be injected into an open-loop amplifier operating as a continuous-time circuit, so that calibration can be performed to tune the open-loop amplifier in the analog domain (e.g., adjusting currents and/or resistances) or so that calibration can be performed to digitally correct digital output data generated downstream from the open-loop amplifier. For example, an error obtained from calibration of the open-loop amplifier (e.g., gain error) using the 1-bit calibration dither can be used to tune a load transistor in the open-loop amplifier (e.g., change the gate voltage $V_G$ seen in the FIGURE).

A suitable calibration algorithm can be used to calibrate the open-loop amplifier and/or analog circuitry having non-idealities. A few exemplary MDAC circuit structures and open-loop amplifiers described herein can accommodate dither injection to achieve the required performance, regardless of the specific algorithm used. The following describes one example of a calibration algorithm which can be used to extract non-idealities of the amplifier or other non-ideal analog circuitry of interest.

In some embodiments, a histogram scheme can be used part of the calibration algorithm to count samples of an output signal based on open intervals set by symmetric inspection points to correct for second and third harmonics (e.g., HD2 and HD3). For the histogram scheme, the error at the symmetric inspection points can be defined as:

$$\varepsilon(V_{insp}) = \text{Cumsump}_{V_{insp}}(V_{out_{cal}}[n]-V_d[n])|_{Dither=V_d} - \text{Cumsump}_{V_{insp}}(V_{out_{cal}}[n]+V_d[n])|_{Dither=-V_d} \quad (6)$$

and $$\varepsilon(-V_{insp}) = \text{Cumsumn}_{-V_{insp}}(V_{out_{cal}}[n]-V_d[n])|_{Dither=V_d} - \text{Cumsumn}_{-V_{insp}}(V_{out_{cal}}[n]+V_d[n])|_{Dither=-V_d} \quad (7)$$

$V_{insp}$ is the inspection point for the HD2 and HD3 estimation, $V_d$ is the calibration dither signal injected, and $V_{out_{cal}}$ is the output (residue) voltage after calibration. The expression $\text{Cumsumn}_x(y)$ is defined as the cumulative histogram (i.e., count) of digital codes of digital signal y less than or equal to x. $\text{Cumsump}_x(y)$ is defined as the cumulative histogram (i.e., count) of digital codes of digital signal y greater than or equal to x. Accordingly, the error at the positive inspection point $\varepsilon(V_{insp})$ examines (a) the count of the output voltage after calibration and removal of the dither signal $V_d[n]$ greater than or equal to positive inspection point when the dither is positive (e.g., $\text{Cumsump}_{V_{insp}}(V_{out_{cal}}[n]-V_d[n])|_{Dither=V_d}$) and (b) the count the output voltage after calibration and removal of the dither signal $V_d[n]$ greater than or equal to positive inspection point when the dither is negative (e.g., $\text{Cumsump}_{V_{insp}}(V_{out_{cal}}[n]+V_d[n])|_{Dither=-V_d}$). Specifically, the error at the positive inspection point $\varepsilon(V_{insp})$, subtracts (a) by (b), e.g., compares the two counts. Furthermore, the error at the negative inspection point $\varepsilon(-V_{insp})$ examines (c) the count of the output voltage after calibration and removal of the dither signal $V_d[n]$ less than or equal to negative inspection point when the dither is positive (e.g., $\text{Cumsumn}_{-V_{insp}}(V_{out_{cal}}[n]-V_d[n])|_{Dither=V_d}$) and (d) the count the output voltage after calibration and removal of the dither signal $V_d[n]$ less than or equal to negative inspection point when the dither is negative (e.g., $\text{Cumsumn}_{-V_{insp}}(V_{out_{cal}}[n]+V_d[n])|_{Dither=-V_d}$). Specifically, the error at the negative inspection point $\varepsilon(-V_{insp})$, subtracts (c) by (d), e.g., compares the two counts.

The error terms associated with the second order and third order harmonics (e.g., $\varepsilon_{HD2}$ and $\varepsilon_{HD3}$ respectively) can be defined as:

$$\varepsilon_{HD2}=\varepsilon(V_{insp})+\varepsilon(-V_{insp}) \quad (8)$$

and $$\varepsilon_{HD3}=\varepsilon(V_{insp})-\varepsilon(-V_{insp}) \quad (9)$$

The above error terms exposes the shape the second order harmonic (which has an even symmetry) and the third order harmonic (which has an odd symmetry). $\varepsilon_{HD2}$ sums the error at the positive inspection point and the error at the negative inspection point. $\varepsilon_{HD3}$ subtracts the error at the positive inspection point by the error at the negative inspection point.

With the error terms defined, Least Means Square (LMS) equations can be used in convergence loops for updating the calibration coefficients of the second and third order non-linearities (e.g., $\alpha_2$ (n) and $\alpha_3$ (n)). The convergence loops can update the calibration coefficients to drive the error terms (e.g., $\varepsilon_{HD2}$ and $\varepsilon_{HD3}$) to zero. The LMS equations can be given by:

$$\alpha_2(n+1)=\alpha_2(n)-\mu_2 \times \varepsilon_{HD2} \quad (10)$$

and $$\alpha_3(n+1)=\alpha_3(n)-\mu_3 \times \varepsilon_{HD3} \quad (11)$$

$\mu_2$ and $\mu_3$ are the LMS step sizes for the second and third order convergence respectively. For HD2 and HD3 correction, the calibration coefficients updated by the LMS equations can be applied in a correction equation as follows:

$$v_{out_{cal}}=v_{out}+\alpha_2 v_{out}^2+2\alpha_2^2 v_{out}^3+\alpha_3 v_{out}^3+3\alpha_3^2 v_{out}^5 \quad (12)$$

The convergence loop has a closed-loop operation, meaning the calibrated output $V_{out_{cal}}$ is plugged back into equations (6) and (7). The high order terms in equation (12) can be used to correct for the effects of applying our correction on the output (instead of the input, since the calibration scheme does not have access to the input). Applying the correction to the output (which is non-linear) can cause the correction itself to generate higher order terms that may need to be cancelled.

Such a calibration algorithm or other suitable ones can inspect the transfer characteristic at certain inspection points (or thresholds) while using the calibration dither to expose the non-linearity, because the response of a non-linear amplifier is expected to be different depending on the value or polarity of the calibration dither (e.g., when dither is added to the input compared to when it is subtracted).

When the calibration algorithm is used in MDAC and pipeline structures as illustrated by FIG. 33, some measures may need to be employed in order to ensure that the non-linear calibration algorithm works effectively and converges properly to the desired non-linear coefficients in the presence of back-end non-idealities. That is, the digital representations of the input, linearization dither, and calibration dither signals are not perfect, and hence they can substantially degrade the calibration accuracy. This is independent of the specific calibration algorithm used. These measures may be needed to ensure that the non-linearity estimation of a front stage (e.g., stage-1) is not negatively impacted by the non-idealities of the back-end stages. If no additional measures are taken, these back-end non-idealities would lead to wrong estimates, input-dependent convergence, and/or even failure of the algorithms. Similar issues are encountered when calibrating IGE. However, the measures taken for the IGE calibration are not necessarily effective for the non-linear calibration, which may require different measures.

For example, the "Linearization Dither-1" injected in stage-1 in both the MDAC and the flash ADC can be effective in linearizing the back-end for the IGE calibration and de-sensitizing the convergence to some extent against the back-end non-idealities, as long as it has adequate number of levels. However, this same dither is treated as an input signal by the non-linear calibration algorithms, and therefore is completely ineffective in "linearizing" the back-end for the non-linear calibration. This is independent of how many bits/levels it has or whether it has binary or odd number of levels. It is effective at de-sensitizing the non-linear calibration against the sinusoidal input signal characteristics, but not against the non-idealities of the back-end. This is due to the nature of the non-linear calibration algorithms and their reliance on measuring the transfer characteristic of the amplifier at different signal values, where the "signal" includes both the input and the dither.

Instead, an additional dither (e.g., "Linearization Dither-2") can be injected in the following stage(s), as illustrated by FIG. 33. This linearization dither signal can be injected after the amplifier to be calibrated, in a way that does not change its output considerably. For instance, the linearization dither signal can be injected during the hold phase of stage-2 in both the MDAC and flash ADC of stage-2 in order to effectively dither and linearize the stage-2 non-linearities for the stage-1 non-linear calibration. In addition, this linearization dither signal is subtracted in the digital domain from the stage-1 residue before the non-linear calibration of stage-1. Similarly, when calibrating stage-2 non-linearity, a "Linearization Dither-3" is injected in the input of stage-3, and so on.

Examples of the techniques used for the non-linear calibration of a given block (e.g., in stage-1) to be insensitive to the non-idealities of the back-stages following this given block:

- Inject a "linearization dither" in the following stage in both the MDAC and flash. The dither amplitude is preferably large enough to cover a full subrange of stage-2. This dither is be subtracted digitally from the signal that gets used for the non-linear calibration. This can be the most effective technique.
- Randomize (or dither) the inspection points (thresholds values for open intervals) used for the non-linear calibration. The range of the inspection point values is preferably at least equal to stage-2 subrange, and more preferably covers twice the stage-2 subrange. This technique is effective, but not as effective as applying the stage-2 linearization dither.
- Use multiple inspection points (threshold values for open intervals) for the non-linear calibration and average the results. The range of the inspection points is preferably at least equal to the stage-2 subrange, and more preferably twice the stage-2 subrange.
- Use multiple dither levels in the calibration dither of the given stage. This helps with this issue as long as the correlation/histogram is performed on the multiple levels of the dither. This averages the calibration over the range of the dither levels, which acts as a linearizer to the back-end non-idealities. The range of the IGE dither needs to be larger than a stage-2 subrange, and preferably double that range.

The above mentioned measures are examples of techniques that can be used to ensure the calibration to be effective in the presence of back-end non-idealities. However, not all of the measures are needed simultaneously. If done properly, only one of them can be adequate, and a combination of two of them can help improve robustness. Tests have shown that the linearization dither is the most effective technique, and it can be used alone or in conjunction with another method to improve robustness.

The cost of these measures can be very small, and can be helpful for the other existing calibrations besides the amplifier calibrations. For example, by injecting linearization dither in the second stage, it is possible to reduce the number of levels that used to be injected in the first stage, such that the total number of levels is the same. Therefore, this does not necessarily increase the overall power consumption.

Gain Adjustment/Calibration with Analog Correction

To correct for gain error, a closed-loop approach can be used, where the LMS algorithm controls the gain of the amplifier in a way that minimizes the squared gain error. The control parameter ε[n] for correcting gain can be updated by the following LMS equation:

$$\varepsilon[n+1]=\varepsilon[n]+\mu \cdot V_d \cdot (V_R[n]-GV_d[n]) \quad (13)$$

$V_d$ is the calibration dither signal, $V_R$ is the output (residue) of stage-1, G is the ideal gain of the stage, and μ is the LMS step size. The control parameter ε[n] is then used to control the gain of the open-loop amplifier. The control parameter ε[n] can be determined by correlating $V_d$ against $V_R$ minus a dither estimate. In other words, $V_d$ is correlated against the output signal with the dither estimate removed. The dither estimate is based on product of $V_d$ and the ideal gain G. The result of the correlation is used to update the control parameter ε[n] using equation (13). When the control parameter ε[n] converges, $V_d$ is expected to be uncorrelated with $V_R[n]-GV_d[n]$ (the output signal with the dither estimate removed).

Controlling the gain of the open-loop amplifier can be done by controlling the current (i.e., the current source(s)) in the amplifier, which controls the $g_m$ and hence the gain of the amplifier. In some cases, controlling the gain of the open-loop amplifier can be done by controlling/varying the load resistances (e.g., $R_L$, gate voltage $V_G$ of a load transistor) and/or source degeneration resistances $R_S$ (as seen in the FIGURES).

Figure 38:
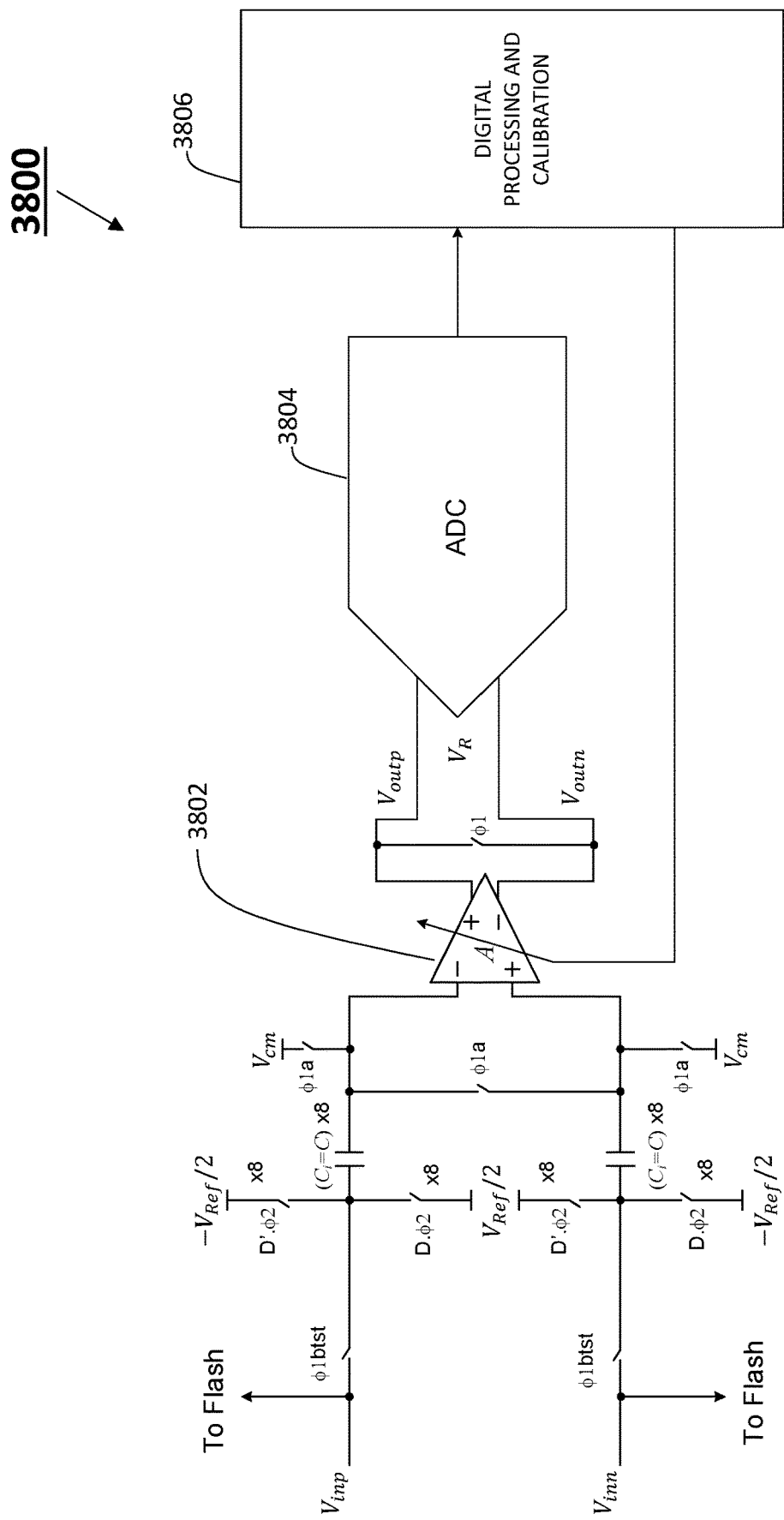
FIG. 38 illustrates gain calibration with analog correction, according to some embodiments of the disclosure.

FIG. 38 illustrates gain calibration with analog correction, according to some embodiments of the disclosure. ADC system 3800 includes an open-loop amplifier 3802 (e.g., part of an MDAC circuit structure), an ADC 3804 that digitizes the output of the open-loop amplifier 3802, and a digital processing and calibration block 3806. The digital processing and calibration block 3806 can observe the output (e.g., residue digitized by ADC 3804) and update the control parameter ε[n] for correcting gain. The digital processing and calibration block 3806 can tune the open-loop amplifier 3802 based on the control parameter.

In some alternative embodiments, if the MDAC stages have different references, controlling the references can be used to correct the inter-stage gain. However, controlling the amplifier's gain directly as explained previously can correct the actual gain of the amplifier and avoid possible negative side effects of changing the references between the various stages.

Tuning the components of the open-loop amplifier (e.g., bias currents, and resistances) can advantageously provide fine gain adjustment of the open-loop amplifier and the overall circuit. In some embodiments, it is advantageous to provide coarse gain adjustment. Fine and/or coarse gain adjustment may be used for calibration purposes, and/or configurability purposes.

Figure 39:
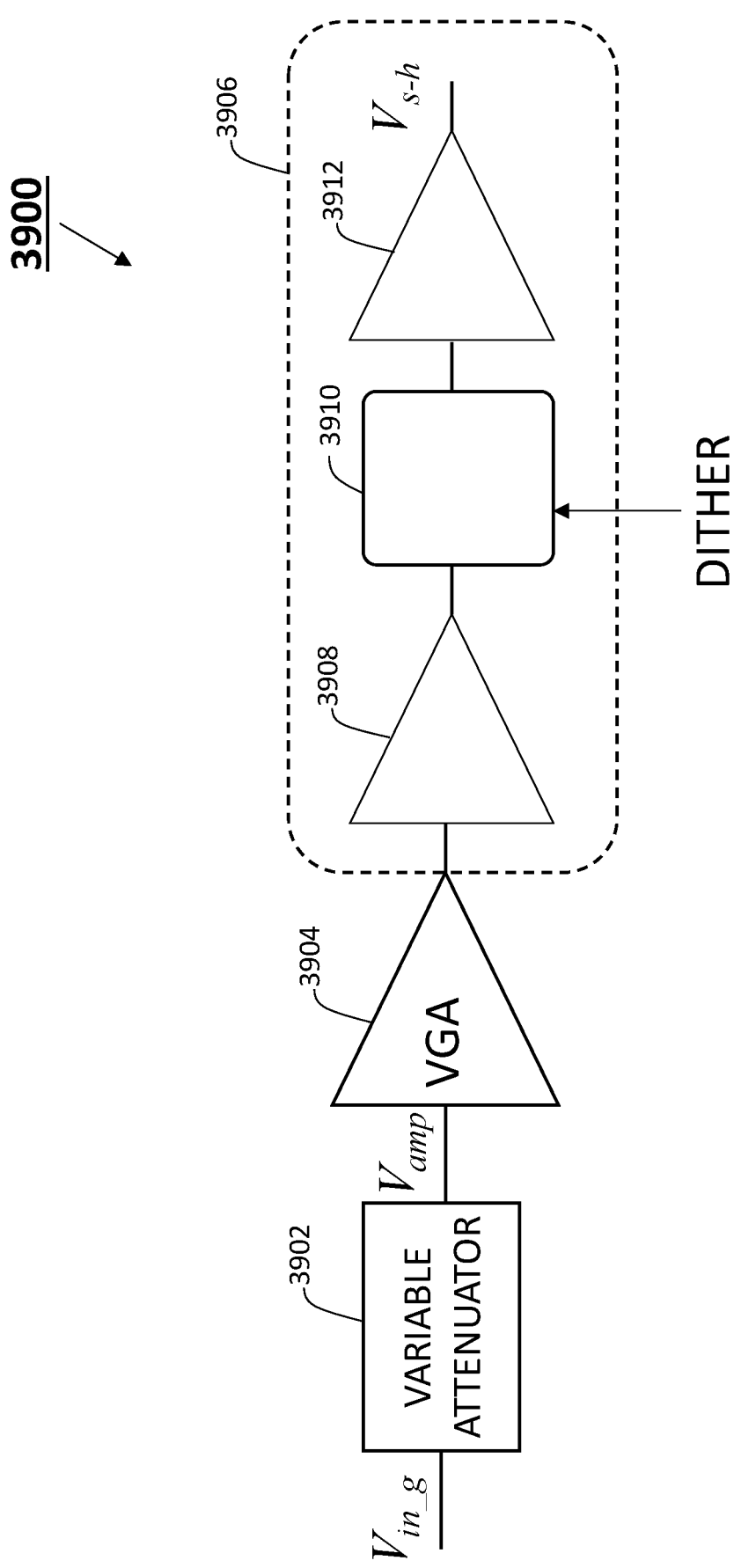
FIG. 39 shows a variable attenuator in a front-end of an ADC, according to some embodiments of the disclosure.

To implement coarse gain adjustment, a variable attenuator can be included in front of an open-loop amplifier. FIG. 39 shows a variable attenuator 3902 in a front-end 3900 of an ADC, according to some embodiments of the disclosure. The front-end 3900 can accommodate fine gain adjustment and coarse gain adjustment. The front-end 3900 receives an analog input signal $V_{in\_g}$, and provides a signal $V_{s-h}$ to be digitized by the ADC following the front-end 3900. The front-end 3900 includes variable attenuator 3902, a variable gain amplifier 3904, and a track and hold (T/H) circuit 3906. Besides satisfying coarse gain adjustment requirements, variable attenuator 3902 can reduce the input swing to the amplifier, and provide the input $V_{amp}$ with a fixed impedance that is independent of the attenuation setting. Preferably, the variable attenuator 3902 does not degrade the distortion, and can handle a relatively large input with acceptable distortion levels.

The variable gain amplifier 3904 can be implemented based on any one of the open-loop amplifiers described herein. Using an open-loop amplifier as the variable gain amplifier 3904 means that the open-loop amplifier would be operating in the continuous-time domain. This can have certain implications and benefits to the overall ADC system. Improving the performance of variable gain amplifier 3904 may rely on analog linearization schemes, such as the analog tracking circuits illustrated by FIGS. 31-32. Due to the continuous-time operation of the variable gain amplifier 3904, it is possible to avoid frequency dependent calibrations. Calibrations which are dependent on input frequency for linearization can be expensive and cumbersome. If desired, it is still possible to perform digital calibration and mixed-signal calibration, provided that, e.g., a calibration dither is injected in the variable gain amplifier 3904 (e.g., as illustrated by FIG. 37), and mechanisms for coarse and/or fine gain adjustments are included. Digital and mixed-signal calibration techniques can observe a digital output representative of the output of the variable gain amplifier 3904 and extract non-linearities/non-idealities accordingly.

The T/H circuit 3906 can be implemented in a suitable manner. In the example shown, the T/H circuit 3906 of the front-end 3900 can be seen as an open-loop T/H circuit, comprising a buffer 3908, switched capacitor network 3910, and amplifier 3912. The switched capacitor network 3910 can be a sampling network. Buffer 3908 can be a sampling buffer, and amplifier 3912 can be a hold buffer/amplifier (e.g., any of the open-loop amplifiers described herein). A dither can be injected in the switched capacitor network 3910 (e.g., by injecting charge to the switched capacitor network 3910), and the dither can be used to calibrate circuitry downstream from the dither injection point. The switched capacitor network 3910 can include dither injection circuitry at the dither injection point, e.g., to inject a charge representative of a dither signal. The buffers can be source followers, emitter followers, push-pull topology, any other suitable buffer structure, and open-loop amplifiers described herein. Buffer 3908 can be optimized for sampling linearity. Amplifier 3912 can be optimized for low power, small size, small input capacitance, and good isolation. Isolation for amplifier 3912 can help reduce input-referred noise of the ADC which follows the T/H circuit 3906. The linearity of amplifier 3912 is not as critical as the linearity of buffer 3908 because amplifier 3912 handles a held signal. In addition, since dither is injected in the switched capacitor network 3910, the non-linearity of the amplifier 3912 can be calibrated, which helps further lower the power and size of amplifier 3912.

Variable attenuator 3902 can include circuitry having a network of switches and resistors. The network is configurable with switches. Depending on the state of the switches (e.g., transistor devices), a certain amount of resistance can be configured and used for attenuating the input. In other words, the effective gain of the variable attenuator can be configured through the state of the switches. Specific resistors can be switched in or out of the network to change the overall resistance, thus the gain of the variable attenuator 3902.

With the variable attenuator and open-loop amplifiers provided in the front-end (possibly as variable gain amplifiers), the overall gain can be distributed over different circuitry in the front-end (possibly to achieve higher overall gain). Also, due to the programmability (fine and coarse) of the gain for the variable attenuator and open-loop amplifiers, various ways of programming the overall gain is possible. Coarse gain adjustment can be done with the variable attenuator and/or by reducing amplifier resistance load. Fine gain adjustment can be done by adjusting the current(s) in the amplifier (e.g., adjusting a current source in an open-loop amplifier using a bias voltage, or changing a bias voltage driving a current source transistor to adjust an amount of current and gain of the open-loop amplifier).

Figure 40:
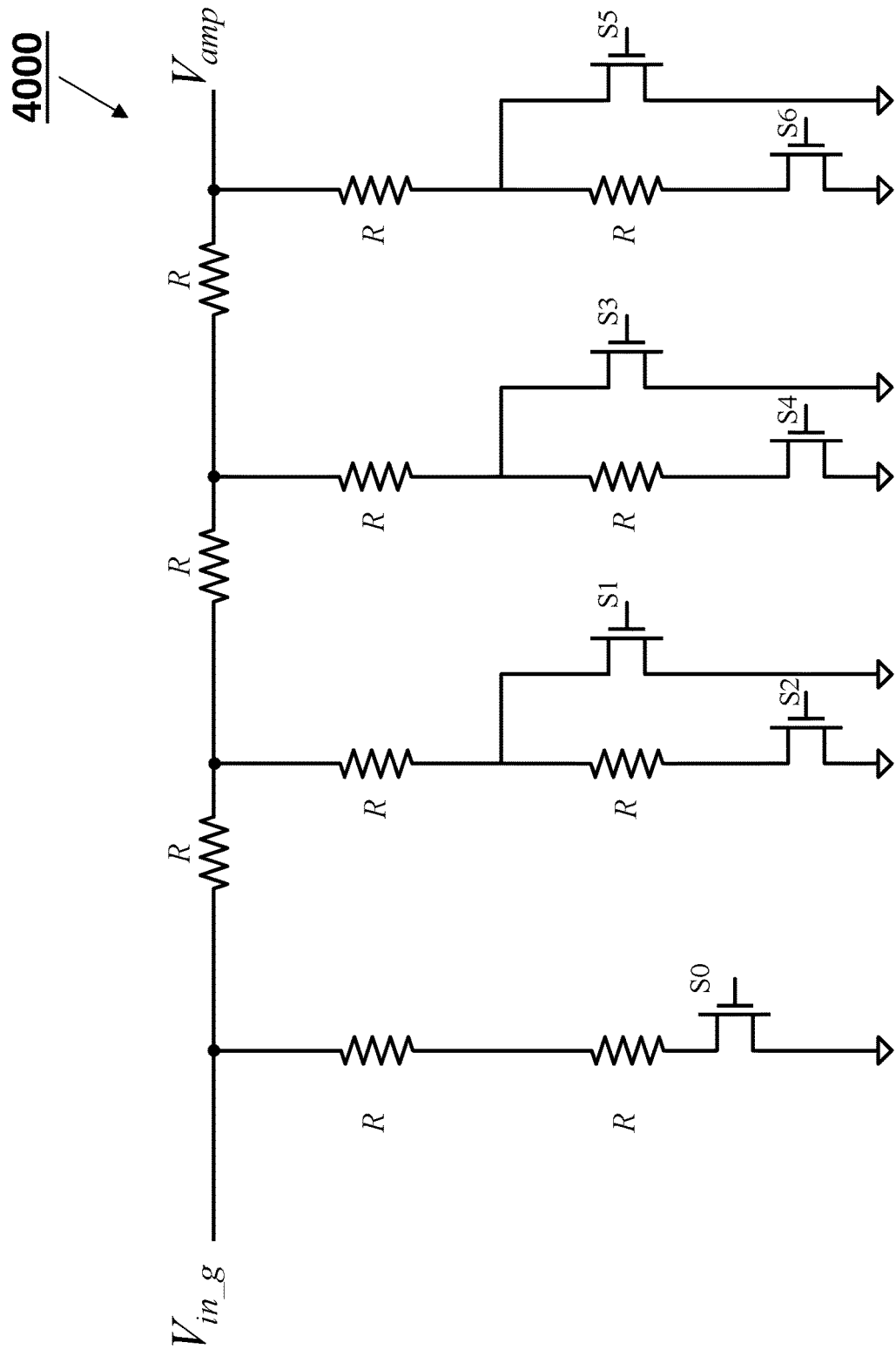
FIGS. 40-41 show exemplary variable attenuator circuits, according to some embodiments of the disclosure.

FIG. 40 shows an exemplary variable attenuator circuit 4000, according to some embodiments of the disclosure. The variable attenuator circuit 4000 receives input $V_{in\_g}$ and provides an attenuated output $V_{amp}$ includes a network of resistors (e.g., labeled "R") and switches (e.g., controlled by control signals S0-S6). Switches are implemented using transistor devices, whose gates is driven by respective control signals to turn the switch "on" or "off". The amount of gain can be varied (e.g., 1, ½, ¼, and ⅛) according to the following table showing the states of the switches (1="on", and 0="off") while keeping input impedance constant at 2R:

|  | Gain = 1 | Gain = ½ | Gain = ¼ | Gain = ⅛ |
| --- | --- | --- | --- | --- |
| S0 | 1 | 0 | 0 | 0 |
| S1 | 0 | 1 | 0 | 0 |
| S2 | 0 | 0 | 1 | 1 |
| S3 | 0 | 0 | 1 | 0 |
| S4 | 0 | 0 | 0 | 1 |
| S5 | 0 | 0 | 0 | 1 |
| S6 | 0 | 0 | 0 | 0 |
| Input Impedance | 2R | 2R | 2R | 2R |

Figure 41:
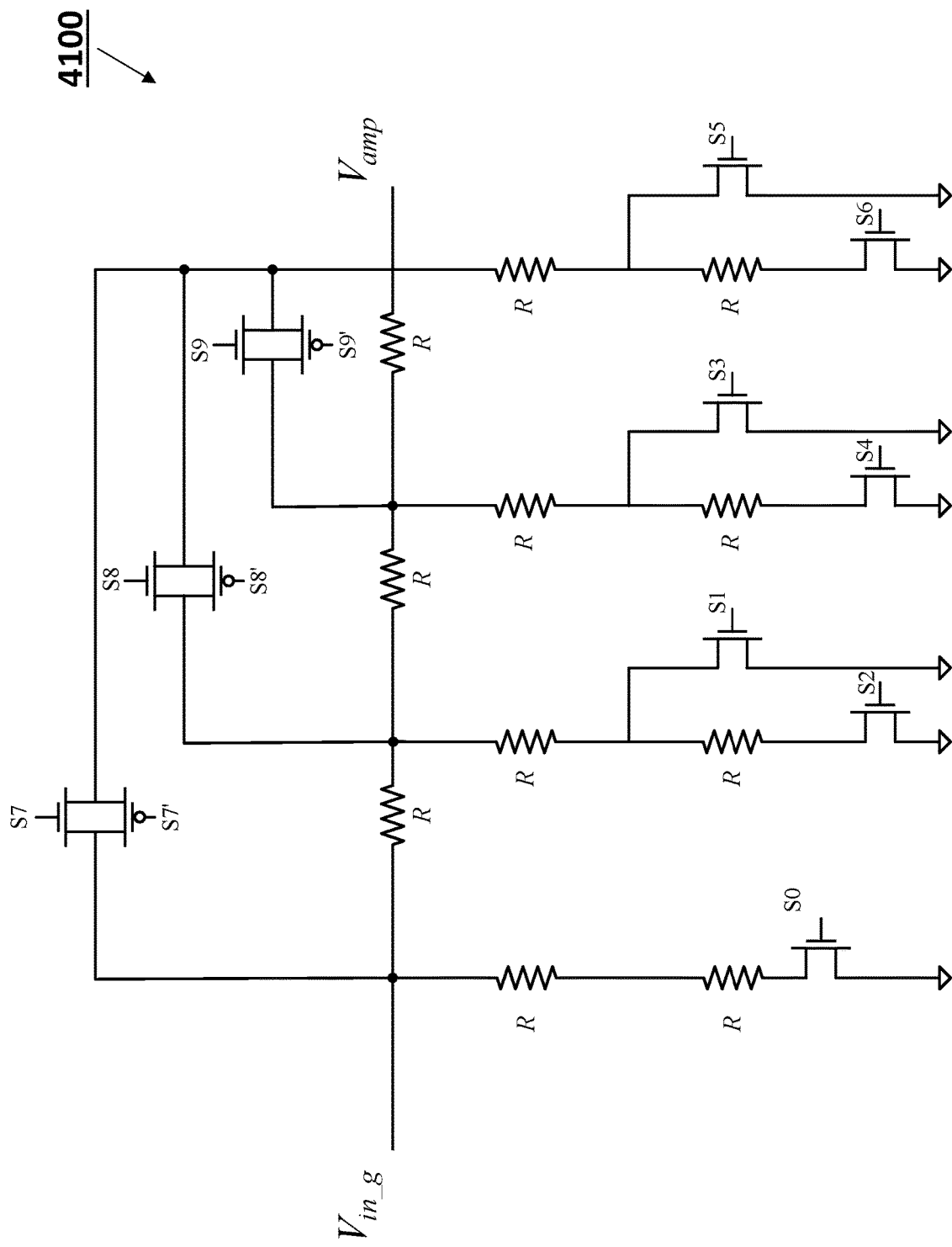

FIG. 41 shows another exemplary variable attenuator circuit 4100, according to some embodiments of the disclosure. The variable attenuator circuit 4100 receives input $V_{in\_g}$ and provides an attenuated output $V_{amp}$ includes a network of resistors (e.g., labeled "R") and switches (e.g., controlled by control signals S0-S9). Switches are implemented using transistor devices, whose gates is driven by respective control signals to turn the switch "on" or "off". Variable attenuator circuit 4100 is similar to the variable attenuator circuit 4000. However, additional switches (controlled by S7, S7', S8, S8', S9 and S9') are provided as selectable impedances to improve output impedance variation of the variable attenuator circuit 4100. If S7 is 1 and S7' is 0, the pair of NMOS and PMOS transistor devices are both on. If S8 is 1 and S8' is 0, the pair of NMOS and PMOS transistor devices are both on. If S9 is 1 and S9' is 0, the pair of NMOS and PMOS transistor devices are both on. The amount of gain can be varied (e.g., 1, ½, ¼, and ⅛) according to the following table showing the states of the switches (1="on", and 0="off") while keeping input impedance constant at 2R:

|  | Gain = 1 | Gain = ½ | Gain = ¼ | Gain = ⅛ |
| --- | --- | --- | --- | --- |
| S0 | 1 | 0 | 0 | 0 |
| S1 | 0 | 1 | 0 | 0 |
| S2 | 0 | 0 | 1 | 1 |
| S3 | 0 | 0 | 1 | 0 |
| S4 | 0 | 0 | 0 | 1 |
| S5 | 0 | 0 | 0 | 1 |
| S6 | 0 | 0 | 0 | 0 |
| S7 | 1 | 0 | 0 | 0 |
| S8 | 0 | 1 | 0 | 0 |
| S9 | 0 | 0 | 1 | 0 |
| Input Impedance | 2R | 2R | 2R | 2R |

Memory and Kick-Back Calibration

In some MDAC circuit structures, the capacitances are reset completely when switching between the hold phase and the sampling phase to avoid memory and kick-back errors. This can be done using switches labeled φ2_rst in FIGS. 2 and 3. However, this resetting can consume a portion of the time and substantial amount of power. In order to save both time and power, it is possible to avoid having to resetting the capacitances, and instead calibrate the resulting memory and kick-back errors.

A first calibration dither $V_{d1}$ is injected in stage-1, and a second calibration dither $V_{d2}$ is injected in stage-2. The calibration dithers can be used for the memory and kick-back calibrations. Preferably, the kick-back error is extracted first. The kick-back error can be extracted based on a correlation between the second calibration dither and a (digital) output of stage-1. The kick-back error can be removed from the digital output of stage-1 to generate a first calibrated output of stage-1. Then, the memory error is extracted. The memory error can be extracted based on a correlation between the first calibration dither and the first calibrated output of stage-1. The memory error can be removed from the first calibrated output of stage-1 to generate a second (final) calibrated output of stage-1.

Figure 42:
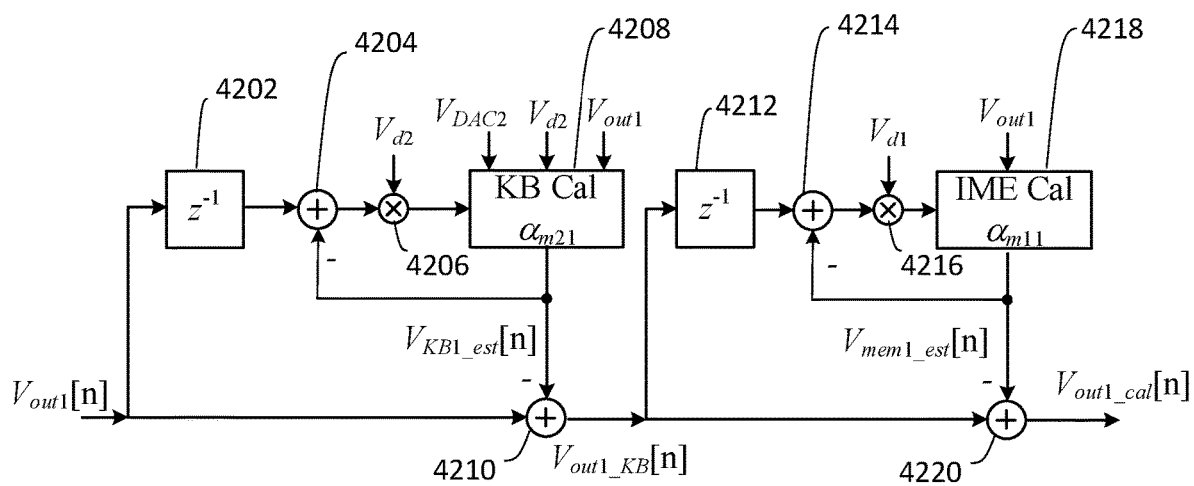
FIG. 42 illustrates memory and kick-back calibration, according to some embodiments of the disclosure.

FIG. 42 illustrates memory and kick-back calibration, according to some embodiments of the disclosure. Specifically, digital processing circuitry 4200 can calibrate the inter-stage memory and kick-back errors for, e.g., stage-1 of a pipelined ADC. The digital output of stage-1 $V_{out1}[n]$ (e.g., can be delayed by delay block 4202. An estimated kick-back error $V_{KB1\_est}[n]$ is subtracted from the delayed digital output of stage-1 by summation node 4204. The result from summation node 4204 can be used in a correlation with the calibration dither of stage-2 $V_{d2}$, illustrated by correlator 4206. The correlation result from correlator 4206 can be used to update a kick-back coefficient $\alpha_{m21}$, in kick-back calibration block 4208. This kick-back coefficient $\alpha_{m21}$ is used to remove the majority of the kick-back components on the output of stage-1 coming from the dither of stage-2 $V_{d2}$, the DAC of stage-2 $V_{DAC2}$ and some memory of the output of stage-1 itself $V_{out1}$. The kick-back coefficient $\alpha_{m21}$, the DAC of stage-2 $V_{DAC2}$, the calibration dither of stage-2 $V_{d2}$ and some memory of the output of stage-1 itself $V_{out1}$ can be used by kick-back calibration block 4208 to estimate/generate the kick-back error term/component $V_{KB1\_est}[n]$. The estimated kick-back error $V_{KB1\_est}[n]$ can be subtracted from the digital output of stage-1 $V_{out1}[n]$ by summation node 4210 to generated an output signal $V_{out1\_KB}[n]$ (digital output of stage-1 with the kick-back error removed).

Once the estimated kick-back error $V_{KB1\_est}[n]$ is removed from the digital output of stage-1 $V_{out1}[n]$, the remainder of the memory on stage-1 is then removed by first delaying $V_{out1\_KB}[n]$ by delay block 4212. An estimated memory error $V_{mem1\_est}[n]$ is subtracted from the delayed digital output of stage-1 with the kick-back error removed by summation node 4212. The result from summation node 4212 can be used in a correlation with the calibration dither of stage-1 $V_{d1}$, illustrated by correlator 4216. The correlation result from correlator 4216 can be used to update a memory coefficient $\alpha_{m11}$, in memory calibration block 4218. This memory coefficient $\alpha_{m11}$ is used to remove the (remaining) memory of the output of stage-1. The memory coefficient $\alpha_{m11}$ and some memory of the output of stage-1 itself $V_{out1}$ can be used by memory calibration block 4218 to generate the estimated memory error $V_{mem1\_est}[n]$. The memory error $V_{mem1\_est}[n]$ can be subtracted from the digital output of stage-1 with the kick-back error removed $V_{out1\_KB}[n]$ by summation node 4220 to generated an output signal $V_{out1\_cal}[n]$ (digital output of stage-1 with the kick-back error and memory error removed). Removal of kick-back error and removal of memory error are done sequentially to show the calibration scheme, but one skilled in the art would appreciate that the removal of kick-back error and removal of memory error can be done in parallel as well. The details of which components are removed in each step can depend on the implementation.

In open-loop MDACs, errors due to inter-stage memory and kick-back are similar to those in closed-loop MDACs. They can be corrected using dither-based IGE, IME, and KB calibrations. However, implementing some of these calibrations can be costly and requires multiple calibration dithers injected in every stage. The accuracy can also be limited. There are subtle differences in the behavior of the open-loop MDACs compared to closed-loop MDACs, specifically, the summing node voltage is not forced to a virtual ground in the hold phase. Those differences may need to be taken into account to change the implementations in a manner that improves the IGE, IME, and KB calibrations.

Figure 43:
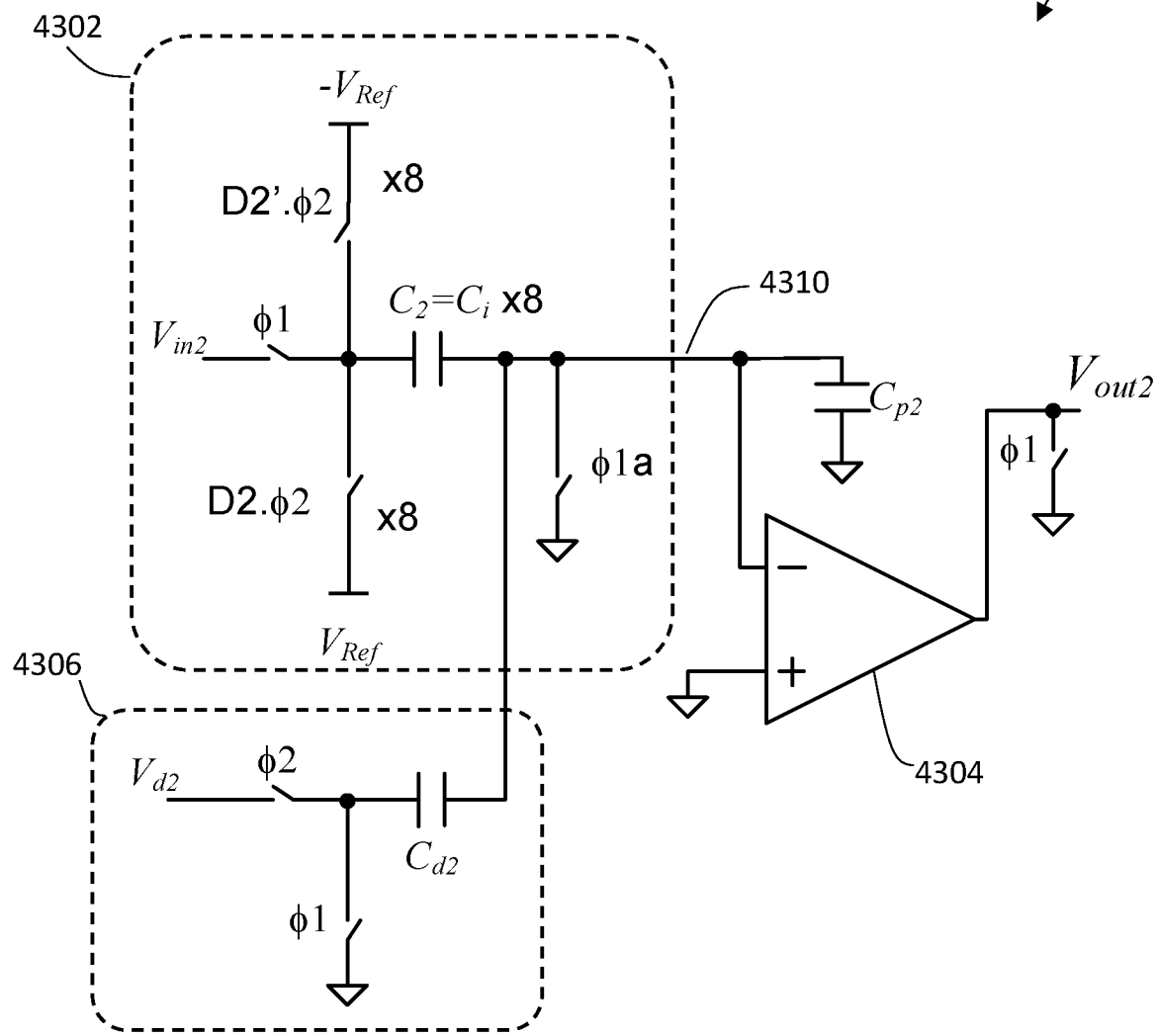
FIG. 43 illustrates an open-loop multiplying digital-to-analog converter, according to some embodiments of the disclosure.

FIG. 43 illustrates an open-loop MDAC 4300, according to some embodiments of the disclosure. As an example, the open-loop MDAC 4300 is in stage-2 (but the teachings are applicable to other stages as well). The MDAC 4300 includes amplifier 4304 (e.g., a suitable open-loop amplifier described herein), and switched capacitor circuitry 4302 which can perform sampling and DAC operations. The MDAC 4300 has a summation node 4310 (or summing node) at the noninverting input of amplifier 4304. MDAC circuit structure 4300 further includes switched capacitor circuitry 4306 for calibration dither injection. Specifically, switched capacitor circuitry 4306 injects charge into the switched capacitor circuitry 4302 based on the calibration dither voltage $V_{d2}$. The calibration dither signal is injected in a hold phase N:12) and the capacitance is grounded in the sampling phase ($\phi1$). As a result, a calibration dither signal is added in the MDAC circuit structure 4300.

The output of an open-loop MDAC, e.g., $V_{out1}[n]$ of stage-1, can be represented as:

$$V_{out1}[n]=V_{out1_{nomem}}[n]+V_{out1_{mem}}[n]+V_{KB\_OL1}[n] \quad (14)$$

$V_{out1}$ is the output of stage-1 MDAC, $V_{out1_{nomem}}$ is the output of stage-1 in the absence of memory, $V_{out1_{mem}}$ is the self-memory component in the output that is independent of stage-2 kick-back, $V_{KB\_OL1}$ is the component of the stage-1 output that results from the kick-back of stage-2 on stage-1. The self-memory term is given by:

$$V_{out1_{mem}}[n]=\alpha_{m1}V_{out1}[n-] \quad (15)$$

$\alpha_{m1}$ is the self-memory coefficient. Self-memory terms represented in equation (14) and (15) are infinite impulse response (IIR) functions that represent the accumulation of an infinite amount of previous memory terms, because the current output has a memory component that is proportional to the previous output (not input).

The kick-back term can be given by:

$$V_{KB\_OL1}[n] = \alpha_{KB1}\left(V_{DAC2}[n-1]\frac{C_{d2}+C_{p2}}{C_2+C_{d2}+C_{p2}} + V_{in2}[n-1]\frac{C_2}{C_2+C_{d2}+C_{p2}} - V_{d2}[n-1]\frac{C_{d2}}{C_2+C_{d2}+C_{p2}}\right) \quad (16)$$

$V_{DAC2}$ is the DAC voltage of stage-2 MDAC, which is represented digitally by the ADC (flash) output bits of stage-2, $V_{in2}$ is the input to stage-2, which is equal to the output of stage-1, and $V_{d2}$ is the calibration dither of stage-2. $V_{DAC2}$, $V_{in2}$, and $V_{d2}$ are each scaled by a corresponding ratio of capacitances in the second stage. $C_{d2}$ is the dither capacitance in the switched capacitor circuitry 4306 of FIG. 43 for injecting a calibration dither in stage-2. $C_{p2}$ is the parasitic capacitance in the summation node 4310 (shown as a capacitor) of FIG. 43. $C_2$ is the capacitance in the switched capacitor circuitry 4302 (the sampling/DAC capacitances) of FIG. 43. Equation (16) can be computed by kick-back calibration block 4208 of FIG. 42. The coefficient $\alpha_{KB1}$ is the kick-back coefficient, which depends on the settling of the kick-back of stage-2 during the hold phase of stage-1. For first order settling, the coefficient $\alpha_{KB1}$ is approximately given by:

$$\alpha_{KB1} \sim e^{-t_s/R_1C_{L1}} \quad (17)$$

$t_s$ is the settling time, $R_1$ is the output resistance of the stage-1 amplifier, and $C_{L1}$ is the load capacitance of stage-1.

Equation (16) for the kick-back voltage in open-loop MDACs is different from the kick-back voltage in the case of a closed-loop amplifier, which would be given by:

$$V_{KB\_CL1}[n] \sim \alpha_{KB1}V_{DAC2}[n-1] \quad (18)$$

Figure 44:
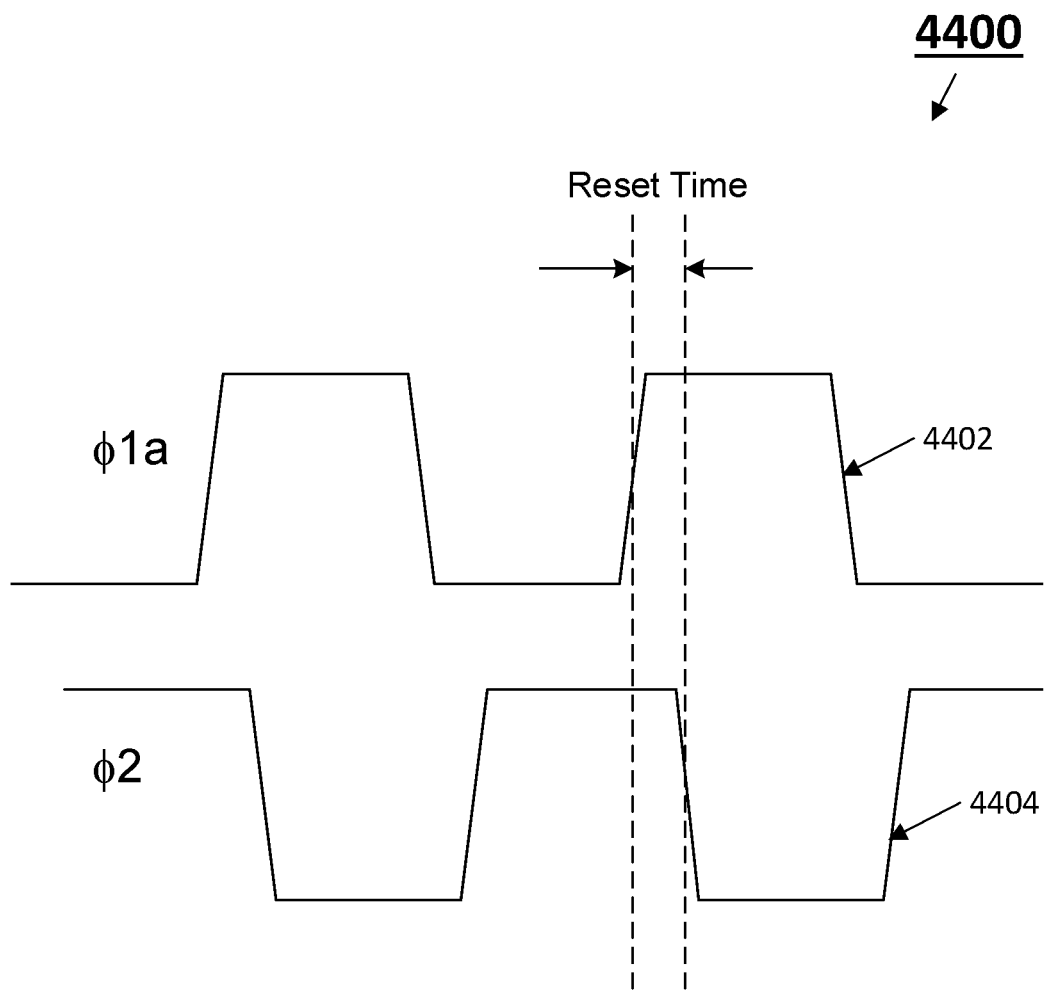
FIG. 44 shows timing diagram of sampling switches, according to some embodiments of the disclosure.
Figure 45:
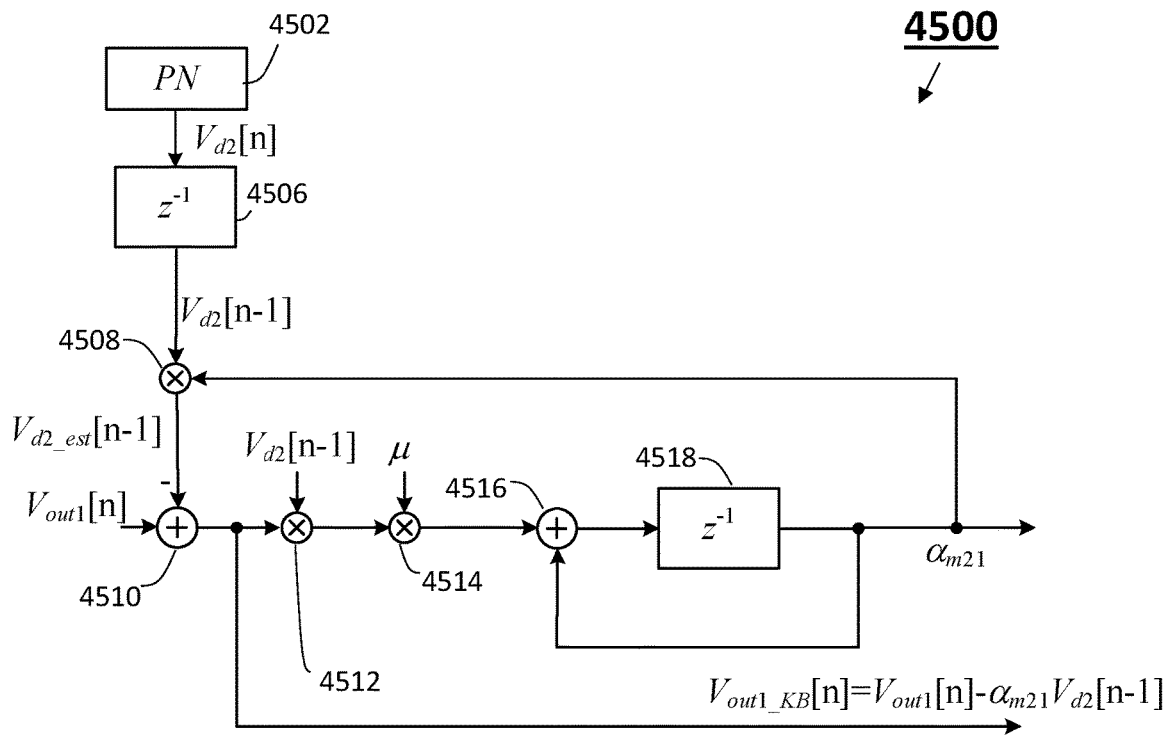
FIGS. 45-46 show digital signal processing for updating coefficients to address kick-back and memory errors, according to some embodiments of the disclosure.

Equation (18) does not include ratio of capacitances, $V_{in2}$, and $V_d$. In practice, the sampling clock $\phi1a$ is usually advanced compared to the other clocks. This causes the summing node capacitance to possibly be partially reset before the sampling starts. FIG. 44 shows timing diagram of sampling switches, according to some embodiments of the disclosure. Plot 4402 shows the timing of the sampling clock $\phi1a$ (clock for controlling the switch at the bottom plate of the sampling capacitances), and plot 4404 shows the timing of the sampling clock $\phi2$. There is a short period of reset time ("partial reset") which can result in the kick-back voltage to deviate from the expression given in equation (16):

$$V_{KB\_OL1\_RST2} = \quad (19)$$
$$\alpha_{KB1}\left(V_{DAC2}[n-1] - \alpha_{RTS2}V_{DAC2}[n-1]\frac{C_2}{C_2+C_{d2}+C_{p2}} + \alpha_{RST2}\right.$$
$$\left.V_{in2}[n-1]\frac{C_2}{C_2+C_{d2}+C_{p2}} - \alpha_{RST2}V_{d2}[n-1]\frac{C_{d2}}{C_2+C_{d2}+C_{p2}}\right)$$

$\alpha_{RST2}$ represents the fraction of the summing node voltage (or more accurately: of the sampling capacitor charge) that remains after resetting. If it was reset completely, then $\alpha_{RST2}=0$, and the kick-back voltage is given by:

$$V_{KB\_OL1\_RST2} = \alpha_{KB1} V_{DAC2}[n-1] \quad (20)$$

Equation (20) is similar to the kick-back of a closed-loop MDAC as shown in equation (18). On the other hand, if the resetting is absent, then $\alpha_{RST2}=1$, and equation (19) reduces to equation (16). The following passages will discuss partial resetting, since it is the most general scenario.

Therefore, as outlined in equation (19), in the open-loop MDAC (e.g., one illustrated in FIG. 43), the kick-back from the following stage has components from the IGE dither $V_{d2}$, the quantized input $V_{DAC2}$, and the un-quantized input $V_{in2}$ (of stage-2). The three contributions kick-back with different coefficients, as represented by $\alpha_{RST2}$ and ratio of capacitances. On the other hand, for the closed-loop MDAC and with complete resetting of the summing node in the open-loop MDAC, only the quantized input of the following stage kicks back on the current stage. The additional components/contributions prompts a different scheme for addressing the kick-back error for a system with open-loop MDACs.

From equations (14), (15) and (19), the output of stage-1 for an open-loop MDAC can be represented as:

$$V_{out1}[n] = V_{out1_{nomem}}[n] + \alpha_{m1} V_{out1}[n-1] + \quad (21)$$
$$\alpha_{KB1}\left(V_{DAC2}[n-1] - V_{DAC2}[n-1]\frac{\alpha_{RST2}C_2}{C_2 + C_{d2} + C_{p2}} + V_{out1}[n-1]\frac{\alpha_{RST2}C_2}{C_2 + C_{d2} + C_{p2}} - V_{d2}[n-1]\frac{\alpha_{RST2}C_{d2}}{C_2 + C_{d2} + C_{p2}}\right)$$

which can also be represented as:

$$V_{out1}[n] = V_{out1_{nomem}}[n] + \alpha_{m1} V_{out1}[n-1] + \alpha_{KB1} \quad (22)$$
$$\left(V_{out1}[n-1] - V_{out1q}[n-1] + V_{out1q}[n-1]\frac{\alpha_{RST2}C_2}{C_2 + C_{d2} + C_{p2}} - V_{d2}[n-1]\frac{\alpha_{RST2}C_{d2}}{C_2 + C_{d2} + C_{p2}}\right)$$

$V_{out1q}$ is the quantization error of the stage-1 output after being quantized by stage-2, which can be approximated by the difference between the stage-1 output and the stage-2 ADC (flash) output bits. That is:

$$V_{out1q}[n-1] \sim V_{out1}[n-1] - V_{DAC2}[n-1] \quad (23)$$

Therefore, all the memory and kick-back components can indeed be removed by correlating the output of stage-1 with calibration dither-1 $V_{d1}$ and calibration dither-2 $V_{d2}$, as was illustrated by FIG. 42, without needing any additional kick-back dithers. It is noted that the output of stage-1 includes a component that is due to the dither-1 that is injected in stage-1 to perform the IGE and IME correction of stage-1.

Figure 46:
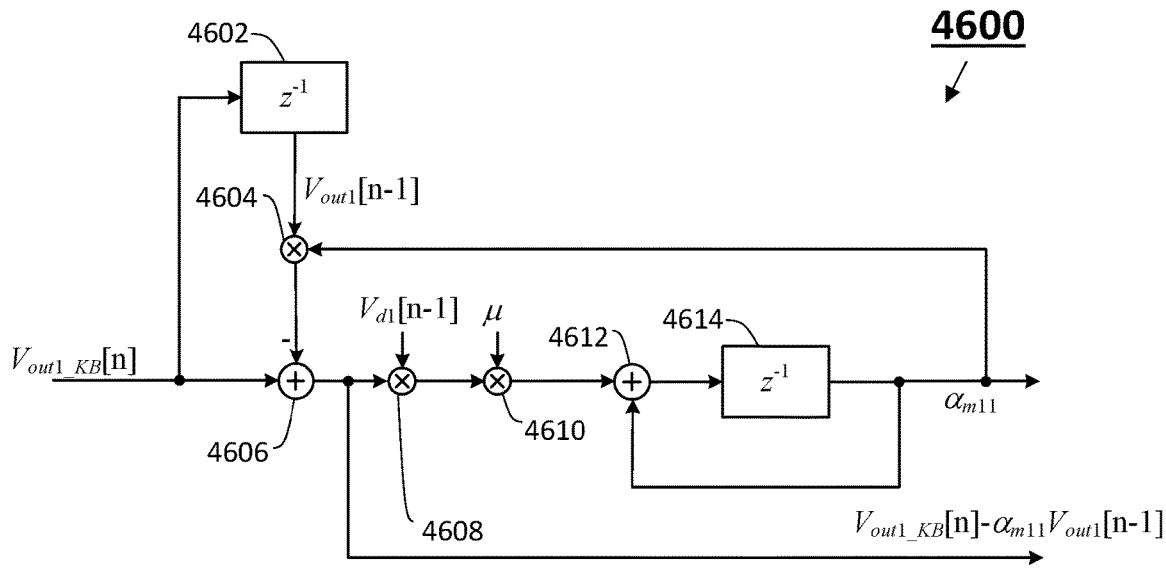

FIG. 46 shows digital signal processing 4500 for updating a coefficient to address kick-back error, according to some embodiments of the disclosure. The digital signal processing 4500 is broadly referred to as a correlator for removing memory and kick-back terms from stage-2 onto stage-1, which implements the following correlation LMS equation for updating kick-back coefficient $\alpha_{m21}$:

$$\alpha_{m21}[n+1] = \alpha_{m21}[n] + \mu \cdot V_{d2}[n-1] \cdot (V_{out1}[n] - \alpha_{m21}[n] \cdot V_{d2}[n-1]) \quad (24)$$

PN generator block 4502 generates the calibration dither signal $V_{d2}[n]$ for stage-2, and the dither signal $V_{d2}[n]$ is delayed by delay block 4506 to generate $V_{d2}[n-1]$. The delayed dither signal $V_{d2}[n-1]$ is multiplied with $\alpha_{m21}[n]$ by multiplier 4508 to obtain $\alpha_{m21}[n] \cdot V_{d2}[n-1]$ (shown as estimated dither signal $V_{d2\_est}[n-1]$ in the FIGURE). Summation node 4510 subtracts $\alpha_{m21}[n] \cdot V_{d2}[n-1]$ from the output signal of stage-1 $V_{out1}[n]$ to obtain $V_{out1}[n] - \alpha_{m21}[n] \cdot V_{d2}[n-1]$. $V_{out1}[n] - \alpha_{m21}[n] \cdot V_{d2}[n-1]$ also forms the output signal of stage-1 with the estimated dither signal removed, shown as $V_{out1\_KB}[n]$, which can be used for the memory error calibration of FIG. 46. To update the estimate for the coefficient $\alpha_{m21}[n]$, the output signal of stage-1 with the estimated dither signal removed, $V_{out1}[n] - \alpha_{m21}[n] \cdot V_{d2}[n-1]$, is multiplied with the delayed dither signal $V_{d2}[n-1]$ by multiplier 4512 to obtain $V_{d2}[n-1] \cdot (V_{out1}[n] - \alpha_{m21}[n] \cdot V_{d2}[n-1])$. Multiplier 4512 performs correlation, and generates an error term that the LMS equation is aiming to reduce or minimize as the LMS process converges. In this example, as the LMS process converges, the error term is reduced when $V_{d2}[n-1]$ is expected to be uncorrelated with $(V_{out1}[n] - \alpha_{m21}[n] \cdot V_{d2}[n-1])$. Result from multiplier 4512, $V_{d2}[n-1] \cdot (V_{out1}[n] - \alpha_{m21}[n] \cdot V_{d2}[n-1])$, is multiplied by the LMS step size $\mu$ to obtain $\mu \cdot V_{d2}[n-1] \cdot (V_{out1}[n] - \alpha_{m21}[n] \cdot V_{d2}[n-1])$ by multiplier 4514. Summation node 4516 adds the result from multiplier 4514, $\mu \cdot V_{d2}[n-1] \cdot (V_{out1}[n] - \alpha_{m21}[n] \cdot V_{d2}[n-1])$, to the kick-back coefficient $\alpha_{m21}[n]$, to obtain: $\alpha_{m21}[n] + \mu \cdot V_{d2}[n-1] \cdot (V_{out1}[n] - \alpha_{m21}[n] \cdot V_{d2}[n-1])$. The result from summation node 4516, $\alpha_{m21}[n] + \mu \cdot V_{d2}[n-1] \cdot (V_{out1}[n] - \alpha_{m21}[n] \cdot V_{d2}[n-1])$, is delayed by delay block 4518 to form the updated kick-back coefficient $\alpha_{m21}[n+1]$.

FIG. 46 show digital signal processing 4600 for updating a coefficient to address (remaining) memory error, according to some embodiments of the disclosure. The digital signal processing 4600 is broadly referred to as a correlator for removing memory of stage-1 on the output of the correlator in FIG. 46, which implements the following correlation LMS equation for updating memory coefficient $\alpha_{m11}$:

$$\alpha_{m11}[n+1] = \alpha_{m11}[n] + \mu \cdot V_{d1}[n-1] \cdot (V_{out1\_KB}[n] - \alpha_{m11}[n] \cdot V_{out1}[n-1]) \quad (25)$$

Delay block 4602 delays the output signal of stage-1 with the estimated dither signal removed, shown as $V_{out1\_KB}[n]$ to obtain $V_{out1\_KB}[n-1]$. $V_{out1\_KB}[n-1]$ is multiplied by memory coefficient $\alpha_{m11}[n]$ by multiplier 4604 to form $\alpha_{m11}[n] \cdot V_{out1}[n-1]$, which can represent an estimate of the memory error. Summation node 4606 subtracts $\alpha_{m11}[n] \cdot V_{out1}[n-1]$ from $V_{out1\_KB}[n]$ to obtain $V_{out1\_KB}[n] - \alpha_{m11}[n] \cdot V_{out1}[n-1]$. The result of summation node 4606 can represent the kick-back calibrated output with an estimated memory error removed. Multiplier 4608 multiplies the delayed dither signal of stage-1 $V_{d1}[n-1]$ and $V_{out1\_KB}[n] - \alpha_{m11}[n] \cdot V_{out1}[n-1]$ to obtain $V_{d1}[n-1] \cdot (V_{out1\_KB}[n] \alpha_{m11}[n] \cdot V_{out1}[n-1])$. Multiplier 4608 performs correlation, and generates an error term that the LMS equation is aiming to reduce or minimize as the LMS process converges. In this example, as the LMS process converges, the error term is reduced when $V_{d1}[n-1]$ is uncorrelated with $V_{out1\_KB}[n] - \alpha_{m11}[n] \cdot V_{out1}[n-1]$. Multiplier 4610 multiplies the LMS step size $\mu$ and $V_{d1}[n-1] \cdot (V_{out1\_KB}[n] - \alpha_{m11}[n] \cdot V_{out1}[n-1])$ to obtain $\mu \cdot V_{d1}[n-1] \cdot (V_{out1\_KB}[n] - \alpha_{m11}[n] \cdot V_{out1}[n-1])$. Summation node 4612 adds the result from multiplier 4610 to the memory coefficient $\alpha_{m11}[n]$, to obtain: $\alpha_{m11}[n] + \mu \cdot V_{d1}[n-1] \cdot (V_{out1\_KB}[n] - \alpha_{m11}[n] \cdot V_{out1}[n-1])$. The result from summation node 4612, $\alpha_{m11}[n] + \mu \cdot V_{d1}[n-1] \cdot (V_{out1\_KB}[n] - \alpha_{m11}[n] \cdot V_{out1}[n-1])$, is delayed by delay block 4614 to update the memory coefficient $\alpha_{m11}[n+1]$.

Alternatively, if a histogram/counting method is used for extracting gain and non-linearity calibration, the LMS equations (23) and (24) for kick-back and memory calibration can become (respectively):

$$\alpha_{m21}[n+1]=\alpha_{m21}[n]+\mu \cdot \text{sgn}(V_{d2}[n-1]) \cdot \text{sgn}(V_{out1}[n]-\alpha_{m21}[n] \cdot V_{d2}[n-1]) \quad (26)$$

and $$\alpha_{m11}[n+1]=\alpha_{m11}[n]+\mu \cdot \text{sgn}(V_{d1}[n-1]) \cdot \text{sgn}(V_{out1\_KB}[n]-\alpha_{m11}[n] \cdot V_{out1}[n-1]) \quad (27)$$

$V_{out1\_KB}[n]$ is the output of stage-1 after removing the kick-back terms captured by $\alpha_{m21}$. Sgn( ) is a sign function. Sign bits of the quantities used in the correlations formulated in equations (26) and (27) effectively performs correlation of the quantities. As the LMS process converges, the kick-back coefficient and the memory coefficient would converge to a value that would best reduce the kick-back and memory errors of stage-1.

Using $\alpha_{m21}$ and $\alpha_{m11}$, in this particular embodiment of the calibration dither injection, the memory and kick-back errors in stage-1 can be approximately corrected. For example, $\alpha_{m21}$ can be used to remove the dither kick-back $V_{d2}$ and the portion of the signal memory that is due to the kick-back, while $\alpha_{m11}$ can be used to remove the remaining stage-1 output memory errors. If the kick-back is the only source of memory, then only $\alpha_{m21}$ is needed. For example, in the presence of both self-memory and kick-back, the correction can be done as follows:

$$V_{out1_{cal}}[n] = V_{out1}[n] - \alpha_{m21}V_{d2}[n-1] - \alpha_{m21}\frac{C_2}{C_{d2}}V_{DAC2}[n-1] + \alpha_{m21}\frac{C_2}{C_{d2}}V_{out1}[n-1] - \alpha_{m11}V_{out1}[n-1] \quad (28)$$

The amount of $V_{out1}[n-1]$ removed using $\alpha_{m21}$ (through correlation between dither-2 $V_{d2}$ and residue-1 $V_{out1}$) influences the value of $\alpha_{m11}$, which converges to remove the remaining memory. That is:

$$V_{out1\_KB}[n] = V_{out1}[n] - \alpha_{m21}V_{d2}[n-1] - \alpha_{m21}\frac{C_2}{C_{d2}}V_{DAC2}[n-1] + \alpha_{m21}\frac{C_2}{C_{d2}}V_{out1}[n-1] \quad (171)$$

and $$V_{out1_{cal}}[n] = V_{out1\_KB}[n] - \alpha_{m11}V_{out1}[n-1] \quad (172)$$

The calibrated outputs $V_{out1_{cal}}$ can be plugged into, e.g., equations (24) and (25), or equations (26) and (27).

Generally speaking, $V_{out1_{cal}}$ can be used in equations (24) to (27). That is:

$$\alpha_{m21}[n+1]=\alpha_{m21}[n]+\mu \cdot V_{d2}[n-1] \cdot V_{out1_{cal}}[n] \quad (29a)$$

and $$\alpha_{m11}[n+1]=\alpha_{m11}[n]+\mu \cdot V_{d1}[n-1] \cdot V_{out1_{cal}}[n] \quad (30a)$$

$V_{out1_{cal}}[n]$ is given by equation (28). Similarly, equations (26) and (27) can be represented as:

$$\alpha_{m21}[n+1]=\alpha_{m21}[n]+\mu \cdot \text{sgn}(V_{d2}[n-1]) \cdot \text{sgn}(V_{out1_{cal}}[n]) \quad (29b)$$

and $$\alpha_{m11}[n+1]=\alpha_{m11}[n]+\mu \cdot \text{sgn}(V_{d1}[n-1]) \cdot \text{sgn}(V_{out1_{cal}}[n]) \quad (30b)$$

From equation (24) to (30), the converged parameters are given by:

$$\alpha_{m11} \sim \alpha_{m1} + a_{KB1} \quad (31)$$

and $$\alpha_{m21} \sim -\alpha_{KB1}\frac{\alpha_{RST2}C_{d2}}{C_2 + C_{d2} + C_{p2}} \quad (32)$$

Note that the quantization error due to kick-back $\alpha_{KB1}V_{out1q}[n-1]$ was not removed in equation (28), which can be a limitation of using the traditional calibration dither when both self-memory and kick-back memory are present.

If the self-memory term $\alpha_{m1}$ is negligible, then the correlation can be done using the equations:

$$\alpha_{m11}[n+1]=\alpha_{m11}[n]+\mu \cdot V_{d1}[n-1] \cdot (V_{out1\_KB}[n]\alpha_{m11}[n] \cdot V_{DAC2}[n-1]) \quad (33)$$

and $$\alpha_{m21}[n+1]=\alpha_{m21}[n]+\mu \cdot V_{d2}[n-1] \cdot (V_{out1}[n]-\alpha_{m21}[n] \cdot V_{d2}[n-1]) \quad (34)$$

The correction or error removal can be done using the following correction equations:

$$V_{out1\_KB}[n] = V_{out1}[n] - \alpha_{m21}V_{d2}[n-1] + \alpha_{m21}\frac{C_2}{C_{d2}}V_{out1}[n-1] - \alpha_{m21}\frac{C_2}{C_{d2}}V_{DAC2}[n-1] \text{ and} \quad (35)$$

$$V_{out1_{cal}}[n] = V_{out1}[n] - \alpha_{m21}V_{d2}[n-1] + \alpha_{m21}\frac{C_2}{C_{d2}}V_{out1}[n-1] - \alpha_{m21}\frac{C_2}{C_{d2}}V_{DAC2}[n-1] - \alpha_{m11}V_{DAC2}[n-1] \quad (36)$$

In equation (36), the quantization error is effectively removed using the dither-1 correlation and ratio-metric capacitances, which was made possible because of the absence of the self-memory term. Therefore, in the absence of self-memory, all the kick-back errors can be effectively removed using ratio-metric capacitances using the traditional calibration dither injection. The memory parameters are given by:

$$\alpha_{m11} \sim \alpha_{KB1} \text{ and} \quad (37)$$

$$\alpha_{m21} \sim -\alpha_{KB1}\frac{\alpha_{RST2}C_{d2}}{C_2 + C_{d2} + C_{p2}} \quad (38)$$

Therefore, using traditional IGE dither injection alone, it is possible to approximately remove the inter-stage memory and kick-back errors in open-loop amplifiers. If the self-memory term is negligible, the removal of the kick-back errors is complete. The choice of the right implementation depends on the assumptions and behavior in the analog circuits. However, there are limitations to this method that makes it difficult to handle the most general cases.

Figure 47:
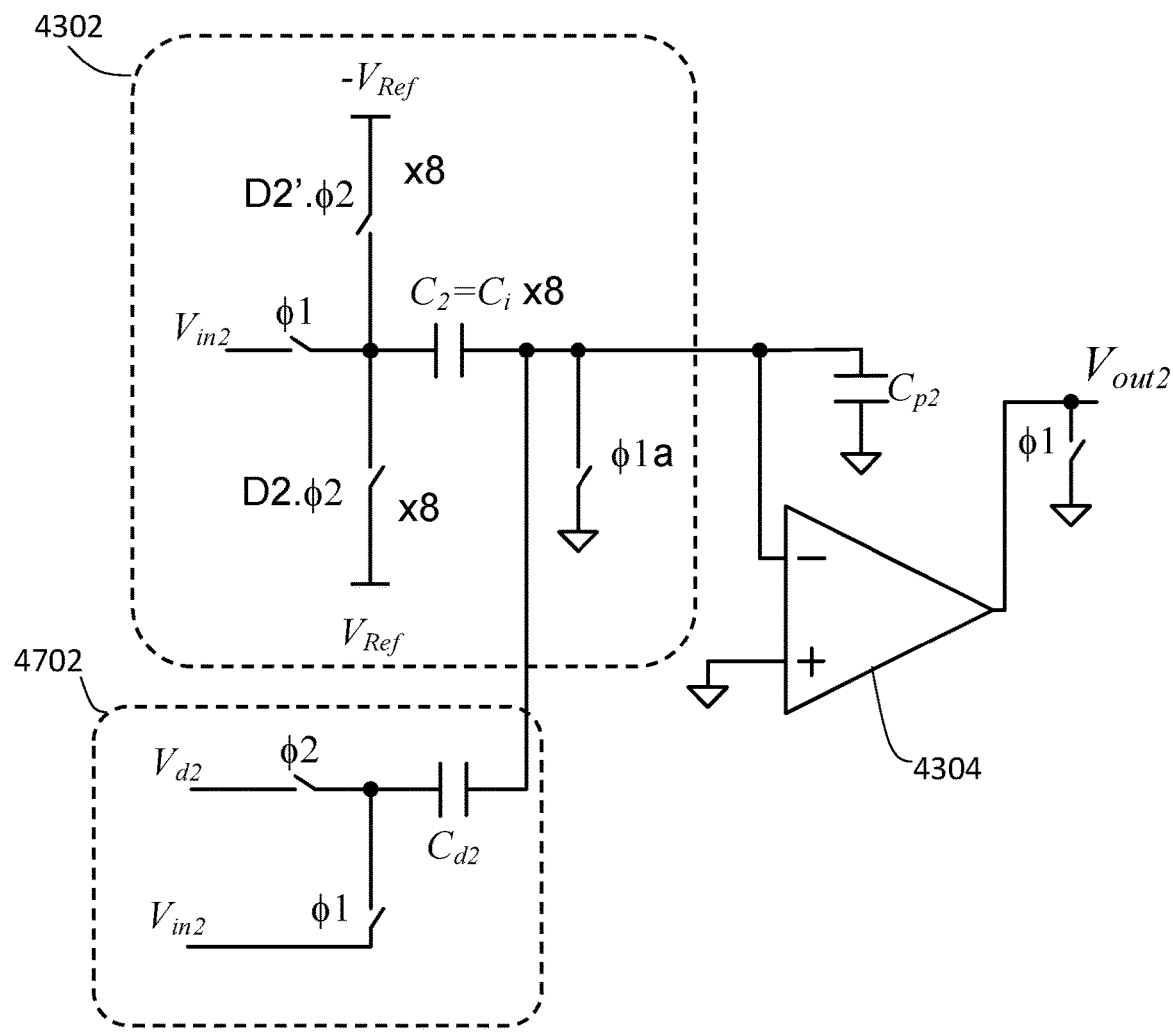
FIG. 47 shows an open-loop multiplying digital-to-analog converter, according to some embodiments of the disclosure.

In some embodiments, the calibration dither signal ("Cal Dither-2") in stage-2 can be connected to the input during the sampling phase (φ1), instead of being grounded. FIG. 47 shows an open-loop MDAC 4700 modifying the open-loop MDAC 4300 of FIG. 43, according to some embodiments of the disclosure. The open-loop MDAC is part of stage-2, illustrating the injection of the calibration dither signal being connected to the input in the sampling phase (φ1) instead of being connected to ground. While the exemplary open-loop MDAC 4700 is used in stage-2, it is appreciated that the same dither injection technique can be applied to other stages as well. Switched capacitor circuitry 4702 is different from the switched capacitor circuitry 4306 of FIG. 43. Specifically, the capacitor $C_{d2}$ in switched capacitor circuitry 4702 is connected to the input $V_{in2}$ during the sampling phase φ1 (instead of to ground, as seen in FIG. 43). This dither injection technique is preferred over the technique illustrated in FIG. 43, because it can enable this calibration to capture the IGE, the KB and the IME effectively in open-loop MDACs, improves noise performance, and address the limitations of the traditional calibration dither (seen in FIG. 43). The IGE calibration of stage-2 using this kick-back calibration dither signal $V_{d2}$ of FIG. 47 is performed as follows, using the following LMS update equation:

$$\alpha_2[n+1] = \alpha_2[n] + \mu \cdot V_{d2}[n] \cdot (V_{out2}[n] - \alpha_2[n] \cdot V_{out2}[n]) \quad (39)$$

or using:

$$\alpha_2[n+1] = \alpha_2[n] + \mu \cdot \mathrm{sgn}(V_{d2}[n]) \cdot \mathrm{sgn}(V_{out2}[n] - \alpha_2[n] \cdot V_{d2}[n]) \quad (40)$$

This is similar to how the IGE calibration is done using IGE dither, which is grounded in the sampling phase, as seen in FIG. 43.

In this case of the kick-back calibration dither signal $V_{d2}$ of FIG. 47, the kick-back voltage is given by:

$$V_{KB\_OL1}[n] = \alpha_{KB1}\left(V_{DAC2}[n-1]\frac{C_2}{C_2+C_{d2}} + V_{d2}[n-1]\frac{C_{d2}}{C_2+C_{d2}} - \alpha_{RST2}V_{DAC2}[n-1]\frac{C_2}{C_2+C_{d2}+C_{p2}} + \alpha_{RST2}V_{in2}[n-1]\frac{C_2+C_{d2}}{C_2+C_{d2}+C_{p2}} - \alpha_{RST2}V_{d2}[n-1]\frac{C_{d2}}{C_2+C_{d2}+C_{p2}}\right) \quad (41)$$

Therefore, the stage-1 output voltage is given by:

$$V_{out1}[n] = V_{out1_{nomem}}[n] + \alpha_{m1}V_{out1}[n-1] + \alpha_{KB1}\left(V_{DAC2}[n-1]\frac{C_2}{C_2+C_{d2}} + V_{d2}[n-1]\frac{C_2}{C_2+C_{d2}} - \alpha_{RST2}V_{DAC2}[n-1]\frac{C_2}{C_2+C_{d2}+C_{p2}} + \alpha_{RST2}V_{out1}[n-1]\frac{C_2+C_{d2}}{C_2+C_{d2}+C_{p2}} - \alpha_{RST2}V_{d2}[n-1]\frac{C_{d2}}{C_2+C_{d2}+C_{p2}}\right) \quad (42)$$

When correlating the stage-1 output with the calibration dither signal $V_{d1}$ and calibration dither signal $V_{d2}$, e.g., as shown in equations (24) and (25), or (26) and (27), (29a) and (30a), or (29b) and (30b), the calibrated output is:

$$V_{out1_{cal}}[n] = V_{out1}[n] - \alpha_{m21}V_{d2}[n-1] - \alpha_{m21}\frac{C_2}{C_{d2}}V_{DAC2}[n-1] - \alpha_{m11}V_{out1}[n-1] \quad (43)$$

That is, the calibration dither signal $V_{d2}$ is used to remove the kick-back components from the DAC2 (DAC in stage-2) and the calibration dither signal $V_{d2}$, while the calibration dither signal $V_{d1}$ is used to remove the memory components of the output. In equation (43), all the parameters are independent of $\alpha_{RST2}$ and the parasitic capacitance $C_{p2}$. In this case, the convergence parameters obtained using equation (24) and (25) are given by:

$$\alpha_{m11} \sim \alpha_{m1} + \alpha_{KB1}\alpha_{RST2}\frac{C_2+C_{d2}}{C_2+C_{d2}+C_{p2}} \quad \text{and} \quad (44)$$

$$\alpha_{m21} \sim \alpha_{KB1}C_{d2}\left(\frac{1}{C_2+C_{d2}} - \frac{\alpha_{RST2}}{C_2+C_{d2}+C_{p2}}\right) \quad (45)$$

Therefore, this dither injection technique illustrated by FIG. 47 is capable of enabling the accurate removal of all sources of error, dithers, and quantization errors due to IME, IGE, and KB, while ensuring ratio-metric correction that is independent of parasitic capacitances without additional complexity compared to closed-loop MDACs. The technique make uses only two correlators (or two counters, depending on the calibration technique).

If the quantization error and dither kick-back from stage-2 on stage-1 can be ignored, equation (42) can be reduced to:

$$V_{out1}[n] \sim V_{out1_{nomem}}[n] + \alpha_{m1}V_{out1}[n-1] + \alpha_{KB1}V_{out1}[n-1] \quad (46)$$

In this case, only $\alpha_{m11}$ is needed to correct the IME and kick-back error in stage-1, and therefore, the technique would make use just only one correlator.

In addition to its effectiveness in removing the error components, this structure has a noise benefit. Since both the dither and input capacitances sample the input, the input-referred noise improves. The noise improves even if the total sampling capacitance is not increased. To fully take advantage of this noise improvement, while avoiding over-ranging the amplifier, the reference voltage of the DAC can be increased by the same factor. [this is not claimed] That is, if the total sampling capacitor is kept fixed at C:

$$\frac{v_{nKB}^2}{v_{nIGE}^2} \sim \frac{C+C_p}{C+C_p+C_d} \quad (47)$$

$v_{nKB}^2$ is the noise power using the KB dither method in this section, $v_{nIGE}^2$ is the noise power using the IGE dither seen in FIG. 43. The reference value needs to be scaled up by the same factor:

$$\frac{V_{Ref\_KB}}{V_{Ref\_IGE}} \sim \frac{C+C_d}{C} \quad (48)$$

Referring back to FIG. 47, the reference voltage $V_{Ref}$ can be scaled up by $(C_2+C_{d2})/C_2$ to prevent over-ranging the amplifier.

Despite the differences between the open-loop and closed-loop MDACs, removing the different IGE, IME, and KB components does not require additional complexity. In fact, it can be simpler for the open-loop amplifier because of the charge sharing that takes place. This allows the same dither to be used for IGE, IME, and KB effectively. Using $V_{d1}$ and $V_{d2}$, all the memory and kick-back components of stage-1 can be removed.

Figure 48:
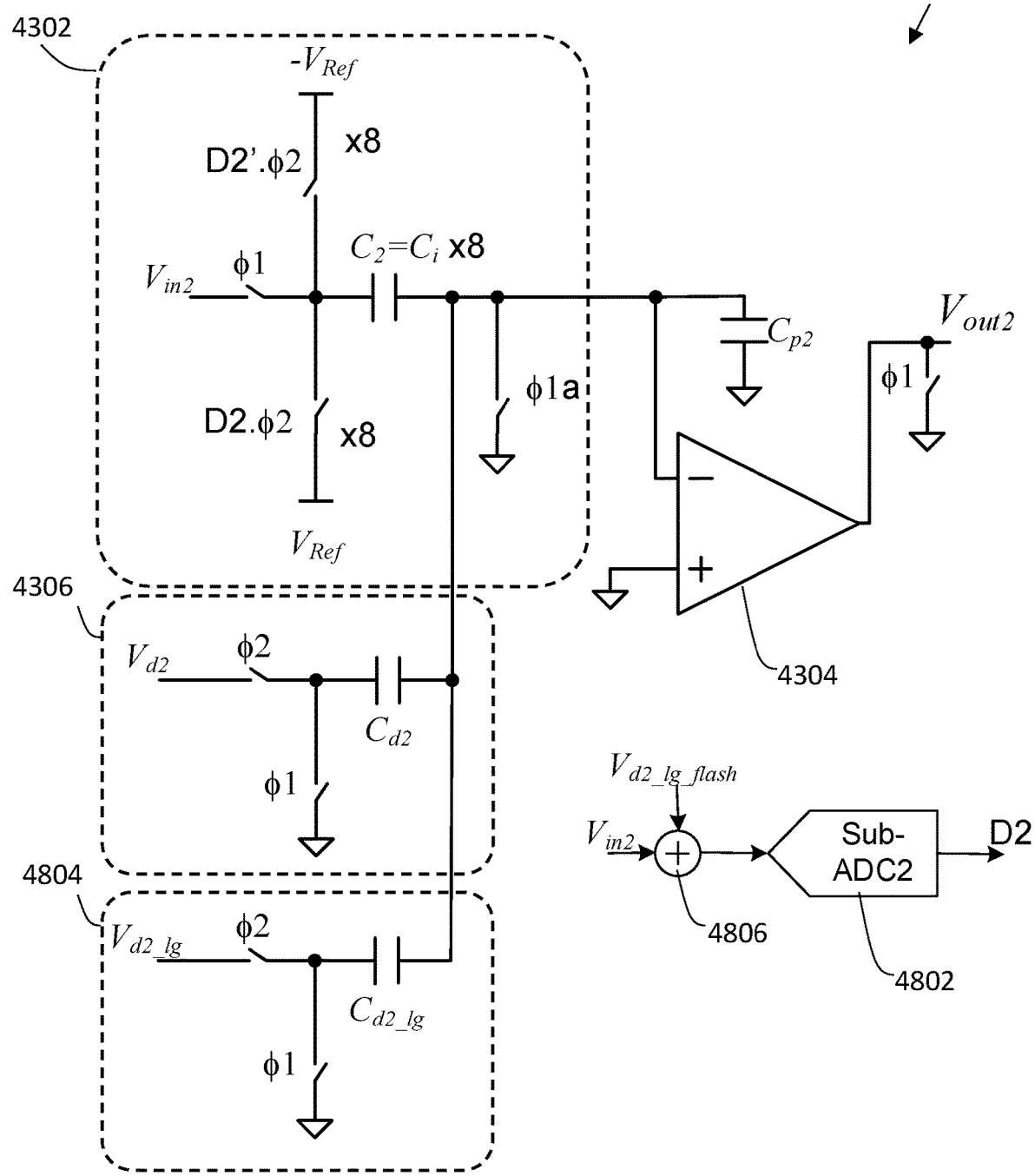
FIGS. 48-50 illustrate various techniques for calibration and linearization dither injection, according to some embodiments of the disclosure.

FIG. 48 illustrates circuitry 4800 with both linearization and calibration dither injection, according to some embodiments of the disclosure. The circuitry 4800 includes open-loop MDAC 4300 and sub-ADC2 (flash ADC) 4802. As an example, the circuitry 4800 is in stage-2 (but the teachings are applicable to other stages as well). The circuitry 4800 further includes switched capacitor circuitry 4804 for injecting charge into the switched capacitor circuitry 4302 based on the linearization dither voltage $V_{d2\_lg}$. The linearization dither signal is injected in a hold phase and the capacitance $C_{d2\_lg}$ is grounded in the sampling phase. Furthermore, linearization dither signal $V_{d2\_lg\_flash}$ can be injected to the analog input $V_{in2}$ by summation node 4806. $V_{d2\_lg\_flash}$ can be equal to $V_{d2\_lg} \times C_{d2\_lg}/C_2$. As a result, the linearization dither signal can be injected in both the MDAC and flash ADC. As seen in FIG. 48, both the linearization dither and the calibration dither are grounded in the sampling phase, the kick-back is given by:

$$V_{KB\_OL1} = \alpha_{KB1}\left(V_{DAC2} - \alpha_{RST2}V_{DAC2}\frac{C_2}{C_2 + C_{d2} + C_{d2\_lg} + C_{p2}} + \right. \tag{49}$$

$$\alpha_{RST2}V_{in2}\frac{C_2}{C_2 + C_{d2} + C_{d2\_lg} + C_{p2}} -$$

$$\alpha_{RST2}V_{d2}\frac{C_{d2}}{C_2 + C_{d2} + C_{d2\_lg} + C_{p2}} -$$

$$\left.\alpha_{RST2}V_{d2\_lg}\frac{C_{d2\_lg}}{C_2 + C_{d2} + C_{d2\_lg} + C_{p2}}\right)$$

Therefore, the output of stage-1 is given by:

$$V_{out1}[n] = V_{out1_{nomem}}[n] + \alpha_{KB1}\left(V_{DAC2}[n-1] - \right. \tag{50}$$

$$\alpha_{RST2}V_{DAC2}[n-1]\frac{C_2}{C_2 + C_{d2} + C_{d2\_lg} + C_{p2}} +$$

$$\alpha_{RST2}V_{out1}[n-1]\frac{C_2}{C_2 + C_{d2} + C_{d2\_lg} + C_{p2}} -$$

$$\alpha_{RST2}V_{d2}[n-1]\frac{C_{d2}}{C_2 + C_{d2} + C_{d2\_lg} + C_{p2}} -$$

$$\left.\alpha_{RST2}V_{d2\_lg}[n-1]\frac{C_{d2\_lg}}{C_2 + C_{d2} + C_{d2\_lg} + C_{p2}}\right)$$

Using the LMS update equations as shown in, e.g., equations (24) to (25) or (26) to (27), the calibrated output is given by:

$$V_{out1_{cal}}[n] = V_{out1}[n] - \alpha_{m21}V_{d2}[n-1] - \alpha_{m21}\frac{C_2}{C_{d2}}V_{DAC2}[n-1] + \tag{51}$$

$$\alpha_{m21}\frac{C_2}{C_{d2}}V_{out1}[n-1] - \alpha_{m11}V_{out1}[n-1] - \alpha_{m21}\frac{C_{d2\_lg}}{C_{d2}}V_{d2\_lg}[n-1]$$

Therefore, using IGE dither that is grounded in the sampling phase, it is possible to partially calibrate the kick-back and memory terms, but some of the quantization error kick-back $\alpha_{KB1}V_{out1q}[n-1]$ would remain.

If the self-memory term $\alpha_{m1}$ is negligible, then the correlation can be done using equations (33) and (34). That is:

$$\alpha_{m11}[n+1] = \alpha_{m11}[n] + \mu \cdot V_{d1}[n-1] \cdot (V_{out1\_KB}[n] - \alpha_{m11}[n] \cdot V_{DAC2}[n-1]) \tag{52}$$

and $$\alpha_{m21}[n+1] = \alpha_{m21}[n] + \mu \cdot V_{d2}[n-1] \cdot (V_{out1}[n] - \alpha_{m21}[n] \cdot V_{d2}[n-1]) \tag{53}$$

The correction can be done using:

$$V_{out1_{cal}}[n] = V_{out1}[n] - \alpha_{m21}V_{d2}[n-1] - \tag{54}$$

$$\alpha_{m21}\frac{C_2}{C_{d2}}V_{DAC2}[n-1] + \alpha_{m21}\frac{C_2}{C_{d2}}V_{out1}[n-1] -$$

$$\alpha_{m21}\frac{C_{d2\_lg}}{C_{d2}}V_{d2\_lg}[n-1] - \alpha_{m11}V_{DAC2}[n-1]$$

Therefore, in the absence of self-memory in stage-1, the IGE dither grounded in the sampling phase in stages 1 and 2, can effectively remove all errors due to kick-back from stage-2 onto stage-1.

Figure 49:
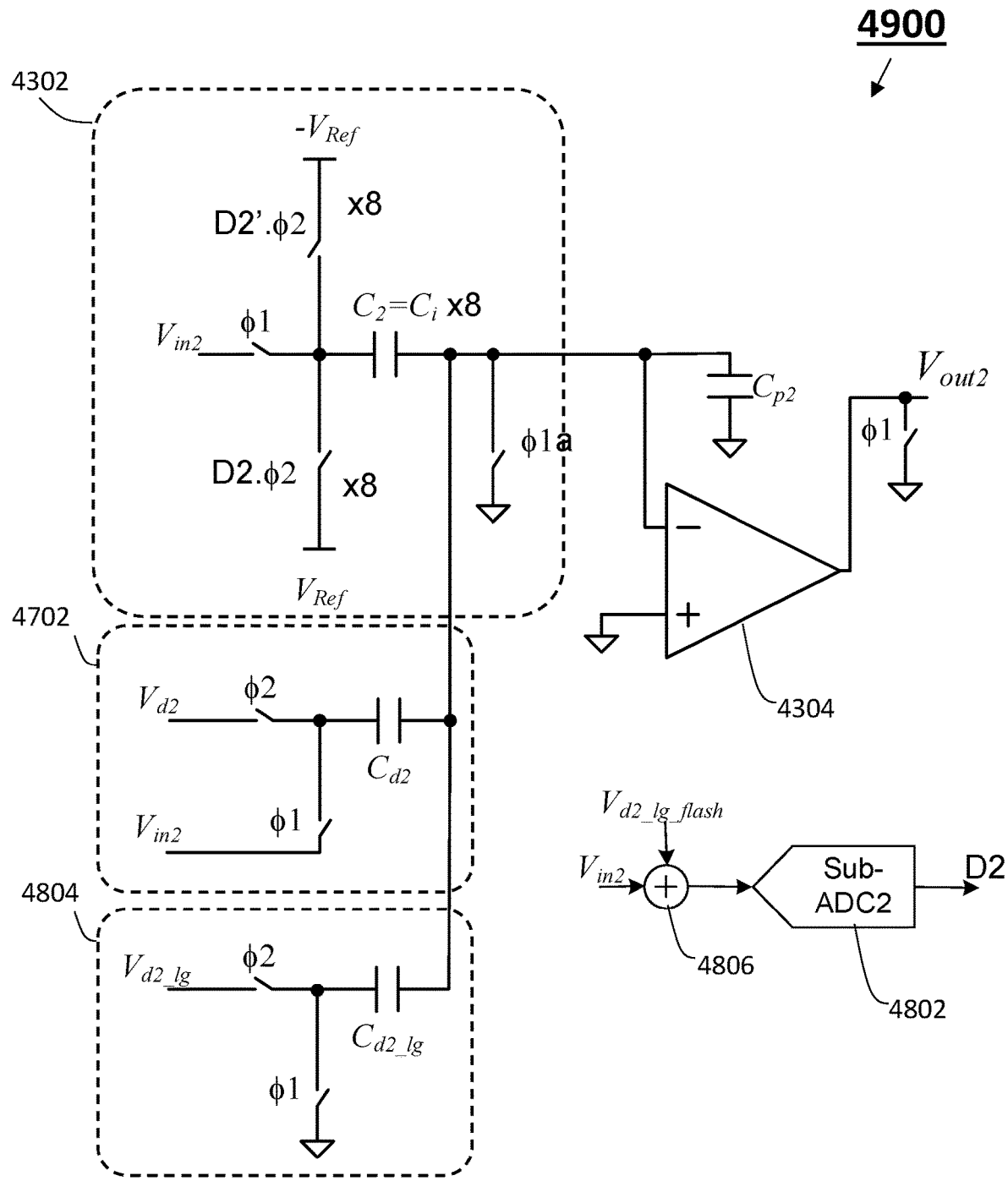

FIG. 49 illustrates circuitry 4900 with both linearization and calibration dither injection, according to some embodiments of the disclosure. As an example, the circuitry 4900 is in stage-2 (but the teachings are applicable to other stages as well). Circuitry 4900 has switched capacitor circuitry 4702 for injecting a kick-back calibration dither, where the capacitor $C_{d2}$ in switched capacitor circuitry 4702 is connected to the input $V_{in2}$ during the sampling phase $\phi 1$. Circuitry 4900 also includes switched capacitor circuitry 4804 for injecting charge into the switched capacitor circuitry 4302 based on the linearization dither voltage $V_{d2\_lg}$, where capacitance $C_{d2\_lg}$ is grounded in the sampling phase $\phi 1$. The MDAC reference $V_{Ref}$ can be scaled up by $(C_2 + C_{d2})/C_2$ to prevent over-ranging the amplifier If kick-back calibration dither is used in conjunction with linearization (large) dither, such that the calibration dither is connected to the input in the sampling phase, while the large dither capacitance $C_{d2\_lg}$ is grounded, the kick-back voltage can be given by:

$$V_{KB\_OL\_RST} = \tag{55}$$

$$\alpha_{KB}\left(V_{DAC}\frac{C}{C + C_d} + V_d\frac{C_d}{C + C_d} - \alpha_{RST}V_{DAC}\frac{C}{C + C_d + C_{d\_lg} + C_p} + \right.$$

$$\alpha_{RST}V_{in}\frac{C + C_d}{C + C_d + C_{d\_lg} + C_p} - \alpha_{RST}V_d\frac{C_d}{C + C_d + C_{d\_lg} + C_p} -$$

$$\left.\alpha_{RST}V_{d\_lg}\frac{C_{d\_lg}}{C + C_d + C_{d\_lg} + C_p}\right)$$

The output of stage-1 due to the memory effect of this kick-back from stage-2 is given by:

$$V_{out1}[n] = \tag{56}$$

$$V_{out1_{nomem}}[n] + \alpha_{KB1}\left(V_{DAC2}[n-1]\frac{C_2}{C_2 + C_{d2}} - \alpha_{RST2}V_{DAC2}[n-1]\right.$$

$$\frac{C_2}{C_2 + C_{d2} + C_{d2\_lg} + C_{p2}} + \alpha_{RST2}V_{out1}[n-1]$$

$$\frac{C_2 + C_{d2}}{C_2 + C_{d2} + C_{d2\_lg} + C_{p2}} + V_{d2}[n-1]\frac{C_{d2}}{C_2 + C_{d2}} -$$

-continued $$\alpha_{RST2} V_{d2}[n-1] \frac{C_{d2}}{C_2 + C_{d2} + C_{d2\_lg} + C_{p2}} -$$

$$\alpha_{RST2} V_{d2\_lg}[n-1] \frac{C_{d2\_lg}}{C_2 + C_{d2} + C_{d2\_lg} + C_{p2}} \Bigg)$$

The correlators of, e.g., equations (24) and (25), or (29a) and (30a), or the counters in (26) and (27) or (29b) and (30b), can be used to remove the KB and IME components as described previously:

$$\alpha_{m21}[n+1] = \alpha_{m21}[n] + \mu \cdot V_{d2}[n-1] \cdot V_{out1_{cal}}[n] \quad (57)$$

and $$\alpha_{m11}[n+1] = \alpha_{m11}[n] + \mu \cdot V_{d1}[n-1] \cdot V_{out1_{cal}}[n] \quad (58)$$

However, from equation (56), if the resetting of the summing node is not complete, the large dither coefficient can be different from that of the calibration dither. Therefore, it is preferable to have an additional correlator to effectively remove it before applying equations (57) and (58), such that:

$$\alpha_{m21\_lg}[n+1] = \qquad (59)$$
$$\alpha_{m21\_lg}[n] + \mu \cdot V_{d2\_lg}[n-1] \cdot (V_{out1}[n] - \alpha_{m21\_lg}[n] \cdot V_{d2\_lg}[n-1])$$

Equation (59) correlates the linearization dither and the output of the stage-1 with an estimate of the linearization dither removed. The estimate of the linearization dither is an estimate of an amount of kick-back attributed to the linearization dither injected in stage-2. The memory parameters are given by:

$$\alpha_{m11} \sim \alpha_{m1} + \alpha_{KB1} \alpha_{RST2} \frac{C_2 + C_{d2}}{C_2 + C_{d2} + C_{d2\_lg} + C_{p2}} \text{ and} \quad (60)$$

$$\alpha_{m21} \sim \alpha_{KB1} C_{d2} \left( \frac{1}{C_2 + C_{d2}} - \frac{\alpha_{RST2}}{C_2 + C_{d2} + C_{d2\_lg} + C_{p2}} \right) \text{ and} \quad (61)$$

$$\alpha_{m21\_lg} \sim \alpha_{KB1} \alpha_{RST2} \frac{C_{d2\_lg}}{C_2 + C_{d2} + C_{d2\_lg} + C_{p2}} \quad (62)$$

The corrected output is given by:

$$V_{out1_{cal}}[n] = V_{out1}[n] - \alpha_{m21} V_{d2}[n-1] - \alpha_{m21} \frac{C_2}{C_{d2}} V_{DAC2}[n-1] - \quad (63)$$
$$\alpha_{m11} V_{out1}[n-1] - \alpha_{m21\_lg} V_{d2\_lg}[n-1] \text{ and}$$

$$V_{out\_KB}[n] = V_{out1}[n] - \alpha_{m21} V_{d2}[n-1] - \quad (64)$$
$$\alpha_{m21} \frac{C_2}{C_{d2}} V_{DAC2}[n-1] - \alpha_{m21\_lg} V_{d2\_lg}[n-1]$$

The calibrated output $V_{out1_{cal}}$ can then be plugged into equations (57) and (58).

Therefore, all the memory and kick-back components can be effectively removed. The cost is an additional correlator (or counter). The following passages describes a method that does not require the additional counter.

Figure 50:
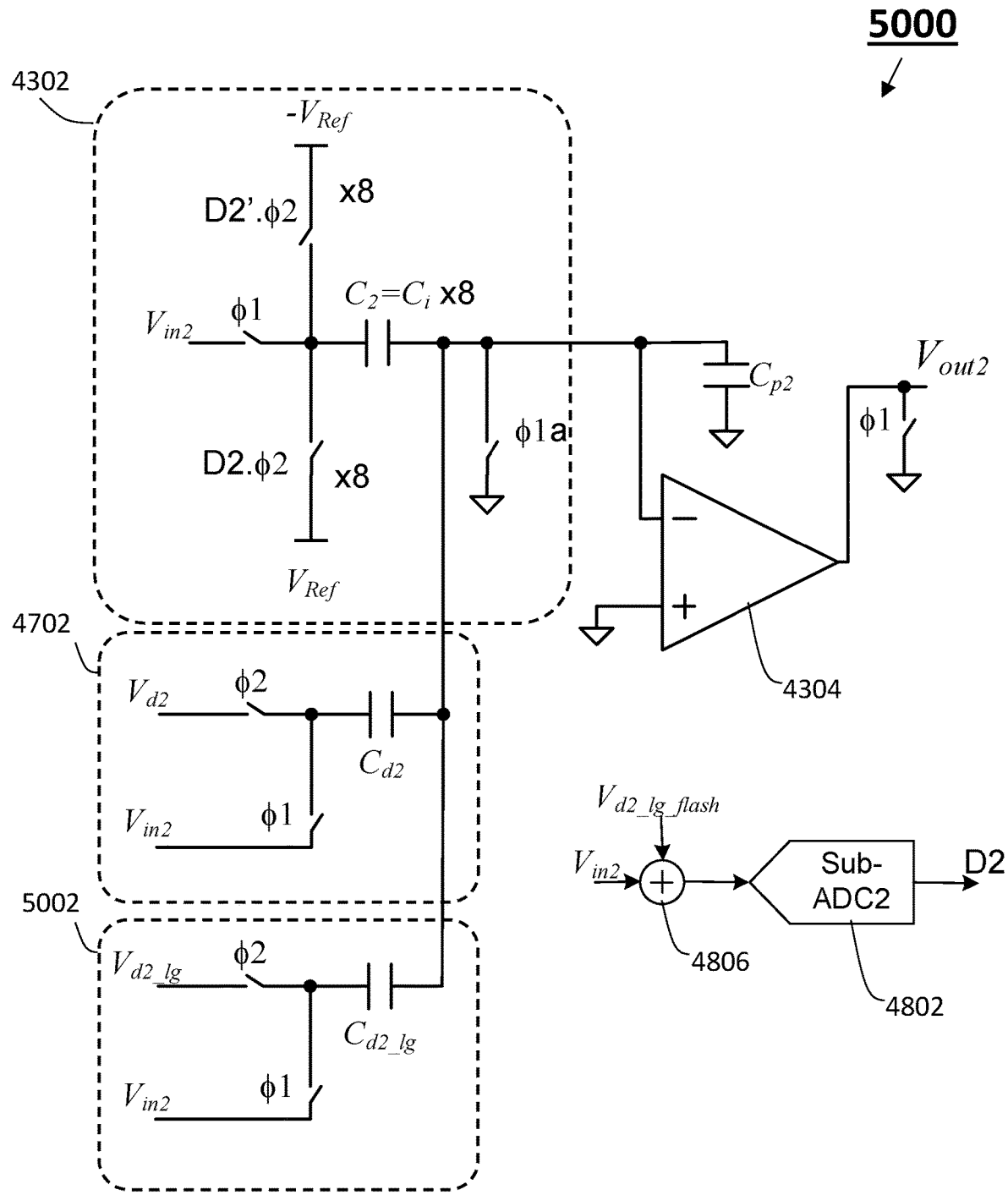

FIG. 50 illustrates circuitry 5000 with both linearization and calibration dither injection, according to some embodiments of the disclosure. As an example, the circuitry 5000 is in stage-2 (but the teachings are applicable to other stages as well). Circuitry 5000 has switched capacitor circuitry 4702 for injecting a kick-back calibration dither, where the capacitor $C_{d2}$ in switched capacitor circuitry 4702 is connected to the input $V_{in2}$ during the sampling phase $\phi1$. Circuitry 5000 also includes switched capacitor circuitry 5002 for injecting charge into the switched capacitor circuitry 4302 based on the linearization dither voltage $V_{d2\_lg}$, where capacitance $C_{d2\_lg}$ is connected to the input $V_{in2}$ during the sampling phase $\phi1$.

If linearization (large) dither and the calibration dither are both connected to the input during the sampling phase, the analysis for kick-back and memory can be different. Specifically, the correction can be performed without needing an additional correlator, as discussed previously. For the implementation of large and calibration dither injection seen in FIG. 50, the kick-back voltage is given by:

$$V_{KB\_OL1} = \qquad (65)$$
$$\alpha_{KB1} \Bigg( V_{DAC2} \frac{C_2}{C_2 + C_{d2} + C_{d2\_lg}} + V_{d2} \frac{C_2}{C_2 + C_{d2} + C_{d2\_lg}} + V_{d2\_lg}$$
$$\frac{C_{d2\_lg}}{C_2 + C_{d2} + C_{d2\_lg}} - \alpha_{RST2} V_{DAC2} \frac{C_2}{C_2 + C_{d2} + C_{d2\_lg} + C_{p2}} -$$
$$\alpha_{RST2} V_{d2} \frac{C_2}{C_2 + C_{d2} + C_{d2\_lg} + C_{p2}} -$$
$$\alpha_{RST2} V_{d2\_lg} \frac{C_{d2\_lg}}{C_2 + C_{d2} + C_{d2\_lg} + C_{p2}} +$$
$$\alpha_{RST2} V_{in2} \frac{C_2 + C_{d2} + C_{d2\_lg}}{C_2 + C_{d2} + C_{d2\_lg} + C_{p2}} \Bigg)$$

Therefore, the output of stage-1 is given by:

$$V_{out1}[n] = V_{out1_{nomem}}[n] + \alpha_{m1} V_{out1}[n-1] + \quad (66)$$
$$\alpha_{KB1} \Bigg( \alpha_{RST2} V_{out1}[n-1] \frac{C_2 + C_{d2} + C_{d2\_lg}}{C_2 + C_{d2} + C_{d2\_lg} + C_{p2}} +$$
$$V_{DAC2}[n-1] \frac{C_2}{C_2 + C_{d2} + C_{d2\_lg}} + V_{d2}[n-1]$$
$$\frac{C_{d2}}{C_2 + C_{d2} + C_{d2\_lg}} + V_{d2\_lg}[n-1] \frac{C_{d2\_lg}}{C_2 + C_{d2} + C_{d2\_lg}} -$$
$$\alpha_{RST2} V_{DAC2}[n-1] \frac{C_2}{C_2 + C_{d2} + C_{d2\_lg} + C_{p2}} -$$
$$\alpha_{RST2} V_{d2}[n-1] \frac{C_{d2}}{C_2 + C_{d2} + C_{d2\_lg} + C_{p2}} -$$
$$\alpha_{RST2} V_{d2\_lg}[n-1] \frac{C_{d2\_lg}}{C_2 + C_{d2} + C_{d2\_lg} + C_{p2}} \Bigg)$$

The correlation is done similar to equations (29a) and (30a), such that:

$$\alpha_{m21}[n+1] = \alpha_{m21}[n] + \mu \cdot V_{d2}[n-1] \cdot V_{out1_{cal}}[n] \quad (67)$$

and $$\alpha_{m11}[n+1] = \alpha_{m11}[n] + \mu \cdot V_{d1}[n-1] \cdot V_{out1_{cal}}[n] \quad (68)$$

Equations (29b) and (30b) can also be used as follows:

$$\alpha_{m21}[n+1] = \alpha_{m21}[n] + \mu \cdot \text{sgn}(V_{d2}[n-1]) \cdot \text{sgn}(V_{out1_{cal}}[n]) \quad (69)$$

and $$\alpha_{m11}[n+1] = \alpha_{m11}[n] + \mu \cdot \text{sgn}(V_{d1}[n-1]) \cdot \text{sgn}(V_{out1_{cal}}[n]) \quad (70)$$

The coefficient $\alpha_{m21}$ is used to subtract the large dither with the proper capacitive scaling, in addition to the KB components, which gives:

$$V_{out1\_KB}[n] = V_{out1}[n] - \alpha_{m21}V_{d2}[n-1] - \quad (71)$$
$$\alpha_{m21}\frac{C_2}{C_{d2}}V_{DAC2}[n-1] - \alpha_{m21}\frac{C_{d2\_lg}}{C_{d2}}V_{d2\_lg}[n-1] \text{ and}$$

$$V_{out1_{cal}}[n] = V_{out1}[n] - \alpha_{m21}V_{d2}[n-1] - \alpha_{m21}\frac{C_2}{C_{d2}}V_{DAC2}[n-1] - \quad (72)$$
$$\alpha_{m11}V_{out1}[n-1] - \alpha_{m21}\frac{C_{d2\_lg}}{C_{d2}}V_{d2\_lg}[n-1]$$

The convergence parameters are similar to equations (44) and (45):

$$\alpha_{m11} \sim \alpha_{m1} + \alpha_{KB1}\alpha_{RST2}\frac{C_2 + C_{d2}}{C_2 + C_{d2} + C_{d2\_lg} + C_{p2}} \text{ and} \quad (73)$$

$$\alpha_{m21} \sim \alpha_{KB1}C_{d2}\left(\frac{1}{C_2 + C_{d2}} - \frac{\alpha_{RST2}}{C_2 + C_{d2} + C_{d2\_lg} + C_{p2}}\right) \quad (74)$$

In addition to its effectiveness in removing the error components, this structure has a noise benefit as discussed previously. Since both the dithers and input capacitances sample the input, the input-referred noise improves. The noise improves even if the total sampling capacitance is not increased. To fully take advantage of this noise improvement, while avoiding over-ranging the amplifier, the reference voltage of the DAC can be increased by the same factor. That is, if the total sampling capacitor is kept fixed at C:

$$\frac{v_{nKB}^2}{v_{nIGE}^2} \sim \frac{C + C_p}{C + C_p + C_d + C_{d\_lg}} \quad (75)$$

$V_{nKB}^2$ is the noise power using the KB dither (connected to the input during the sampling phase), $v_{nIGE}^2$ is the noise power using the IGE dither (connected to ground during the sampling phase). The reference value needs to be scaled up by the same factor:

$$\frac{V_{Ref\_KB}}{V_{Ref\_IGE}} \sim \frac{C + C_d + C_{d\_lg}}{C} \quad (76)$$

Referring back to FIG. 50, the MDAC reference $V_{RefF}$ can be scaled up by $(C_2+C_{d2}+C_{d2\_lg})/C_2$ to prevent over-ranging the amplifier.

Amplifier Sharing

An advantage of the open-loop amplifier structures described herein is that it simplifies sharing the amplifier between multiple stages and/or slices of an ADC.

Figure 51:
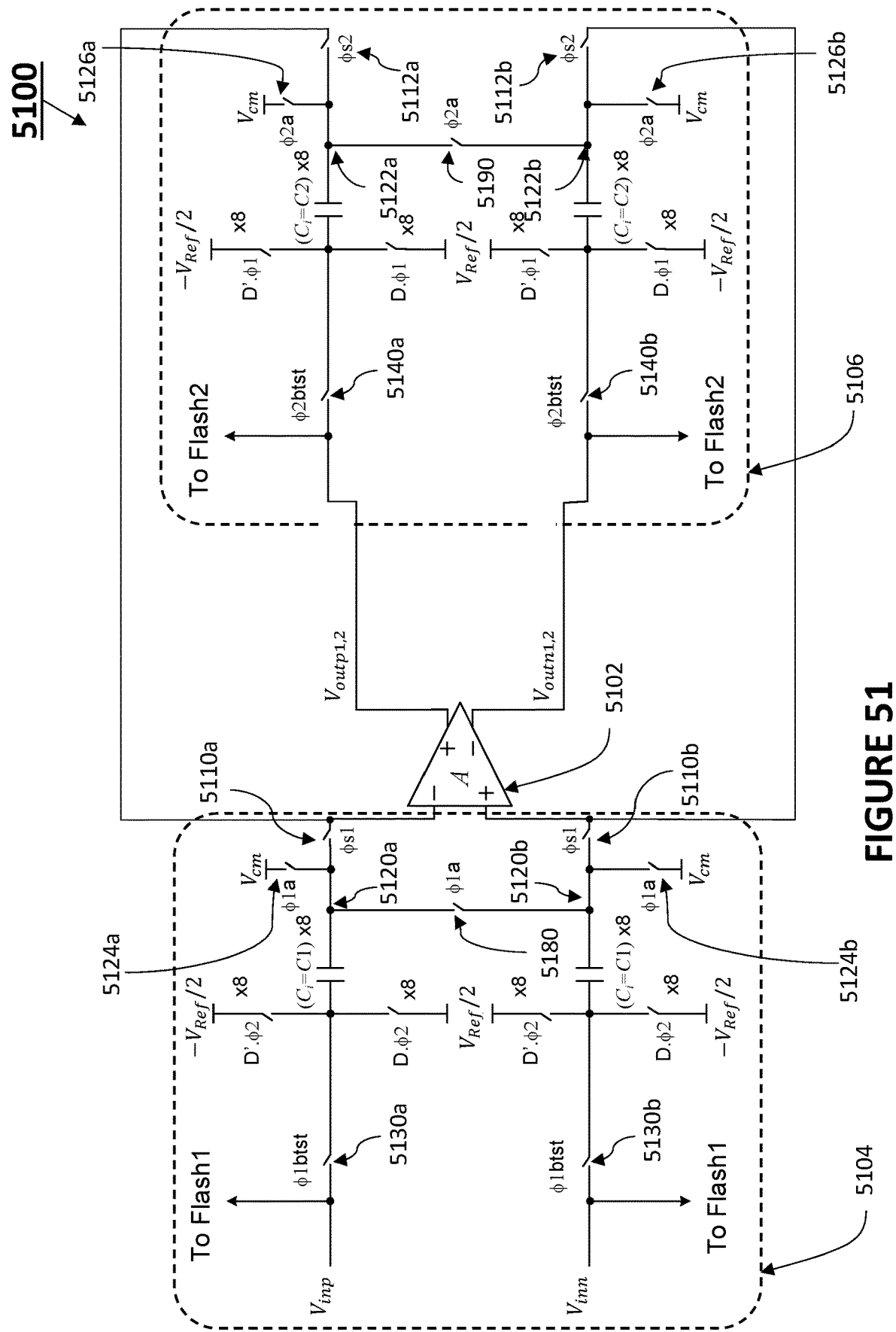
FIG. 51 illustrate amplifier sharing, according to some embodiments of the disclosure.

FIG. 51 illustrate amplifier sharing between multiple stages of a pipelined ADC, according to some embodiments of the disclosure. Circuitry 5100 has two stages, stage-1 and stage-2, where both stages use the open-loop same amplifier 5102. Stage-1 is to receive and sample an analog input signal of the pipelined ADC. Stage-2 is receive and sample the amplified residue signal generated in stage-1. The open-loop amplifier 5102 can be implemented with the open-loop amplifiers described herein. Similar to other MDAC circuits described herein, stage-1 has switched capacitor circuit 5104 for performing sampling and DAC operations, and stage-2 has switched capacitor circuit 5106 for performing sampling and DAC operations. Stage-1 is to perform sampling of the analog input signal (e.g., $V_{inp}$ and $V_{inn}$) and perform digital-to-analog conversion (based on output bits of a DAC in stage-1). Stage-1 is to perform sampling of the amplified residue signal of stage-1 (e.g., $V_{outp1}$ and $V_{outn1}$) and perform digital-to-analog conversion (based on output bits of a DAC in stage-2). Switched capacitor circuit 5104 generates a first residue signal for stage-1 at summing nodes 5120a and 5120b. Switched capacitor circuit 5106 generates a second residue signal for stage-2 at summing nodes 5122a and 5122b. The shared open-loop amplifier 5102 amplifies the first residue signal generated in the stage-1 during a first time period. The open-loop amplifier 5102 generates a first amplified residue signal, i.e., $V_{outp1}$ and $V_{outn1}$. The shared open-loop amplifier 5102 amplifies the second residue signal generated in stage-2 during a second/different time period. The open-loop amplifier 5102 generates a second amplified residue signal, i.e., $V_{outp2}$ and $V_{outn2}$.

Switched capacitor circuit 5104 includes a first set of sampling capacitors shown as $(C_i-C1)\times 8$ in this example. Switched capacitor circuit 5106 includes a second set of sampling capacitors shown as $(C_i-C2)\times 8$. The number of capacitors in each set can depend on the resolution of the ADC and DAC in the respective stages. The top plates of the first set of sampling capacitors, and the second set of sampling capacitors are selectively coupled to a positive or negative voltage reference (e.g., $-V_{Ref/2}$ or $V_{Ref/2}$) when performing DAC operations. The bottom plates of the first set of sampling capacitors $(C_i-C1)\times 8$ are connected together, forming the summing nodes 5120a and 5120b. The bottom plates of the second set of sampling capacitors $(C_i-C2)\times 8$ are connected together, forming the summing nodes 5122a and 5122b.

Switched capacitor circuit 5104 for stage-1 includes input switches 5130a and 5130b, associated with φ1 (or φ1btst if the switches are bootstrapped). When closed, the input switches 5130a and 5130b connects top plates of sampling capacitors $(C_i-C1)\times 8$ to the inputs $V_{inp}$ and $V_{inn}$. Switched capacitor circuit 5104 for stage-1 includes sampling switches 5124a and 5124b, associated with φ1a. When closed, the sampling switches 5124a and 5124b connect the bottom plates of the sampling capacitors $(C_i-C1)\times 8$ to a common-mode voltage $V_{cm}$. The sampling switches 5124a and 5124b are advanced, meaning that the sampling switches 5124a and 5124b opens before the input switches 5130a and 5130b are opened (e.g., to perform bottom plate sampling). Switched capacitor circuit 5104 also includes common-mode switch 5180, associated with φ1a. When closed, the common-mode switch 5180 connects the summing nodes 5120a and 5120b together. Switched capacitor circuit 5104 includes switches 5110a and 5110b, associated with φs1. Switches 5110a and 5110b can serve as selection switches, which controls whether the open-loop amplifier 5102 is amplifying the residue signal at the summing nodes 5120a and 5120b. When closed, switches 5110a and 5110b connect the summing nodes 5120a and 5120b to noninverting and inverting inputs of the open-loop amplifier 5102 respectively.

Switched capacitor circuit 5106 for stage-2 includes input switches 5140a and 5140b, associated with φ2 (or φ2btst if the switches are bootstrapped). When closed, the input switches 5140a and 5140b connects top plates of sampling capacitors $(C_i-C2)\times 8$ to the amplifier outputs to receive $V_{outp1}$ and $V_{outn1}$. Switched capacitor circuit 5106 for stage-2 includes sampling switches 5126a and 5126b, associated with ϕ2a. When closed, the sampling switches 5126a and 5126b connect the bottom plates of the sampling capacitors ($C_i$–C2)×8 to a common-mode voltage $V_{cm}$. The sampling switches 5126a and 5126b are advanced, meaning that the sampling switches 5126a and 5126b opens before the input switches 5140a and 5140b are opened (e.g., to perform bottom plate sampling). Switched capacitor circuit 5106 also includes common-mode switch 5190, associated with ϕ2a. When closed, the common-mode switch 5190 connects the summing nodes 5122a and 5122b together. Switched capacitor circuit 5106 includes switches 5112a and 5112b, associated with ϕs2. Switches 5112a and 5112b can serve as selection switches, which controls whether the open-loop amplifier 5102 is amplifying the residue signal at the summing nodes 5122a and 5122b. When closed, switches 5112a and 5112b connect the summing nodes 5122a and 5122b to noninverting and inverting inputs of the open-loop amplifier 5102 respectively.

The MDAC circuits in FIG. 51 omits certain circuit details for simplicity. One skilled in the art can appreciate that the MDAC circuits can be implemented based on the open-loop MDAC circuits described herein (e.g., including various dither injection techniques).

To share the same open-loop amplifier 5102, the outputs (i.e., residue) from stage-1's switched capacitor circuit 5104 are provided as inputs to open-loop amplifier 5102 during a first time period according to ϕs1. The outputs (i.e., residue) from stage-2's switched capacitor circuit 5106 is provided as inputs to open-loop amplifier 5102 to reuse the open-loop amplifier 5102 during a second/different time period according to ϕs2.

Switches controlled by phases ϕs1 (switch 5110a and switch 5110b at the output of stage-1's switched capacitor circuit 5104, connecting the output to the input of the open-loop amplifier 5102) and switches controlled by phases ϕs2 (switch 5112a and switch 5112b at the output of stage-2's switched capacitor circuit 5106) manages the sharing of the open-loop amplifier 5102 by coupling the proper signal to the inputs of the open-loop amplifier 5102.

During the first time period, the shared open-loop amplifier 5102 amplifies the residue signal at the summing nodes 5120a and 5120b. The amplified output (i.e., amplified residue signal of stage-1) at the output of open-loop amplifier 5102 ($V_{outn1}$) is provided as inputs to stage-2's switched capacitor circuit 5106. Switches 5110a and 5110b close to couple the summing nodes 5120a and 5120b to inputs of the open-loop amplifier 5102. Switches 5112a and 5112b are open to decouple the summing nodes 5122a and 5122b to inputs of the open-loop amplifier 5102.

During the second time period, the shared open-loop amplifier 5102 amplifies the residue signal at the summing nodes 5122a and 5122b. The amplified output (i.e., amplified residue signal of stage-2) at the output of open-loop amplifier 5102 ($V_{outn2}$) can be provided as inputs to stage-3 of the pipelined ADC. Switches 5112a and 5112b close to couple the summing nodes 5122a and 5122b to inputs of the open-loop amplifier 5102. Switches 5110a and 5110b are open to decouple the summing nodes 5120a and 5120b to inputs of the open-loop amplifier 5102.

Figure 52:
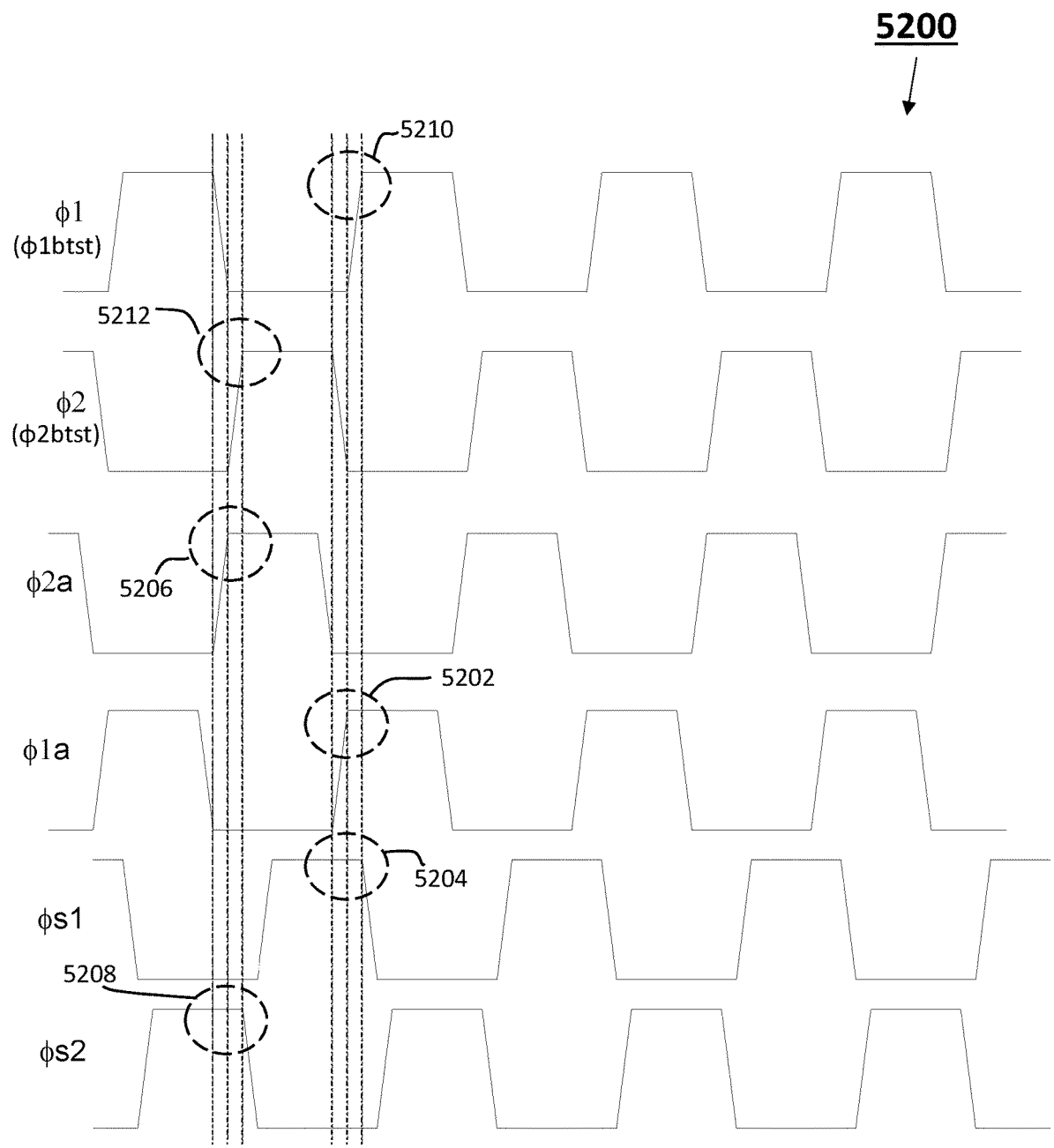
FIG. 52 show a timing diagram for the circuitry 5100 of FIG. 51, according to some embodiments of the disclosure.

FIG. 52 show a timing diagram 5200 for the circuitry 5100 of FIG. 51, according to some embodiments of the disclosure. To help reset the summing node, the clocks controlling the amplifier switching ϕs1 and ϕs2 are intentionally made to overlap with the sampling clocks ϕ1a and ϕ2a respectively.

ϕs1 overlaps with ϕ1a as indicated by circle 5202, and circle 5204. While switches 5110a and 5110b are closed, sampling switches 5124a and 5124b transitions from being open to closed. Moreover, while switches 5110a and 5110b are closed, common-mode switch 5180 is transitions from being open to closed. This helps the input nodes of the open-loop amplifier 5102 reset to the common-mode voltage before the open-loop amplifier 5102 is used to perform amplification of the residue signal from stage-2 (before ϕs2 transitions from low to high and closes switches 5112a and 5112b).

ϕs2 overlaps with ϕ2a as indicated by circle 5206 and circle 5208. While switches 5112a and 5112b are closed, sampling switches 5126a and 5126b transitions from being open to closed. Moreover, while switches 5112a and 5112b are closed, common-mode switch 5190 is transitions from being open to closed. This helps the input nodes of the open-loop amplifier 5102 reset to the common-mode voltage before the open-loop amplifier 5102 is used to perform amplification of the residue signal from stage-1 (before ϕs1 transitions from low to high and closes switches 5110a and 5110b).

ϕ1 and ϕ2 can be delayed a bit further in order to overlap with ϕ1a and ϕ2a respectively. This can reset/discharge the summing node capacitance, and remove its effect on the kick-back.

ϕ1 overlaps with ϕ1a as indicated by circle 5210 and circle 5202. After the switches associated with ϕ1a (e.g., sample switches 5124a and 5124b and common-mode switch 5180) close to reset the summing nodes 5120a and 5120b to a common-mode voltage, input switches 5130a and 5130b associated with ϕ1 closes. This helps to prevent kick-back from substantially affecting the sampling capacitors ($C_i$–C1)×8 and input nodes $V_{inp}$ and $V_{inn}$, by letting any capacitance at the summing nodes 5120a and 5120b to reset or discharge before connecting the sampling capacitors ($C_i$–C1)×8 to the input nodes $V_{inp}$ and $V_{inn}$.

ϕ2 overlaps with ϕ2a as indicated by circle 5212 and circle 5206. After the switches associated with ϕ2a (e.g., sample switches 5126a and 5126b and switch 5190) close to reset the summing nodes 5122a and 5122b to a common-mode voltage, input switches 5140a and 5140b associated with ϕ2 closes. This helps to prevent kick-back from substantially affecting the sampling capacitors ($C_i$–C2)×8 and input nodes (labeled as $V_{outp1,2}$ and $V_{outn1,2}$), by letting any capacitance at the summing nodes 5122a and 5122b to reset or discharge before connecting the sampling capacitors ($C_i$–C2)×8 to the input nodes (labeled as $V_{outp1,2}$ and $V_{outn1,2}$)

Using the IME and KB calibrations described previously, resetting the output of the amplifier between phases may be eliminated. A calibration dither can be injected in stage-1, and a further calibration dither can be injected in stage-2. The dithers can be used to extract kick-back and memory errors affecting the first stage and the second stage. In some cases, a linearization dither can be injected in stage-2 (in both the MDAC and sub-ADC). This reduces the clocking power that has been a drawback of sharing amplifiers. The effect of the memory error if the amplifier is shared can be given by:

$$V_{out1}[n] = V_{out1_{nomem}}[n] + \alpha_{KB1}( \quad (77)$$
$$V_{out1}[n-1] - \alpha_{q2}V_{outq1}[n-1] + \alpha_{d2}V_{d2}[n-1]) + \alpha_{21}V_{out2}[n-1]$$

Similarly, the output of stage-2 can have a memory component due to the kick-back from stage-3 plus another component due to the sharing of the amplifier between stage-1 and stage-2. This is represented as:

$$V_{out2}[n] = V_{out2_{nomem}}[n] + \qquad (78)$$
$$\alpha_{KB2}(V_{out2}[n-1] - \alpha_{q3}V_{outq2}[n-1] + \alpha_{d3}V_{d3}[n-1]) +$$
$$\alpha_{12}V_{out1}[n]$$

These equations describe the approximate behavior of the kick-back and memory terms due to kick-back and amplifier sharing. Using IME and KB calibrations, as described in the previously, these terms can be eliminated. Since the "memory" effect of stage-1 on stage-2 is because of the current stage-1 sample, $V_{out1}[n]$ appears in equation (78) instead of $V_{out1}[n-1]$. Therefore, the effect of amplifier sharing from stage-1 on stage-2 appears as a gain error term that can be captured by the IGE calibration of stage-1.

To remove the memory and kick-back terms in (77) and (78) with amplifier sharing, only two correlators are needed, which can be the same correlators given by equations (24) and (25). That is:

$$\alpha_{m21}[n+1] = \alpha_{m21}[n] + \mu \cdot V_{d2}[n-1] \cdot (V_{out1\_KB}[n] - \alpha_{m21}[n] \cdot V_{out2}[n-1]) \qquad (79)$$

and $$\alpha_{m11}[n+1] = \alpha_{m11}[n] + \mu \cdot V_{d1}[n-1] \cdot (V_{out1}[n] - \alpha_{m11}[n] \cdot V_{DAC2}[n-1]) \qquad (80)$$

The term $\alpha_{m11}$ that was used to describe the "self-memory" of stage-1, now describes the kick-back memory term in stage-1 output from stage-2. Any remaining memory on the output of stage-1 can be due to the memory from $V_{out2}$, and can be removed by $\alpha_{m21}$, because the rest of the memory that is due to kick-back has been effectively removed by $\alpha_{m11}$.

If IGE dither is used (grounded during the sampling phase), the corrected stage-1 output can be given by:

$$V_{out1_{cal}}[n] = V_{out1}[n] - \alpha_{m11}V_{DAC2}[n] - \alpha_{m21}V_{out2}[n-1] \qquad (81)$$

If KB dither is used (connected to the input during the sampling phase), the corrected stage-1 output can be given by:

$$V_{out1_{cal}}[n] = \qquad (82)$$
$$V_{out1}[n] - \alpha_{m11}V_{DAC2}[n] - \alpha_{m11}\frac{C_{d2}}{C_2}V_{d2}[n-1] - \alpha_{m21}V_{out2}[n-1]$$

If the quantization and dither components are negligible, equations (77) and (78) can be reduced to:

$$V_{out1}[n] \approx V_{out1_{nomem}}[n] + \alpha_{KB1}V_{out1}[n-1] + \alpha_{21}V_{out2}[n-1] \qquad (83)$$

and $$V_{out2}[n] \approx V_{out2_{nomem}}[n] + \alpha_{KB2}V_{out2}[n-1] + \alpha_{12}V_{out1}[n] \qquad (84)$$

Therefore, it is possible to remove any memory, kick-back, or gain error in the open-loop MDAC structure without any additional complexity. In fact, the complexity can be less compared to closed-loop amplifiers. In addition, any memory errors due to sharing amplifiers can also be calibrated without additional complexity.

Figure 53:
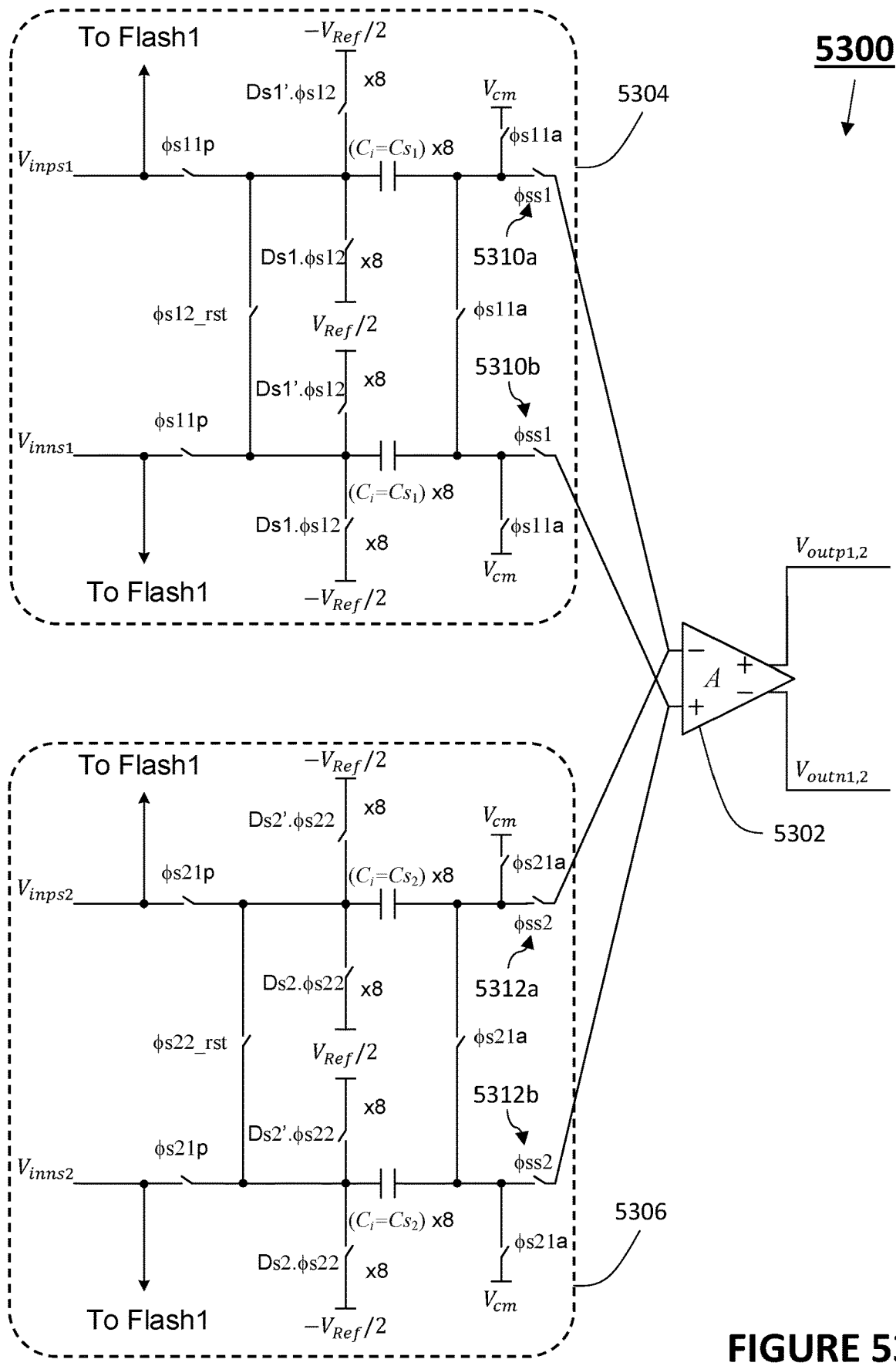
FIG. 53 illustrate amplifier sharing, according to some embodiments of the disclosure.

In some embodiments, amplifier sharing can be between different slices of a time-interleaved ADC. Different slices of a time-interleaved ADC samples the analog input one after another to increase the overall sampling rate of the ADC. FIG. 53 illustrate amplifier sharing different open-loop MDACs of a time-interleaved ADC, according to some embodiments of the disclosure. Circuitry 5300 has switched capacitor circuit 5304 in a stage-1 from a first slice/ADC of a time-interleaved ADC, and switched capacitor circuit 5306 in a stage-1 from a second slice/ADC of the time-interleaved ADC, where both stages from different slices of the time-interleaved ADC use the same open-loop amplifier 5302. The open-loop amplifier 5302 can be implemented with the open-loop amplifiers described herein. Similar to other MDAC circuits described herein, switched capacitor circuit 5304 and switched capacitor circuit 5306 both perform sampling and DAC operations. The MDAC circuits in FIG. 53 omits certain circuit details for simplicity. One skilled in the art can appreciate that the MDAC circuits can be implemented based on the open-loop MDAC circuits described herein (e.g., including various dither injection techniques). Furthermore, one skilled in the art can appreciate that the sharing of amplifiers can be done for other stages (besides stage-1) between different slices of a time-interleaved ADC.

Switches controlled by phases ϕss1 (switch 5310a and switch 5310b at the output of switched capacitor circuit 5304, connecting the output to the input of the open-loop amplifier 5302) and switches controlled by phases ϕss2 (switch 5312a and switch 5312b at the output of switched capacitor circuit 5304) manages the sharing of the open-loop amplifier 5302 by coupling the proper signal to the input of the open-loop amplifier 5302.

To share the same open-loop amplifier 5302, the outputs (i.e., residue signal for stage-1 of the first slice/ADC) from switched capacitor circuit 5304 are provided as inputs to open-loop amplifier 5302 (according to phase ϕss1). When closed, switches 5310a and 5310b connects summing nodes of switched capacitor circuit 5304 to inputs of the open-loop amplifier 5302. Open-loop amplifier 5302 generates an amplified residue signal for stage-1 of the first slice/ADC, e.g., $V_{outp1}$ and $V_{outm1}$. The outputs (i.e., residue signal for stage-1 of the second slice/ADC) from switched capacitor circuit 5306 is provided as inputs to open-loop amplifier 5302 to reuse the open-loop amplifier 5302 (during a different time period, according to phase ϕss2). When closed, switches 5312a and 5312b connects summing nodes of switched capacitor circuit 5306 to inputs of the open-loop amplifier 5302. Open-loop amplifier 5302 generates an amplified residue signal for stage-1 of the second slice/ADC, e.g., $V_{outp2}$ and $V_{outm2}$.

The shared open-loop amplifier 5302 can provide the output ({$V_{outp1}$ and $V_{outm1}$} or {$V_{outp2}$ and $V_{outm2}$}) to further circuitry that would process the different amplified residue signals.

In this scenario, the analysis is similar to the previous case of stage-sharing of FIG. 51, but with the memory elements being from the outputs of different slices.

The effect of the memory if the amplifier is shared between slices is given by:

$$V_{out1s1}[n] = V_{out1s1_{nomem}}[n] + \tag{85}$$
$$\alpha_{KB1s1}(V_{out1s1}[n-1] - \alpha_{q2s1}V_{outq1s1}[n-1] + \alpha_{d2s1}V_{d2s1}[n-1]) +$$
$$\alpha_{s21}V_{out1s2}[n-1]$$

Similarly, the output of stage-1 in the second slice can have a memory component due to the kick-back from its stage-2 plus another component due to the sharing of the amplifier between the slices. This is represented as:

$$V_{out1s2}[n] = V_{out1s2_{nomem}}[n] + \tag{86}$$
$$\alpha_{KB1s2}(V_{out1s2}[n-1] - \alpha_{q2s2}V_{outq1s2}[n-1] + \alpha_{d2s2}V_{d2s2}[n-1]) +$$
$$\alpha_{s12}V_{out1s1}[n-1]$$

The suffix "s1" denotes slice-1 and "s2" denotes slice-2. Equations (85) and (86) describe the approximate behavior of the kick-back and memory terms due to kick-back and amplifier sharing between slices.

A calibration dither can be injected in switched capacitor circuit 5304, and a further calibration dither can be injected in switched capacitor circuit 5306. The dithers can be used to extract kick-back and memory errors affecting the switched capacitor circuit and the second stage.

To remove the memory and kick-back terms in (85) and (86) with amplifier sharing, the same two correlators are needed for each slice. For slice-1, these are given by:

$$\alpha_{m21s1}[n+1] = \alpha_{m21s1}[n] + \mu \cdot V_{d2s1}[n-1] \cdot (V_{out1s1}[n] - \alpha_{m21s1}[n] \cdot V_{d2s1}[n-1]) \tag{87}$$

and $$\alpha_{m11s1}[n+1] = \alpha_{m11s1}[n] + \mu \cdot V_{d1s1}[n-1] \cdot (V_{out1s1\_KB}[n] - \alpha_{m11s1}[n] \cdot V_{out1s1}[n-1]) \tag{88}$$

In addition, one more correlator is needed for each slice to capture the inter-slice coupling. Therefore, to capture coupling from slice-2 on slice-1:

$$\alpha_{ms21}[n+1] = \alpha_{ms21}[n] + \mu \cdot V_{d1s2}[n-1] \cdot (V_{out1s1}[n] - \alpha_{ms21}[n] \cdot V_{out1s2}[n-1]) \tag{89}$$

and for slice-2:

$$\alpha_{ms12}[n+1] = \alpha_{ms12}[n] + \mu \cdot V_{d1s1}[n-1] \cdot (V_{out1s2}[n] - \alpha_{ms12}[n] \cdot V_{out1s1}[n-1]) \tag{90}$$

$V_{d1s2}$ is the dither of stage-1 in slice-2, $V_{d1s1}$ is the dither of stage-1 in slice-1, $V_{out1s1}$ is the output of stage-1 in slice-1, and $V_{out1s2}$ is the output of stage-1 in slice-2.

If KB calibration dither is used (connected to the input during the sampling phase), the corrected stage-1 output is given by:

$$V_{out1s1_{cal}}[n] = V_{out1s1}[n] - \alpha_{m21s1}V_{d2s1}[n-1] - \tag{91}$$
$$\alpha_{m21s1}\frac{C_2}{C_{d2}}V_{DAC2s1}[n-1] - \alpha_{ms21}V_{out1s2}[n-1]$$

Similarly for stage-2. The corrected output is given by:

$$V_{out1s2_{cal}}[n] = V_{out1s2}[n] - \alpha_{m21s2}V_{d2s2}[n-1] - \tag{92}$$
$$\alpha_{m21s2}\frac{C_2}{C_{d2}}V_{DAC2s2}[n-1] - \alpha_{ms12}V_{out1s1}[n-1]$$

Therefore, the same two correlators can be used for each slice to detect the kick-back on each stage from the following stage in the same slice, and one additional correlator can be used to detect the coupling between slices.

Further Variations on the Open-Loop Amplifier

Figure 55:
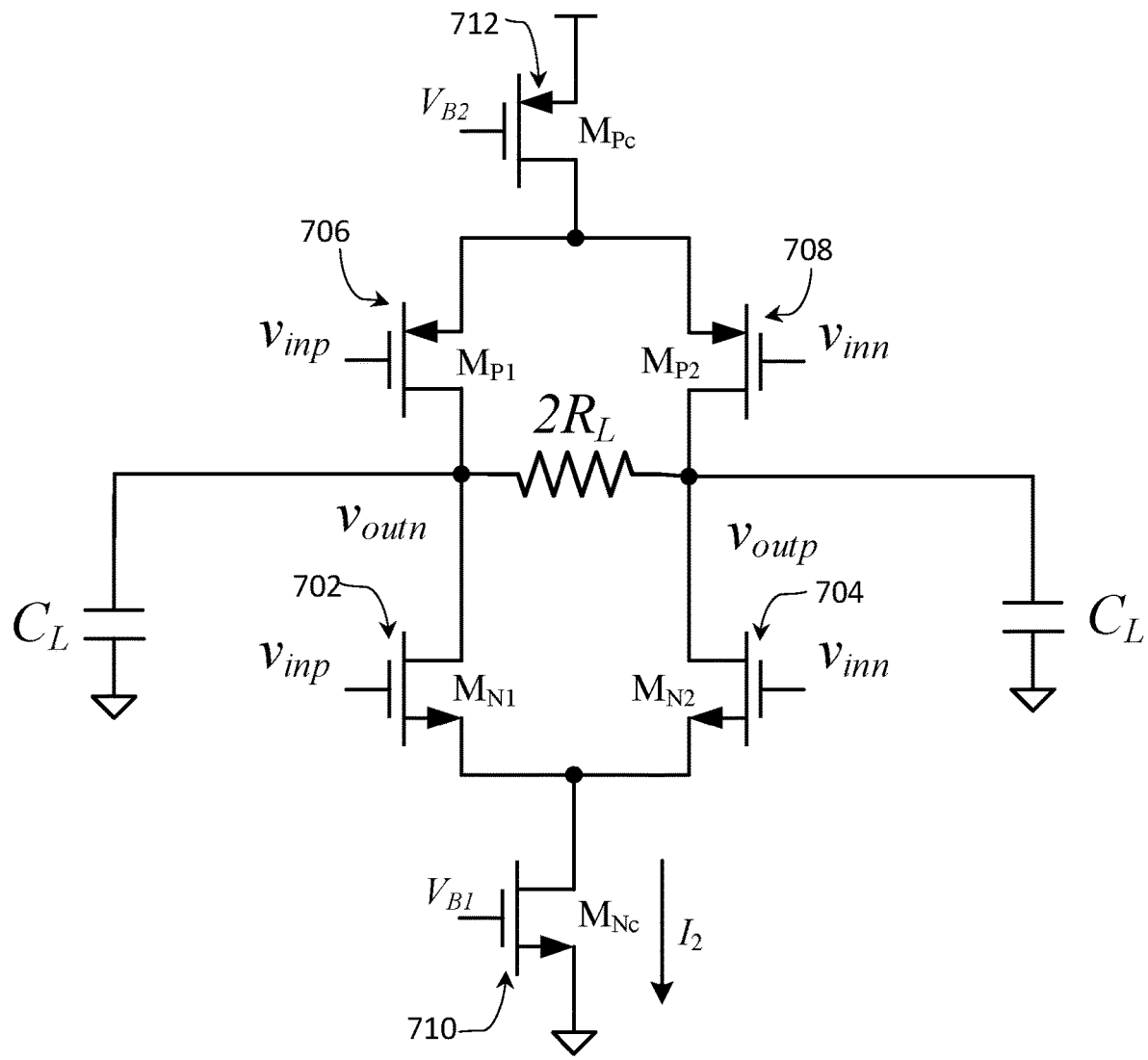
FIG. 55 shows another exemplary open-loop amplifier, according to some embodiments of the disclosure.

FIG. 55 shows another exemplary open-loop amplifier 5500, according to some embodiments of the disclosure. The open-loop amplifier 5500 shows open-loop amplifier 700 with capacitive loads (labeled $C_L$) on each differential output nodes $v_{outn}$ and $v_{outp}$. Specifically, a first capacitor $C_L$ is between the first differential output node $v_{outn}$ and ground, and a second capacitor $C_L$ is between the second differential output node $v_{outp}$ and ground. With a load resistance, e.g., $R_L$, the open-loop amplifier 5500 behaves like a "settling" amplifier, where the gain of the open-loop amplifier 5500 is determined by $g_m*R_L$, i.e., a transconductance $g_m$ multiplied by the load resistance $R_L$.

Figure 56:
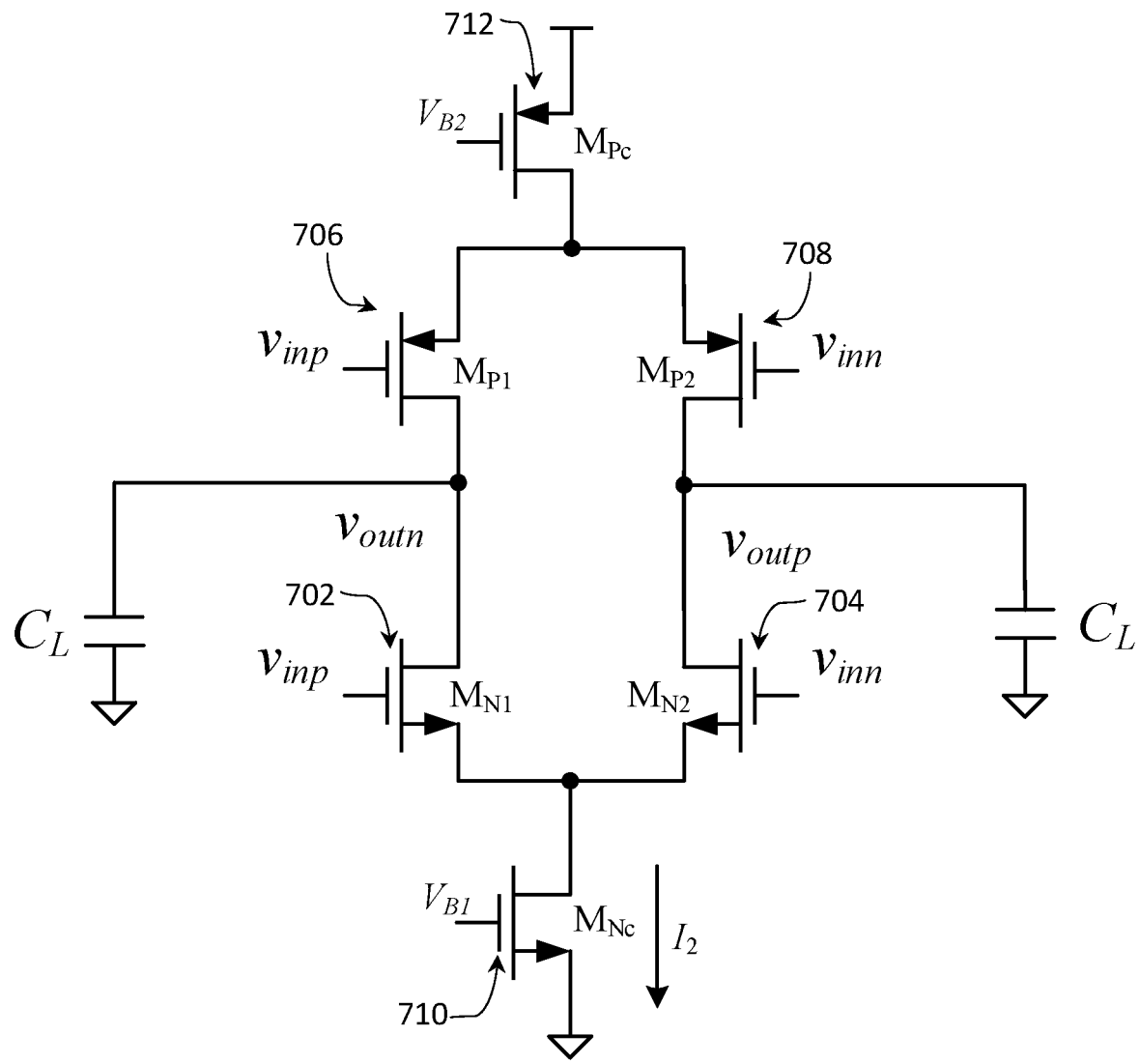
FIG. 56 shows an exemplary open-loop integrating amplifier, according to some embodiments of the disclosure.

FIG. 56 shows an exemplary open-loop integrating amplifier 5600, according to some embodiments of the disclosure. The open-loop amplifier 5500 shows a modified version of the open-loop amplifier 5500 without the load resistance (e.g., $R_L$ seen in FIG. 55). The open-loop amplifier 5600 has capacitive loads (labeled $C_L$) on each differential output nodes $v_{outn}$ and $v_{outp}$. Specifically, a first capacitor $C_L$ is between the first differential output node $v_{outn}$ and ground, and a second capacitor $C_L$ is between the second differential output node $v_{outp}$ and ground. Without a load resistance, the open-loop amplifier 5600 behaves like an "integrating" or "dynamic" amplifier, where the gain of the open-loop amplifier 5600 is determined by $g_m*T*C_L$, i.e., a transconductance $g_m$ multiplied by a time of integration T, and divided by the load capacitance $C_L$.

In comparison, the open-loop amplifier 5600, for the same current, can reach a final output value much faster than the open-loop amplifier 5500. Also, the open-loop amplifier 5600, for much less current, can reach a final output value at the same time as the open-loop amplifier 5500.

The open-loop integrating amplifier 5600, i.e., the teaching of removing the load resistance $R_L$, can be combined with any of the embodiments and teachings described herein (e.g., transistor as load with analog tracking and distortion cancellation, dither injection, calibration, gain adjustment, amplifier sharing, etc.).

Technical Advantages

As shown herein, improved circuits can be implemented for open-loop MDACs in pipelined ADCs. Non-linear calibration, analog calibration, IGE, IME, and kick-back calibration can be included, if needed. The analog circuitry for the described open-loop amplifiers are programmable for gain adjustment and can include various analog circuits for improving the performance of the open-loop amplifier. The open-loop amplifiers can benefit from lower power consumption, smaller size, and less complexity, without incurring a large penalty from calibrations.

Besides improving the MDACs of pipelined ADCs, the present disclosure describes integrating an open-loop amplifier in the front-end of an ADC, and using the open-loop amplifier in a continuous-time manner (without associated switched capacitor circuits). An open-loop amplifier can be included in front of the T/H circuit as a variable gain amplifier. Advantages and implications of providing the open-loop amplifier as a variable gain amplifier are explained in relation to FIG. 39. Moreover, an open-loop amplifier can be implemented in a T/H circuit in the front-end. Optionally, a variable attenuator can be included in front of the variable gain amplifier for coarse gain adjustment.

In some cases, IGE calibration algorithm can be used to feedback a control signal that optimizes the gain of the open-loop amplifier through controlling its $g_m$, output resistance, and/or the reference (reference voltages used in the DAC operations).

The calibration of the open-loop amplifier non-linearity in this context and the techniques employed for the non-linear calibration have been shown in the present disclosure to be effective in the presence of non-idealities in the following stages. Certain measures relating to dither injection are applied to ensure the calibration can be carried out effectively.

Furthermore, the present disclosure describes certain techniques to correct for IGE, IME and kick-back errors efficiently in open-loop MDACs, e.g., dither injection techniques and correlators.

An open-loop amplifier sharing structure that relies on inter-stage memory and kick-back calibration, while minimizing the memory errors by calibration and timing optimization. The sharing can be between two consecutive stages in the same ADC slice, or between the same stages in multiple ADC slices of an interleaved ADC.

Note that many of the open-loop amplifiers described herein do not require a negative supply (thus reducing power consumption). Furthermore, in some cases, no frequency dependent non-linear calibration is needed, e.g., when the open-loop amplifier is used without associated switched capacitor circuits.

Figure 54:
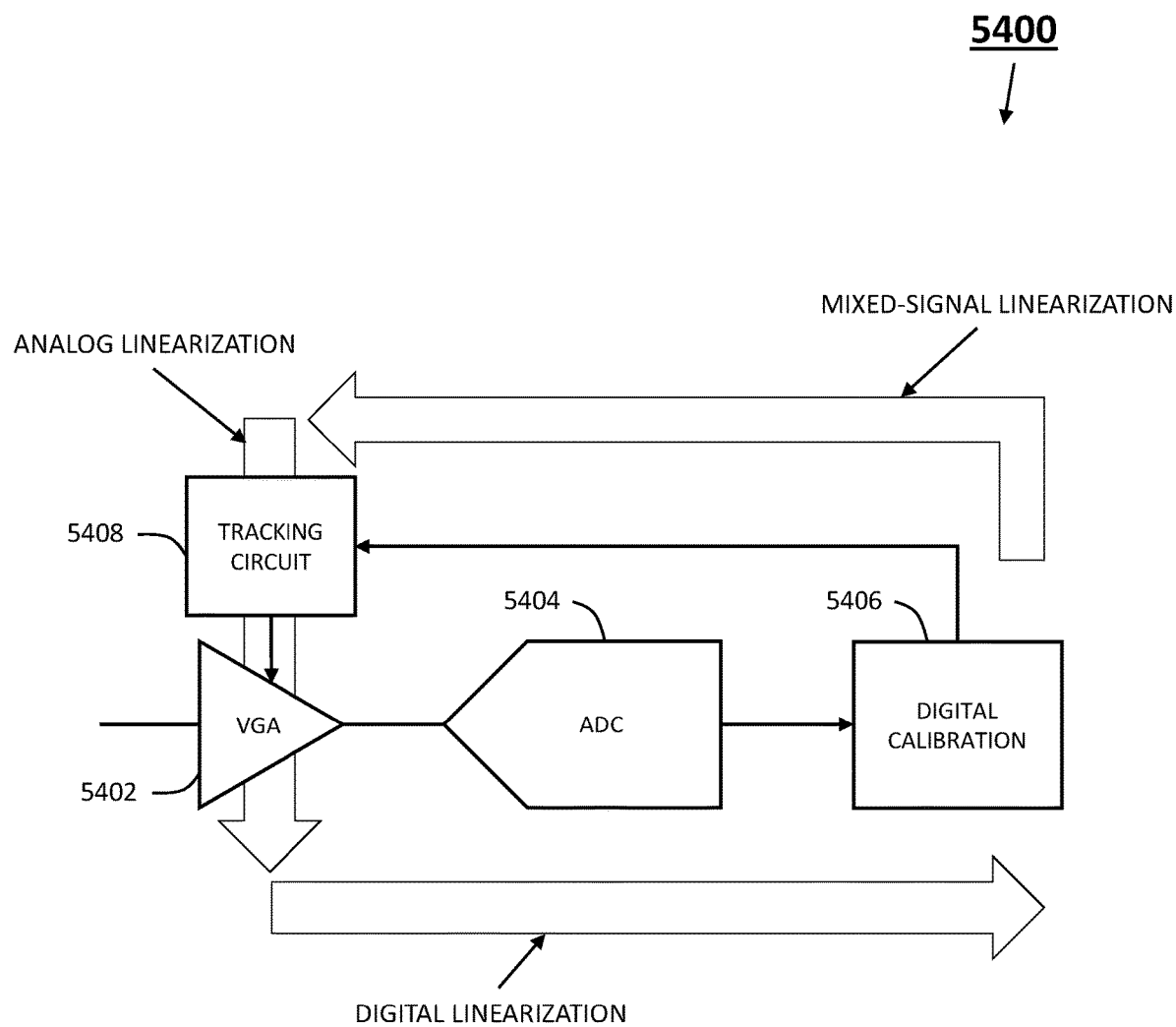
FIG. 54 shows a converter system, according to some embodiments of the disclosure.

The teachings of the present disclosure being applied to various parts of a converter system can gain many system level benefits. FIG. 54 shows a converter system 5400, according to some embodiments of the disclosure. The converter system 5400 includes a variable gain amplifier 5402, ADC 5404 (e.g., a pipelined ADC with open-loop MDACs), and a digital calibration block 5406. The variable gain amplifier 5402 be implemented based on the open-loop amplifiers described herein. The variable gain amplifier 5402 can include an analog tracking circuit 5408 (illustrated by FIGS. 31-32), which can serve the purpose of analog linearization (i.e., improve performance of the variable gain amplifier 5402 through analog circuit techniques). Using an open-loop amplifier in a continuous-time domain without associated switched capacitor circuitry as the variable gain amplifier 5402 means that frequency dependent calibrations are no longer required. Calibration techniques performed in the digital domain by digital calibration block 5406 (e.g., IGE, IME, KB, non-linear calibrations described herein for extracting errors and correcting the digital output code) can also improve the performance of the variable gain amplifier 5402 and any open-loop amplifiers in ADC 5404. In some cases, mixed-signal linearization techniques, assisted by digital calibration block 5406, can be used to adjust analog circuitry (e.g., circuits in the variable attenuator and open-loop amplifiers) to improve performance of the overall converter system as well. For instance, calibration techniques can tune the analog circuitry, e.g., by adjusting for gain in the analog circuitry directly using a control signal generated based on gain error computed in the digital domain.

Examples

Example 1 is an open-loop amplifier, comprising: a differential pair of input transistors to receive differential inputs at respective gates of the differential pair of input transistors; a first current source to provide current for the open-loop amplifier; an active load at differential output nodes of the open-loop amplifier; and load resistance at the differential output nodes of the open-loop amplifier.

In Example 2, the open-loop amplifier of Example 1 can optionally include the load resistance comprising a load resistor across the differential output nodes of the open-loop amplifier.

In Example 3, the open-loop amplifier of any one of Examples 1-2 can optionally include the load resistance comprising a load transistor across the differential output nodes of the open-loop amplifier.

In Example 4, the open-loop amplifier of any one of Examples 1-4 can optionally include the load resistance comprising a load resistor across the differential output nodes of the open-loop amplifier and a load transistor in parallel with the resistor.

In Example 5, the open-loop amplifier of any one of Examples 3 or 4 can optionally include the load transistor being driven by a gate voltage to operate the load transistor in a linear region.

In Example 6, the open-loop amplifier of any one of Examples 3-5 can optionally include an analog tracking circuit to generate a gate voltage to drive the load transistor.

In Example 7, the open-loop amplifier of Example 6 can optionally include the analog tracking circuit being to perform analog tracking for temperature and to adjust the gate voltage based on the analog tracking for temperature.

In Example 8, the open-loop amplifier of Example 6 or 7 can optionally include the analog tracking circuit being to track a bias current setting in the open-loop amplifier and to adjust the gate voltage based on the bias current setting.

In Example 9, the open-loop amplifier of any one of Examples 6-8 can optionally include the analog tracking circuit being to track temperature variation and to adjust the gate voltage based on the temperature variation.

In Example 10, the open-loop amplifier of any one of Examples 1-9 can optionally include the load resistance comprising: two series load resistances, wherein a node between the two series load resistances is connected to a first differential output node of the open-loop amplifier.

In Example 11, the open-loop amplifier of Example 10 can optionally include: a first one of the two series load resistors being connected to supply; and a second one of the two series load resistors being connected to ground.

In Example 12, the open-loop amplifier of Example 10 can optionally include: a first one of the two series load resistors being connected to a common-mode voltage; and a second one of the two series load resistors being connected to the common-mode voltage.

In Example 13, the open-loop amplifier of Example 10 can optionally include: the two series load resistances comprising transistors operating in a linear region.

In Example 14, the open-loop amplifier of any one of Examples 1-13 can optionally include the differential pair of input transistors being cascoded by a pair of cascode transistors.

In Example 15, the open-loop amplifier of any one of Examples 1-14 can optionally include the active load comprising: a first transistor and a second transistor at the differential output nodes respectively, wherein the first and second transistors have gates which are biased by a first bias voltage.

In Example 16, the open-loop amplifier of Example 15 can optionally include the first transistor and the second transistor being cascoded by a pair of cascode transistors.

In Example 17, the open-loop amplifier of any one of Examples 1-16 can optionally include: level shifters to level shift the differential inputs and to drive the gates of the differential pair of input transistors.

In Example 18, the open-loop amplifier of any one of Examples 1-17 can optionally include: gain boosting transistors at the differential output nodes of the open-loop amplifier, wherein gates of the gain boosting transistors are cross-coupled to the differential output nodes of the open-loop amplifier.

In Example 19, the open-loop amplifier of any one of Examples 1-18 can optionally include source followers to buffer the differential inputs before providing buffered differential inputs to the gates of the differential pair of input transistors.

In Example 20, the open-loop amplifier of any one of Examples 1-19 can optionally include: cross-coupled transistors at sources of the differential pair of input transistors, wherein gates of the cross-coupled transistors are cross-coupled to the gates of the differential pair of input transistors.

In Example 21, the open-loop amplifier of any one of Examples 1-20 can optionally include: dither injection circuit at the differential output nodes of the open-loop amplifier.

In Example 22, the open-loop amplifier of any one of Examples 1-21 can optionally include: differential pair of dither transistors coupled to the differential output nodes of the open-loop amplifier respectively, wherein gates of the differential pair of dither transistors are controlled by a differential dither signal; and a current source transistor to supply a current to be injected to the differential output nodes.

Example 23 is an open-loop amplifier, comprising: a first pair of input transistors to receive differential inputs at respective gates of the first pair of input transistors; a second pair of input transistors, which are complementary to the first differential pair of transistors, to receive differential inputs at respective gates of the second pair of input transistors; a first current source at terminals of the first pair of input transistors to provide current for the open-loop amplifier; and load resistance at the differential output nodes of the open-loop amplifier.

In Example 24, the open-loop amplifier of Example 23 can optionally include the load resistance comprising a load resistor.

In Example 25, the open-loop amplifier of Example 23 or 24 can optionally include the load resistance comprising: a first load transistor of a first type across the differential output nodes of the open-loop amplifier, and a load second transistor of a second type different from the first type in parallel with the first load transistor.

In Example 26, the open-loop amplifier of Example 25 can optionally include the first load transistor and the second load transistor being controlled to operate in a linear region.

In Example 27, the open-loop amplifier of Example 25 or 26 can optionally include: an analog tracking circuit to generate a gate voltage to drive the first load transistor and the second load transistor, wherein the gate voltage track changes in one or more of the following: process, voltage, temperature, and gain setting of the open-loop amplifier.

In Example 28, the open-loop amplifier of any one of Examples 23-27 can optionally include the load resistance comprising: two series load resistances, wherein a node between the two series load resistances is connected to a first differential output node of the open-loop amplifier.

In Example 29, the open-loop amplifier of Example 28 can optionally include: a first one of the two series load resistors being connected to supply; and a second one of the two series load resistors being connected to ground.

In Example 30, the open-loop amplifier of Example 28 can optionally include: a first one of the two series load resistors being connected to a common-mode voltage; and a second one of the two series load resistors being connected to the common-mode voltage.

In Example 31, the open-loop amplifier of Example 28 can optionally include the two series load resistances comprises transistors operating in a linear region.

In Example 32, the open-loop amplifier of any one of Examples 23-31 can optionally include the first pair of input transistors being cascoded by a pair of cascode transistors.

In Example 33, the open-loop amplifier of any one of Examples 23-32 can optionally include the second pair of input transistors being cascoded by a pair of cascode transistors.

In Example 34, the open-loop amplifier of any one of Examples 23-33 can optionally include: a second current source at terminals of the second pair of input transistors to provide current for the open-loop amplifier.

In Example 35, the open-loop amplifier of any one of Examples 23-34 can optionally include: first level shifters to level shift the differential inputs and to drive the gates of the first pair of input transistors.

In Example 36, the open-loop amplifier of any one of Examples 23-35 can optionally include: second level shifters to level shift the differential inputs and to drive the gates of the second pair of input transistors.

In Example 37, the open-loop amplifier of any one of Examples 23-36 can optionally include: the first current source comprising first and second current transistors connected to respective terminals of the first pair of input transistors; and a resistor coupled across the terminals of the first pair of input transistors.

In Example 38, the open-loop amplifier of any one of Examples 23-37 can optionally include: a common-mode feedback control circuit to sense an output common-mode and adjust one or more bias voltages of the open-loop amplifier to get the output common-mode closer to an ideal common-mode of the open-loop amplifier.

In Example 39, the open-loop amplifier of any one of Examples 23-38 can optionally include: gain boosting transistors at the differential output nodes of the open-loop amplifier, wherein gates of the gain boosting transistors are cross-coupled to the differential output nodes of the open-loop amplifier.

In Example 40, the open-loop amplifier of any one of Examples 23-39 can optionally include: source followers to buffer the differential inputs before providing buffered differential inputs to the gates of the differential pair of input transistors.

Example 41 is a method to improve performance of an open-loop amplifier, comprising: tracking one or more factors affecting an ideal gate-to-source voltage for operating a load transistor across differential output nodes of the open-loop amplifier in a linear region; and generating a gate voltage to drive load transistor based on the one or more factors and an ideal common-mode voltage.

In Example 42, the method of Example 41 can optionally include the one or more factors including one or more of the following: process, temperature, and voltage.

In Example 43, the method of Example 41 or 42 can optionally include the one or more factors including one or more of the following: voltage across transistors in the open-loop amplifier, transconductance or resistance of transistors in the open-loop amplifier, gain setting in the open-loop amplifier, and bias current setting in the open-loop amplifier.

In Example 44, the method of any one of Examples 41-43 can optionally include tracking the one or more factors being performed by an analog circuit.

In Example 45, the method of any one of Examples 41-44 can optionally include the one or more factors include an error obtained from calibration of the open-loop amplifier.

Example 46 is an open-loop amplifier, comprising: a differential pair of input transistors to receive differential inputs at respective gates of the differential pair of input transistors; a first current source to provide current for the open-loop amplifier; an active load at differential output nodes of the open-loop amplifier; and a capacitive load at differential output nodes of the open-loop amplifier.

In some embodiments, the open-loop amplifier of Example 45 can include any one or more features described in Examples 3, and 5-22.

Example 47 is an open-loop amplifier, comprising: a first pair of input transistors to receive differential inputs at respective gates of the first pair of input transistors; a second pair of input transistors, which are complementary to the first differential pair of transistors, to receive differential inputs at respective gates of the second pair of input transistors; a first current source at terminals of the first pair of input transistors to provide current for the open-loop amplifier; and a capacitive load at differential output nodes of the open-loop amplifier.

In some embodiments, the open-loop amplifier of Example 46 can include any one or more features described in Examples 25-40.

In some embodiments, the open-loop amplifiers of Examples 1-40, 46, and 47, can be used/implemented in combination with other Examples mentioned herein.

Example 101 is a method for improving calibration in a pipelined analog-to-digital converter (ADC), comprising: injecting a first dither in a first multiplying digital-to-analog converter (MDAC) to calibrate a first open-loop amplifier in the first MDAC of a first stage of the pipelined ADC; injecting a second dither in the first stage of the pipelined ADC to de-sensitize a calibration of the first open-loop amplifier against dependence on an input signal to the pipelined ADC; and injecting a third dither in a second stage of the pipelined ADC to de-sensitize the calibration of the first open-loop amplifier against non-idealities of the second stage of the pipelined ADC.

In Example 102, the method of Example 101 can optionally include injecting the first dither comprising: injecting the first dither at a summation node in the first MDAC.

In Example 103, the method of Example 101 or 102 can optionally include injecting the first dither comprising: injecting a first charge representative of the first dither in the first MDAC during a hold phase of the first MDAC.

In Example 104, the method of any one of Examples 101-103 can optionally include injecting the first dither comprising: connecting a first dither capacitor at a summation node of the first MDAC to a first dither voltage during a hold phase of the first MDAC.

In Example 105, the method of any one of Examples 101-104 can optionally include injecting the first dither comprising: steering a current to output nodes of the first open-loop amplifier based on a value of 1-bit dither signal.

In Example 106, the method of any one of Examples 101-105 can optionally include injecting the second dither comprising: injecting the second dither to an analog input signal to the first stage.

In Example 107, the method of any one of Examples 101-106 can optionally include injecting the second dither comprising: injecting the second dither in both the first MDAC and a first ADC of the first stage.

In Example 108, the method of any one of Examples 101-107 can optionally include injecting the second dither comprising: connecting a second dither capacitor at a summation node of the first MDAC to a second dither voltage corresponding to the second dither during a hold phase of the first MDAC; and adding a third dither voltage corresponding to the second dither to an analog input to a first ADC of the first stage.

In Example 109, the method of any one of Examples 101-108 can optionally include injecting the third dither comprising: injecting the third dither to an analog input signal to the second stage.

In Example 110, the method of any one of Examples 101-109 can optionally include injecting the third dither comprising: injecting the third dither in both a second MDAC and a second ADC of the second stage.

In Example 111, the method of any one of Examples 101-110 can optionally include injecting the third dither comprising: connecting a third dither capacitor at a summation node of a second MDAC of the second stage to a third dither voltage corresponding to the third dither during a hold phase of the second MDAC; and adding a fourth dither voltage corresponding to the third dither to an analog input to a second ADC of the second stage.

In Example 112, the method of any one of Examples 101-111 can optionally include: subtracting the third dither from a digital signal used in the calibration of the first open-loop amplifier.

Example 201 is a method for kick-back and memory calibration of an amplifier, comprising: injecting a first dither in a first stage of a pipelined analog-to-digital converter, wherein the amplifier is in the first stage; injecting a second dither in a second stage of the pipelined analog-to-digital converter; extracting a kick-back error by correlating the second dither and a digital output of the first stage; removing the kick-back error from the digital output of the first stage to generate a first calibrated output of the first stage; extracting a memory error by correlating the first dither and the first calibrated output; and removing the memory error from the first calibrated output to generate a second calibrated output of the first stage.

In Example 202, the method of Example 201 can optionally include injecting the second dither comprising: injecting a charge corresponding to the second dither at a summation node of a multiplying digital-to-analog converter in the second stage.

In Example 203, the method of Example 201 or 202 can optionally include injecting the second dither comprising: connecting a dither capacitor at a summation node of a multiplying digital-to-analog converter of the second stage to a dither voltage corresponding to the second dither during a hold phase of the multiplying digital-to-analog converter; and connecting the dither capacitor to ground during a sampling phase of the multiplying digital-to-analog converter.

In Example 204, the method of Example 201 or 202 can optionally include injecting the second dither comprising: connecting a dither capacitor at a summation node of a multiplying digital-to-analog converter of the second stage to a dither voltage corresponding to the second dither during a hold phase of the multiplying digital-to-analog converter; and connecting the dither capacitor to an analog input of the second stage during a sampling phase of the multiplying digital-to-analog converter.

In Example 205, the method of any one of Examples 201-204 can optionally include extracting the kick-back error comprising: computing the kick-back error based on a digital-to-analog converter voltage of the second stage, an analog input voltage to the second stage, and a voltage corresponding to the second dither.

In Example 206, the method of any one of Examples 201-205 can optionally include extracting the kick-back error comprising: computing the kick-back error based on sampling capacitance of the second stage, parasitic capacitance at a summation node of a multiplying digital-to-analog converter, and dither injection capacitance used to inject the second dither in the second stage.

In Example 207, the method of any one of Examples 201-206 can optionally include extracting the kick-back error comprising: computing the kick-back error based on a digital-to-analog converter voltage of the second stage, the digital output of the first stage, and a voltage corresponding to the second dither.

In Example 208, the method of any one of Examples 201-207 can optionally include extracting the kick-back error comprising: computing the kick-back error based on sampling capacitance of the second stage, and dither injection capacitance used to inject the second dither in the second stage.

In Example 209, the method of any one of Examples 201-208 can optionally include correlating the second dither and the digital output of the first stage comprising: multiplying a sign of the second dither and a sign of the digital output of the first stage with an estimate of the second dither removed.

In Example 210, the method of any one of Examples 201-209 can optionally include correlating the first dither and the first calibrated output comprising: multiplying a sign of the first dither and a sign of the first calibrated output of the first stage with an estimate of the memory error removed.

In Example 211, the method of any one of Examples 201-210 can optionally include extracting the memory error comprising: computing the memory error based on a memory error coefficient multiplied by the digital output of the first stage.

In Example 212, the method of any one of Examples 201-211 can optionally include extracting the memory error comprising: computing the memory error based on a memory error coefficient multiplied by a digital-to-analog converter voltage of the second stage.

In Example 213, the method of any one of Examples 201-212 can optionally include: injecting a third dither in both the multiplying digital-to-analog converter of the second stage and the analog-to-digital converter of the second stage.

In Example 214, the method of Example 213 can optionally include extracting the kick-back error comprising: computing the kick-back error further based on a digital-to-analog converter voltage of the second stage, the digital output of the first stage, a voltage corresponding to the second dither, and a voltage corresponding to the third dither.

In Example 215, the method of Example 213 or 214 can optionally include extracting the kick-back error comprising: computing the kick-back error further based on sampling capacitance of the second stage, parasitic capacitance at a summation node of a multiplying digital-to-analog converter, dither injection capacitance used to inject the second dither in the second stage, and dither injection capacitance used to inject the third dither in the second stage.

In Example 216, the method of any one of Examples 213-215 can optionally include injecting the third dither in the multiplying digital-to-analog converter comprising: connecting a dither capacitor at a summation node of a multiplying digital-to-analog converter of the second stage to a dither voltage corresponding to the third dither during a hold phase of the multiplying digital-to-analog converter; and connecting the dither capacitor to ground during a sampling phase of the multiplying digital-to-analog converter.

In Example 217, the method of any one of Examples 213-215 can optionally include injecting a third dither in the multiplying digital-to-analog converter comprising: connecting a dither capacitor at a summation node of a multiplying digital-to-analog converter of the second stage to a dither voltage corresponding to the third dither during a hold phase of the multiplying digital-to-analog converter; and connecting the dither capacitor to an analog input of the second stage during a sampling phase of the multiplying digital-to-analog converter.

In Example 218, the method of any one of Examples 213-217 can optionally include extracting the kick-back error comprising: correlating the third dither and a digital output of the first stage with an estimate of the third dither removed.

Example 219 is a multiplying digital-to-analog converter having dither injection, comprising: switched capacitor circuitry to perform sampling and digital-to-analog conversion and generate a residue signal at a summation node; an amplifier to amplify the residue signal; and a first capacitor coupled to the summation node to inject a calibration dither at the summation node, wherein the first capacitor is connected to an input to the switched capacitor circuitry during a sampling phase of the multiplying digital-to-analog converter.

In Example 220, the multiplying digital-to-analog converter of Example 219 can optionally include: a second capacitor coupled to the summation node to inject a linearization dither at the summation node, wherein the second capacitor is connected to ground during the sampling phase of the multiplying digital-to-analog converter.

In Example 221, the multiplying digital-to-analog converter of Example 219 can optionally include: a second capacitor coupled to the summation node to inject a linearization dither at the summation node, wherein the second capacitor is connected to the input to the switched capacitor circuitry during the sampling phase of the multiplying digital-to-analog converter.

Example 222 is a multiplying digital-to-analog converter having dither injection, comprising: switched capacitor circuitry to perform sampling and digital-to-analog conversion and generate a residue signal at a summation node; an amplifier to amplify the residue signal; and a first capacitor coupled to the summation node to inject a calibration dither at the summation node, wherein the first capacitor is connected to ground during a sampling phase of the multiplying digital-to-analog converter.

In Example 223, the multiplying digital-to-analog converter of Example 222 can optionally include: a second capacitor coupled to the summation node to inject a linearization dither at the summation node, wherein the second capacitor is connected to ground during the sampling phase of the multiplying digital-to-analog converter.

In Example 224, the multiplying digital-to-analog converter of Example 222 can optionally include: a second capacitor coupled to the summation node to inject a linearization dither at the summation node, wherein the second capacitor is connected to an input to the switched capacitor circuitry during the sampling phase of the multiplying digital-to-analog converter.

Example 301 is a method to calibrate gain of an open-loop amplifier, comprising: determining, by a digital calibration block, a control parameter for controlling gain of the open-loop amplifier in a digital domain; and tuning one or more parts of the open-loop amplifier in an analog domain based on the control parameter.

In Example 302, the method of Example 301 can optionally include determining a control parameter comprising: correlating a calibration dither against an output signal of the open-loop amplifier with an estimate of the calibration dither removed, wherein the estimate of the calibration dither is based on an ideal gain of the open-loop amplifier and the calibration dither; and updating an estimate of the control parameter based on a result from the correlating.

In Example 303, the method of Example 301 or 302 can optionally include tuning the one or more parts of the open-loop amplifier comprising: controlling a current source in the open-loop amplifier based on the control parameter.

In Example 304, the method of any one of Examples 301-303 can optionally include tuning the one or more parts of the open-loop amplifier comprising: varying a load resistance in the open-loop amplifier based on the control parameter.

In Example 305, the method of any one of Examples 301-304 can optionally include tuning the one or more parts of the open-loop amplifier comprising: controlling a load resistance in the open-loop amplifier based on the control parameter.

In Example 306, the method of any one of Examples 301-305 can optionally include tuning the one or more parts of the open-loop amplifier comprising: varying a source degeneration resistance in the open-loop amplifier based on the control parameter.

Example 307 is a front-end circuit to an analog-to-digital converter, comprising: a variable attenuator to receive an analog input signal; a variable gain amplifier to receive an output of the variable attenuator, the variable gain amplifier comprising an open-loop amplifier; a track and hold circuit to track and hold an output of the variable gain amplifier, wherein an output of the track and hold circuit is to be digitized by the analog-to-digital converter.

In Example 308, the front-end circuit of Example 307 can optionally include: the variable attentuator being to reduce input swing to the variable gain amplifier.

In Example 309, the front-end circuit of Example 307 or 308 can optionally include: the variable attenuator being to generate the output with a fixed impedance that is independent of an attenuation setting of the variable attenuator.

In Example 310, the front-end circuit of any one of Examples 307-309 can optionally include: the variable attenuator being to provide coarse gain adjustment.

In Example 311, the front-end circuit of any one of Examples 307-310 can optionally include the variable attenuator comprising: a network of switches and resistors; and the network is configurable by controlling states of the switches to vary an amount of resistance usable to attenuate the analog input signal.

In Example 312, the front-end circuit of any one of Examples 307-311 can optionally include the variable gain amplifier being to provide fine gain adjustment.

In Example 313, the front-end circuit of any one of Examples 307-312 can optionally include the open-loop amplifier having a current source that is adjustable for fine gain adjustment of the open-loop amplifier.

In Example 314, the front-end circuit of any one of Examples 307-313 can optionally include the variable gain amplifier further comprising: an analog tracking circuit to drive a load resistance of the open-loop amplifier and linearize the open-loop amplifier.

In Example 315, the front-end circuit of any one of Examples 307-314 can optionally include the variable gain amplifier further comprising: dither injection circuit coupled to output nodes of the open-loop amplifier to inject a dither usable to extract non-idealities the open-loop amplifier.

In Example 316, the front-end circuit of any one of Examples 307-315 can optionally include track and hold circuit comprising: a buffer; a sampling network following the buffer; and a further open-loop amplifier following the sampling network.

In Example 317, the front-end circuit of Example 316 can optionally include the sampling network comprising: dither injection circuitry to inject a dither usable to calibrate circuitry downstream from a dither injection point.

Example 401 is a pipelined analog-to-digital converter (ADC) having amplifier sharing, comprising: a first stage to receive and sample an analog input signal of the pipelined ADC; a shared open-loop amplifier to amplify a first residue signal generated in the first stage during a first time period and to amplify a second residue signal generated in the second stage during a second time period; and a second stage to receive and sample the first amplified residue signal.

In Example 402, the pipelined ADC of Example 401 can optionally include: the first stage comprising a switched capacitor circuit to perform sampling of the analog input signal and digital-to-analog conversion; and the second stage comprising a second switched capacitor circuit to perform sampling of the first amplified residue signal and digital-to-analog conversion.

In Example 403, the pipelined ADC of Example 401 or 402 can optionally include the first stage comprising first switches at first summing nodes of the first stage to connect the first summing nodes of the first stage to inputs of the shared open-loop amplifier during the first time period; and the second stage comprises second switches at second summing nodes of the second stage to connect the second summing nodes of the second stage to inputs of the shared open-loop amplifier during the second time period.

In Example 404, the pipelined ADC of any one of Examples 401-403 can optionally include: the first stage comprising third switches at first summing nodes of the first stage to connect the first summing nodes of the first stage to a common-mode voltage; and the second stage comprises fourth switches at second summing nodes of the second stage to connect the second summing nodes of the second stage to the common-mode voltage.

In Example 405, the pipelined ADC of any one of Examples 401-404 can optionally include: the first stage comprises a fifth switch connecting first summing nodes of the first stage together; and the second stage comprises a sixth switch connecting the second summing nodes of the second stage together.

In Example 406, the pipelined ADC of Example 404 or 405 can optionally include: the third switches transitioning from being open to closed while the first switches are closed to reset the first summing nodes; and the fourth switches transitioning from being open to closed while the second switches are closed to reset the second summing nodes.

In Example 407, the pipelined ADC of Example 405 or 406 can optionally include: the third switches and the fifth switch transitioning from being open to closed while the first switches are closed to reset the first summing nodes; and the fourth switches and the sixth switch transitioning from being open to closed while the second switches are closed to reset the second summing nodes.

In Example 408, the pipelined ADC of any one of Examples 401-407 can optionally include: the first stage comprises seventh switches to connect sampling capacitors of the first stage to receive and sample the analog input signal; and the second stage comprises eighth switches to connect sampling capacitors of the second stage to receive and sample the first amplified residue signal.

In Example 409, the pipelined ADC of Example 408 can optionally include: the seventh switches transitioning from being open to closed after the third switches and the fifth switch close to reset capacitances at the first summing nodes; and the eighth switches transitioning from being open to closed after the fourth switches and the sixth switch close reset capacitances at the second summing nodes.

In Example 410, the pipelined ADC of any one of Examples 401-409 can optionally include: the first stage comprising a first dither capacitor to inject a first dither; the second stage comprising a second dither capacitor to inject a second dither; and the first dither and the second dither being usable to extract kick-back and memory errors affecting the first stage and the second stage.

In Example 411, the pipelined ADC of any one of Example 410 can optionally include: the second dither capacitor is connected to an input of the second stage during a sampling phase of the second stage.

Example 412 is a time-interleaved analog-to-digital converter (ADC) having amplifier sharing, comprising: a first switched capacitor circuit of a first ADC to receive and sample an analog input signal; a second switched capacitor circuit of a second ADC to receive and sample the analog input signal; and a shared open-loop amplifier to amplify a first residue signal generated in the first switched capacitor circuit during a first period and to amplify a second residue signal generated in the second switched capacitor circuit during a second period.

In Example 413, the time-interleaved ADC of Example 412 can optionally include: the first stage comprising first switches at first summing nodes of the first switched capacitor circuit to connect the first summing nodes to inputs of the shared open-loop amplifier during the first time period; and the second stage comprising second switches at second summing nodes of the second switched capacitor circuit to connect the second summing nodes to inputs of the shared open-loop amplifier during the second time period.

In Example 414, the time-interleaved ADC of Example 412 or 413 can optionally include the first switched capacitor circuit comprising a first dither capacitor to inject a first dither; the second switched capacitor circuit comprising a second dither capacitor to inject a second dither; and the first dither and the second dither being usable to extract kick-back and memory errors affecting the first switched capacitor circuit and the second switched capacitor circuit and an error caused by coupling between the first switched capacitor circuit and the second switched capacitor circuit.

In Example 415, the time-interleaved ADC of Example 414 can optionally include: the first dither capacitor being connected to an input of the time-interleaved during a sampling phase of the first switched capacitor circuit; and the second dither capacitor being connected to the input of the time-interleaved ADC during a sampling phase of the second switched capacitor circuit.

Example 416 is a method for sharing an open-loop amplifier, comprising: connecting first summing nodes of a first switched capacitor circuit having a first residue signal to a shared open-loop amplifier during a first period; amplifying, by the shared open-loop amplifier, the first residue signal during the first period; and connecting second summing nodes of a second switched capacitor circuit having a second residue signal to a shared open-loop amplifier during a second period; and amplifying, by the shared open-loop amplifier, the second residue signal during the second period.

In Example 417, the method of Example 416 can optionally include: resetting the first summing nodes to a common-mode voltage before the shared open-loop amplifier amplifies the second residue signal.

In Example 418, the method of Example 416 or 417 can optionally include: resetting capacitances at the first summing nodes; and connecting the first switched capacitor circuit to an input after resetting capacitances at first summing nodes.

In Example 419, the method of any one of Examples 416-418 can optionally include: injecting a first dither in the first switched capacitor circuit; and injecting a second dither in the first switched capacitor circuit.

In Example 420, the method of Example 419 can optionally include: extracting one or more errors based on the first dither and the second dither.

VARIATIONS AND IMPLEMENTATIONS

Note that the activities discussed above with reference to the FIGURES are applicable to any integrated circuits that involve processing analog signals and converting the analog signals into digital data using one or more ADCs. The features can be particularly beneficial to high speed ADCs, where input frequencies are relatively high in the giga-Hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

The present disclosure encompasses apparatuses which can perform the various methods described herein. The apparatuses can include a suitable combination of means for implementing/carrying out any one of the methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on one or more non-transitory computer media.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims or examples described herein. Note that all optional features of the apparatus described above may also be implemented with respect to the method or process described herein and specifics in the examples may be used anywhere in one or more embodiments.

What is claimed is:

1. An open-loop amplifier, comprising:
   a differential pair of input transistors to receive differential inputs at respective gates of the differential pair of input transistors;
   a first current source to provide current for the open-loop amplifier;
   an active load at differential output nodes of the open-loop amplifier;
   load resistance at the differential output nodes of the open-loop amplifier, wherein the load resistance comprises a load transistor controlled to operate in a linear region, a drain and a source of the load transistor are coupled to differential output nodes of the open-loop amplifier respectively; and
   an analog tracking circuit to generate a gate voltage to drive the load transistor, wherein the gate voltage tracks a sum of a gate-to-source voltage of the load transistor and an ideal common mode voltage of the open-loop amplifier.

2. The open-loop amplifier of claim 1, wherein the load resistance further comprises a load resistor across the differential output nodes of the open-loop amplifier in parallel with the load transistor.

3. The open-loop amplifier of claim 1, wherein the analog tracking circuit is to perform analog tracking for temperature and to adjust the gate voltage based on the analog tracking for temperature.

4. The open-loop amplifier of claim 1, wherein the analog tracking circuit is to track a bias current setting in the open-loop amplifier and to adjust the gate voltage based on the bias current setting.

5. The open-loop amplifier of claim 4, wherein the analog tracking circuit is to track temperature variation and to adjust the gate voltage based on the temperature variation.

6. The open-loop amplifier of claim 1, further comprising:
   level shifters to level shift the respective differential inputs and to drive the respective gates of the differential pair of input transistors.

7. The open-loop amplifier of claim 1, further comprising:
   gain boosting transistors at the differential output nodes of the open-loop amplifier, wherein gates of the gain boosting transistors are cross-coupled to the differential output nodes of the open-loop amplifier.

8. The open-loop amplifier of claim 1, further comprising:
   source followers to buffer the respective differential inputs before providing buffered differential inputs to the respective gates of the differential pair of input transistors.

9. The open-loop amplifier of claim 1, further comprising:
   cross-coupled transistors at sources of the differential pair of input transistors, wherein gates of the cross-coupled transistors are cross-coupled to the gates of the differential pair of input transistors.

10. The open-loop amplifier of claim 1, further comprising:
dither injection circuit at the differential output nodes of the open-loop amplifier.

11. The open-loop amplifier of claim 1, further comprising:
differential pair of dither transistors coupled to the differential output nodes of the open-loop amplifier respectively, wherein gates of the differential pair of dither transistors are controlled by a differential dither signal; and
a current source transistor to supply a current to be injected to the differential output nodes.

12. An open-loop amplifier, comprising:
a first pair of input transistors to receive differential inputs at respective gates of the first pair of input transistors;
a second pair of input transistors, which are complementary to the first pair of input transistors, to receive differential inputs at respective gates of the second pair of input transistors;
a first current source at terminals of the first pair of input transistors to provide current for the open-loop amplifier; and
load resistance at differential output nodes of the open-loop amplifier, wherein the load resistance comprises a first load transistor of a first type across the differential output nodes of the open-loop amplifier, and a second load transistor of a second type different from the first type in parallel with the first load transistor, wherein the first load transistor and the second load transistor are controlled to operate in a linear region.

13. The open-loop amplifier of claim 12, further comprising:
an analog tracking circuit to generate a gate voltage to drive the first load transistor and the second load transistor, wherein the gate voltage tracks changes in one or more of the following: process, voltage, temperature, and gain setting of the open-loop amplifier.

14. The open-loop amplifier of claim 12, further comprising:
a second current source at terminals of the second pair of input transistors to provide current for the open-loop amplifier.

15. The open-loop amplifier of claim 12, wherein:
the first current source comprises first and second current transistors connected to respective terminals of the first pair of input transistors; and
a resistor coupled across the terminals of the first pair of input transistors.

16. The open-loop amplifier of claim 12, further comprising:
a common-mode feedback control circuit to sense an output common-mode of the open-loop amplifier and adjust a bias voltage of the first current source to get the output common-mode closer to an ideal common-mode of the open-loop amplifier.

17. A method to improve performance of an open-loop amplifier, comprising:
tracking one or more factors affecting an ideal gate-to-source voltage for operating a load transistor across differential output nodes of the open-loop amplifier; wherein the one or more factors comprises one or more of the following: process, temperature, voltage, a voltage across transistors in the open-loop amplifier, a transconductance or resistance of transistors in the open-loop amplifier, a gain setting in the open-loop amplifier, a bias current setting in the open-loop amplifier, and an error obtained from calibration of the open-loop amplifier; and
generating a gate voltage to drive load transistor and operate the load transistor in a linear region, based on the one or more factors and an ideal common-mode voltage of the open-loop amplifier, wherein the gate voltage tracks a sum of a gate-to-source voltage of the load transistor and an ideal common mode voltage.

18. The method of claim 17, wherein the open-loop amplifier comprises an open-loop amplifier in accordance with claim 1.

19. The method of claim 17, wherein the open-loop amplifier comprises an open-loop amplifier in accordance with claim 12.

20. The method of claim 17, wherein tracking the one or more factors is performed by an analog circuit.

* * * * *